(12) United States Patent
Redgrave et al.

(10) Patent No.: US 8,456,190 B2
(45) Date of Patent: Jun. 4, 2013

(54) CONTROLLABLE STORAGE ELEMENTS FOR AN IC

(75) Inventors: Jason Redgrave, Mountain View, CA (US); Martin Voogel, Los Altos, CA (US); Steven Teig, Menlo Park, CA (US)

(73) Assignee: Tabula, Inc., Santa Clara, CA (US)

( * ) Notice: Subject to any disclaimer, the term of this patent is extended or adjusted under 35 U.S.C. 154(b) by 0 days.

(21) Appl. No.: 13/049,887

(22) Filed: Mar. 16, 2011

(65) Prior Publication Data

US 2011/0221471 A1 Sep. 15, 2011

Related U.S. Application Data

(63) Continuation of application No. PCT/US2009/033840, filed on Feb. 11, 2009.

(60) Provisional application No. 61/097,798, filed on Sep. 17, 2008.

(51) Int. Cl.
*H03K 19/177* (2006.01)

(52) U.S. Cl.
USPC .................................. 326/38; 326/41; 326/47

(58) Field of Classification Search
USPC ................................................ 326/37–41, 47
See application file for complete search history.

(56) References Cited

U.S. PATENT DOCUMENTS

| | | | |
|---|---|---|---|
| 5,357,153 A | 10/1994 | Chiang et al. | |
| 5,365,125 A | 11/1994 | Goetting et al. | |
| 5,426,378 A | 6/1995 | Ong | |
| 5,546,018 A | 8/1996 | New et al. | |
| 5,552,721 A | 9/1996 | Gould | |
| 5,589,782 A | 12/1996 | Sharpe-Geisler | |
| 5,596,743 A | 1/1997 | Bhat et al. | |
| 5,600,263 A | 2/1997 | Trimberger et al. | |
| 5,629,637 A | 5/1997 | Trimberger et al. | |
| 5,631,578 A | 5/1997 | Clinton et al. | |
| 5,640,107 A | 6/1997 | Kruse | |
| 5,646,544 A | 7/1997 | Iadanza | |

(Continued)

FOREIGN PATENT DOCUMENTS

| | | |
|---|---|---|
| EP | 0748053 | 12/1996 |
| EP | 2140548 | 1/2010 |

(Continued)

OTHER PUBLICATIONS

U.S. Appl. No. 11/081,855, filed Mar. 15, 2005, Schmit, Herman, et al.

(Continued)

*Primary Examiner* — Jany Richardson
(74) *Attorney, Agent, or Firm* — Adeli & Tollen LLP

(57) ABSTRACT

An integrated circuit ("IC") that includes a configurable routing fabric with controllable storage elements is described. The routing fabric provides a communication pathway that routes signals to and from source and destination components. The routing fabric may provide the ability to selectively store the signals passing through the routing fabric within the storage elements of the routing fabric. In this manner, a source or destination component may continually perform operations (e.g., computational or routing) irrespective of whether a previous signal from or to such a component is stored within the routing fabric. The source and destination components include configurable logic circuits, configurable interconnect circuits, and various other circuits that receive or distribute signals throughout the IC.

20 Claims, 52 Drawing Sheets

U.S. PATENT DOCUMENTS

| | | | |
|---|---|---|---|
| 5,646,545 A | 7/1997 | Trimberger et al. |
| 5,659,484 A | 8/1997 | Bennett et al. |
| 5,732,246 A | 3/1998 | Gould et al. |
| 5,737,235 A | 4/1998 | Kean et al. |
| 5,815,726 A | 9/1998 | Cliff |
| 5,825,662 A | 10/1998 | Trimberger |
| 5,847,577 A | 12/1998 | Trimberger |
| 6,018,559 A | 1/2000 | Azegami et al. |
| 6,075,745 A | 6/2000 | Gould et al. |
| 6,107,821 A | 8/2000 | Kelem et al. |
| 6,130,854 A | 10/2000 | Gould et al. |
| 6,140,836 A | 10/2000 | Fujii et al. |
| 6,140,839 A | 10/2000 | Kaviani et al. |
| 6,184,707 B1 | 2/2001 | Norman et al. |
| 6,229,337 B1 | 5/2001 | Xiao et al. |
| 6,233,191 B1 | 5/2001 | Gould et al. |
| 6,255,849 B1 | 7/2001 | Mohan |
| 6,275,064 B1 | 8/2001 | Agrawal et al. |
| 6,292,019 B1 | 9/2001 | New et al. |
| 6,326,807 B1 | 12/2001 | Veenstra et al. |
| 6,411,128 B2 | 6/2002 | Maeda |
| 6,469,540 B2 | 10/2002 | Nakaya |
| 6,483,343 B1 | 11/2002 | Faith et al. |
| 6,487,709 B1 | 11/2002 | Keller et al. |
| 6,496,918 B1 | 12/2002 | DeHon et al. |
| 6,515,509 B1 | 2/2003 | Baxter |
| 6,526,559 B2 | 2/2003 | Schiefele et al. |
| 6,545,505 B1 | 4/2003 | Chan et al. |
| 6,603,330 B1 | 8/2003 | Snyder |
| 6,614,703 B2 | 9/2003 | Pitts et al. |
| 6,674,303 B1 | 1/2004 | Morse et al. |
| 6,686,769 B1 | 2/2004 | Nguyen et al. |
| 6,703,861 B2 | 3/2004 | Ting |
| 6,807,660 B1 | 10/2004 | Frenkil |
| 6,829,756 B1 | 12/2004 | Trimberger |
| 6,992,505 B1 | 1/2006 | Zhou |
| 7,028,281 B1 | 4/2006 | Agrawal et al. |
| 7,088,134 B1 | 8/2006 | Agrawal et al. |
| 7,088,136 B1 | 8/2006 | Lewis |
| 7,109,752 B1 | 9/2006 | Schmit et al. |
| 7,112,992 B1 | 9/2006 | Guzman et al. |
| 7,116,131 B1 | 10/2006 | Chirania et al. |
| 7,138,827 B1 | 11/2006 | Trimberger |
| 7,154,299 B2 | 12/2006 | Swami et al. |
| 7,157,933 B1 | 1/2007 | Schmit et al. |
| 7,193,440 B1 | 3/2007 | Schmit et al. |
| 7,212,448 B1 | 5/2007 | Trimberger |
| 7,224,182 B1 | 5/2007 | Hutchings et al. |
| 7,236,009 B1 | 6/2007 | Rohe et al. |
| 7,242,216 B1 | 7/2007 | Schmit et al. |
| 7,295,037 B2 | 11/2007 | Schmit et al. |
| 7,298,169 B2 | 11/2007 | Hutchings et al. |
| 7,342,415 B2 | 3/2008 | Teig et al. |
| 7,372,297 B1 | 5/2008 | Pugh et al. |
| 7,489,162 B1 | 2/2009 | Schmit et al. |
| 7,496,879 B2 | 2/2009 | Rohe et al. |
| 7,514,957 B2 | 4/2009 | Schmit et al. |
| 7,521,958 B2 | 4/2009 | Hutchings et al. |
| 7,521,959 B2 | 4/2009 | Teig |
| 7,525,344 B2 | 4/2009 | Teig et al. |
| 7,530,033 B2 | 5/2009 | Caldwell et al. |
| 7,532,032 B2 | 5/2009 | Schmit et al. |
| 7,545,167 B2 | 6/2009 | Teig et al. |
| 7,564,261 B2 | 7/2009 | Schmit et al. |
| 7,576,564 B2 | 8/2009 | Schmit et al. |
| 7,587,698 B1 | 9/2009 | Rohe et al. |
| 7,679,401 B1 | 3/2010 | Redgrave |
| 7,898,291 B2 | 3/2011 | Rohe et al. |
| 7,971,172 B1 | 6/2011 | Pugh et al. |
| 8,089,300 B2 | 1/2012 | Redgrave |
| 8,093,922 B2 | 1/2012 | Teig et al. |
| 2002/0113619 A1 | 8/2002 | Wong |
| 2002/0163357 A1 | 11/2002 | Ting |
| 2004/0008055 A1 | 1/2004 | Khanna et al. |
| 2004/0041610 A1 | 3/2004 | Kundu |
| 2004/0044849 A1 | 3/2004 | Stence et al. |
| 2004/0178818 A1 | 9/2004 | Crotty et al. |
| 2004/0196066 A1 | 10/2004 | Ting |
| 2006/0220678 A1 | 10/2006 | Rozas et al. |
| 2006/0220716 A1 | 10/2006 | Nicolaidis |
| 2007/0143577 A1 | 6/2007 | Smith |
| 2007/0241773 A1* | 10/2007 | Hutchings et al. ............ 326/38 |
| 2007/0241782 A1* | 10/2007 | Teig et al. ................. 326/41 |
| 2009/0243651 A1 | 10/2009 | Caldwell et al. |
| 2011/0241728 A1 | 10/2011 | Redgrave et al. |
| 2012/0139579 A1 | 6/2012 | Teig et al. |

FOREIGN PATENT DOCUMENTS

| | | |
|---|---|---|
| EP | 2345160 | 7/2011 |
| WO | WO 2008/115243 | 9/2008 |
| WO | WO 2010/033263 | 3/2010 |

OTHER PUBLICATIONS

U.S. Appl. No. 11/269,869, filed Nov. 7, 2005, Pugh, Daniel, et al.
U.S. Appl. No. 13/011,840, filed Jan. 21, 2011, Rohe, Andre, et al.
Portions of prosecution history of U.S. Appl. No. 11/081,859, mailing date Oct. 11, 2007, Teig, Steven, et al.
Portions of prosecution history of U.S. Appl. No. 12/021,291, mailing date Jan. 28, 2009, Teig, Steven, et al.
Portions of prosecution history of U.S. Appl. No. 11/081,855, mailing date Nov. 16, 2006, Schmit, Herman, et al.
Portions of prosecution history of U.S. Appl. No. 11/082,200, mailing date Feb. 14, 2007, Rohe, Andre, et al.
Portions of prosecution history of U.S. Appl. No. 11/751,629, mailing date Apr. 21, 2009, Rohe, Andre, et al.
Portions of prosecution history of U.S. Appl. No. 12/534,841, mailing date Jan. 11, 2011, Rohe, Andre, et al.
Portions of prosecution history of U.S. Appl. No. 13/011,840, mailing date Jun. 17, 2011, Rohe, Andre, et al.
Portions of prosecution history of U.S. Appl. No. 11/269,869, mailing date Sep. 28, 2012, Pugh, Daniel, et al.
Portions of prosecution history of U.S. Appl. No. 11/269,505, mailing date Dec. 3, 2007, Pugh, Daniel, et al.
Portions of prosecution history of U.S. Appl. No. 12/050,143, mailing date May 10, 2011, Pugh, Daniel, et al.
Portions of prosecution history of U.S. Appl. No. 11/292,952, mailing date Jan. 27, 2010, Redgrave, Jason.
Portions of prosecution history of U.S. Appl. No. 12/702,290, mailing date Aug. 23, 2011, Redgrave, Jason.
Portions of prosecution hisotry of U.S. Appl. No. 11/293,856, mailing date Jan. 5, 2009, Schmit, Herman, et al.
Portions of prosecution history of U.S. Appl. No. 11/754,299, mailing date Nov. 18, 2008, Schmit, Herman, et al.
Portions of prosecution history of U.S. Appl. No. 11/754,300, mailing date Dec. 9, 2008, Teig, Steven.
Portions of prosecution history of U.S. Appl. No. 11/754,301, mailing date Dec. 15, 2008, Teig, Steven, et al.
Portions of prosecution history of U.S. Appl. No. 12/419,289, mailing date Aug. 23, 2011, Teig, Steven, et al.
Portions of prosecution history of U.S. Appl. No. 13/311,544, mailing date Feb. 21, 2012, Teig, Steven, et al.
Portions of prosecution history of U.S. Appl. No. 13/119,433, mailing date Aug. 29, 2012, Redgrave, Jason, et al.
International Search Report for PCT/US2007/069831, Sep. 24, 2008 (mailing date), Tabula, Inc.
International Preliminary Report on Patentability for PCT/US2007/069831, Sep. 22, 2009 (issuance date), Tabula, Inc.
Written Opinion for PCT/US2007/069831, Sep. 24, 2008 (mailing date), Tabula, Inc.
Portions of Prosecution History of EP07797815.3, Sep. 11, 2012, Tabula, Inc.
International Search Report for PCT/US2009/033840, May 29, 2009 (mailing date), Tabula, Inc.
Written Opinion for PCT/US2009/033840, May 29, 2009 (mailing date), Tabula, Inc.
International Preliminary Report on Patentability for PCT/US2009/033840, Mar. 31, 2011 (mailing date), Tabula, Inc.
Portions of Prosecution History of EP09814920.6, Nov. 15, 2011, Tabula, Inc.

Author Unknown, "Unifying Sequential and Spatial Computing with a Single Instruction Set Architecture," ISCA '04, Jun. 19-23, 2004, ACM, Munchen, Oberbayern, Germany.

Agrawal, O., et al., "An Innovative, Segmented High Performance FPGA Family with Variable-Grain-Architecture and Wide-gating Functions," FPGA 99, Feb. 1999, pp. 17-26, ACM, Monterey, CA, USA.

Amerson, R., et al., "Plasma: An FPGA for Million Gate Systems," Proceedings of the 1996 ACM 4$^{th}$ International Symposium on FPGAs, Feb. 11-13, 1996, pp. 10-16, Monterey, California, USA.

Butts, M., "Future Directions of Dynamically Reprogrammable Systems," IEEE 1995 Custom Integrated Circuits Conference, May 1995, pp. 487-494.

Compton, K., et al., "An Introduction to Reconfigurable Computing," IEEE Computer, Apr. 2000.

Compton, K., et al., "Reconfigurable Computing: A Survey of Systems and Software," ACM Computing Surveys, Jun. 2002, pp. 171-210, vol. 34, No. 2, ACM, New York, NY.

Dehon, A., "Balancing Interconnect and Computation in a Reconfigurable Computing Array (or, why don't you really want 100% LUT utilization)," Proceedings of the International Symposium on Field Programmable Gate Arrays, Feb. 1999, pp. 125-134.

Dehon, A., "Reconfigurable Architectures for General-Purpose Computing," A.I. Technical Report No. 1586, Oct. 1996, pp. i-353.

Dehon, A., "Transit Note #121: Notes on Programmable Interconnect," M.I.T. Transit Project, Feb. 1995, pp. 1-13.

George, V., "Low Energy Field-Programmable Gate Array," A Dissertation Submitted in Partial Satisfaction o the Requirements for the Degree of Doctor of Philosophy in Engineering-Electrical Engineering and Computer Sciences in the Graduate Division of the University of California, Berkeley, Fall 2000 Month N/A, pp. 1-190.

Goldstein, S.C., et al., "PipeRench: A Coprocessor for Streaming Multimedia Acceleration", In International Symposium on Computer Architecture (ISCA), pp. 28-39, May 1999.

Goldstein, S.C., et al., "PipeRench: A Reconfigurable Architecture and Compiler," IEEE, Apr. 2000, pp. 70-77.

Lehn, D.I., et al., "Evaluation of Rapid Context Switching on a CSRC Device," Proceedings of the International Conference on Engineering of Reconfigurable Systems and Algorithms, Jun. 24-27, 2002.

Lemieux, G., et al., "Generating Highly-Routable Sparse Crossbars for PLDs," FPGA 2000, Feb. 2000, ACM, Monterey, California, USA.

Lewis, D., et al., "The Stratix-II Routing and Logic Architecture," Proceedings of the 2005 ACM/SIGDA 13$^{th}$ International Symposium on Field-Programmable Gate Arrays, pp. 1-22, Feb. 20-22, 2005, Monterey, California, USA.

Mathstar, Inc., "MathStar FPOA Architecture: A New Approach to High Throughput, Scalable, and Reprogrammable Design," Technology Overview, 2003 Month N/A, MathStar, Inc.

Mirsky, E., et al., "Matrix: A Reconfigurable Computing Device with Configurable Instruction Distribution and Deployable Resources (Extended Abstract)," Hot Chips Symposium 1997, Aug. 1997.

Ochotta, E.S., et al., "A Novel Predictable Segmented FPGA Routing Architecture," FPGA 98, Feb. 1998, pp. 3-11, ACM, Monterey, CA, USA.

Rahman, A., et al., "Wiring Requirement and Three-Dimensional Integration Technology for Field Programmable Gate Arrays," IEEE Transactions on Very Large Scale Integration (VLSI) Systems, Feb. 2003, pp. 44-54, vol. 11, No. 1, IEEE.

Schmit, H., "Extra-Dimensional Island-Style FPGAs," Field Programmable Logic and Application (FPL 2003), Sep. 2003, pp. 1-10.

Schmit, H., "Extra-Dimensional Island-Style FPGAs," Field Programmable Logic and Application (FPL 2003), Sep. 2003, slides 1-26.

Schmit, H., "Incremental Reconfiguration for Pipelined Applications," Proceedings of the 5$^{th}$ IEEE Symposium on FPGA-Based Custom Computing Machines, Apr. 16-18, 1997.

Schmit, H., et al., "FPGA Switch Block Layout and Evaluation," FPGA '02, Feb. 24-26, 2002, ACM, Monterey, California, USA.

Schmit, H., et al., "PipeRench: A Virtualized Programmable Datapath in 0.18 Micron Technology," Proceedings of the IEEE 2002 Custom Integrated Circuits Conference, May 12-15, 2002, pp. 63-66.

Singh, A., et al., "Interconnect Pipelining in a Throughput-Intensive FPGA Architecture," FPGA 2001, Feb. 11-13, 2001, pp. 153-160, ACM, Monterey, CA, USA.

Singh, A., et al., "Interconnect Resource-Aware Placement for Hierarchical FPGAs," Proceedings of the 2001 IEEE/ACM International Conference on Computer-Aided Design, Nov. 2001.

Snider, G., "Performance-Constrained Pipelining of Software Loops onto Reconfigurable Hardware," FPGA '02, Feb. 24-26, 2002, pp. 177-186, ACM, Monterey, California, USA.

Teifel, J., et al., "Highly Pipelined Asynchronous FPGAs," Proceedings of the 2004 ACM/SIGDA 12$^{th}$ International Symposium on Field Programmable Gate Arrays, Feb. 22-24, 2004, Monterey, California, USA.

Trimberger, S., "Effects of FPGA Architecture on FPGA Routing," 32$^{nd}$ ACM/IEEE Design Automation Conference, Jun. 1995, ACM.

Tsu, W., et al., "HSRA: High-Speed, Hierarchical Synchronous Reconfigurable Array," Proceedings of the International Symposium on Field Programmable Gate Arrays, Feb. 1999, pp. 69-78.

Weaver, N., et al., "The SFRA: A Corner-Turn FPGA Architecture," FPGA '04, Feb. 22-24, 2004, ACM, Monterey, California, USA.

* cited by examiner

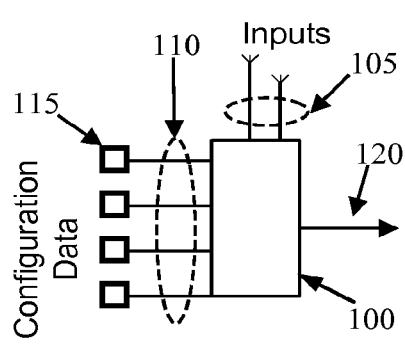 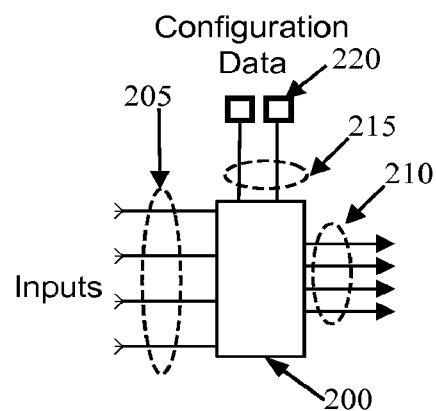
*Figure 1*
*Prior Art*
*Figure 2*
*Prior Art*

US 8,456,190 B2

CONTROLLABLE STORAGE ELEMENTS FOR AN IC

CLAIM OF BENEFIT TO PRIOR APPLICATIONS

This application is a continuation application of PCT Application PCT/US2009/033840, entitled "Controllable Storage Elements for an IC," filed on Feb. 11, 2009, now published as WO 2010/033263. PCT Application PCT/US2009/033840 claims the benefit of U.S. Provisional Patent Application 61/097,798, entitled "Transparent, Clocked, and Configurable Storage Elements for Configurable ICs," filed Sep. 17, 2008. U.S. Provisional Patent Application 61/097,798 and PCT Application PCT/US2009/033840, published as WO 2010/033263, are incorporated herein by reference.

FIELD OF THE INVENTION

The present invention is directed towards configurable ICs having a circuit arrangement with storage elements for performing routing and storage operations.

BACKGROUND

The use of configurable integrated circuits ("ICs") has dramatically increased in recent years. One example of a configurable IC is a field programmable gate array ("FPGA"). An FPGA is a field programmable IC that often has logic circuits, interconnect circuits, and input/output ("I/O") circuits. The logic circuits (also called logic blocks) are typically arranged as an internal array of repeated arrangements of circuits. These logic circuits are typically connected together through numerous interconnect circuits (also called interconnects). The logic and interconnect circuits are often surrounded by the I/O circuits.

FIG. 1 illustrates an example of a configurable logic circuit 100. This logic circuit can be configured to perform a number of different functions. As shown in FIG. 1, the logic circuit 100 receives a set of input data 105 and a set of configuration data 110. The configuration data set is stored in a set of SRAM cells 115. From the set of functions that the logic circuit 100 can perform, the configuration data set specifies a particular function that this circuit has to perform on the input data set. Once the logic circuit performs its function on the input data set, it provides the output of this function on a set of output lines 120. The logic circuit 100 is said to be configurable, as the configuration data set "configures" the logic circuit to perform a particular function, and this configuration data set can be modified by writing new data in the SRAM cells. Multiplexers and look-up tables are two examples of configurable logic circuits.

FIG. 2 illustrates an example of a configurable interconnect circuit 200. This interconnect circuit 200 connects a set of input data 205 to a set of output data 210. This circuit receives configuration data 215 that are stored in a set of SRAM cells 220. The configuration data specify how the interconnect circuit should connect the input data set to the output data set. The interconnect circuit 200 is said to be configurable, as the configuration data set "configures" the interconnect circuit to use a particular connection scheme that connects the input data set to the output data set in a desired manner. Moreover, this configuration data set can be modified by writing new data in the SRAM cells. Multiplexers are one example of interconnect circuits.

FIG. 3A illustrates a portion of a prior art configurable IC 300. As shown in this figure, the IC 300 includes an array of configurable logic circuits 305 and configurable interconnect circuits 310. The IC 300 has two types of interconnect circuits 310a and 310b. Interconnect circuits 310a connect interconnect circuits 310b and logic circuits 305, while interconnect circuits 310b connect interconnect circuits 310a to other interconnect circuits 310a.

In some cases, the IC 300 includes numerous logic circuits 305 and interconnect circuits 310 (e.g., hundreds, thousands, hundreds of thousands, etc. of such circuits). As shown in FIG. 3A, each logic circuit 305 includes additional logic and interconnect circuits. Specifically, FIG. 3A illustrates a logic circuit 305a that includes two sections 315a that together are called a slice. Each section includes a look-up table ("LUT") 320, a user register 325, a multiplexer 330, and possibly other circuitry (e.g., carry logic) not illustrated in FIG. 3A.

The multiplexer 330 is responsible for selecting between the output of the LUT 320 or the user register 325. For instance, when the logic circuit 305a has to perform a computation through the LUT 320, the multiplexer 330 selects the output of the LUT 320. Alternatively, this multiplexer selects the output of the user register 325 when the logic circuit 305a or a slice of this circuit needs to store data for a future computation of the logic circuit 305a or another logic circuit.

FIG. 3B illustrates an alternative way of constructing half a slice in a logic circuit 305a of FIG. 3A. Like the half-slice 315a in FIG. 3A, the half-slice 315b in FIG. 3B includes a LUT 320, a user register 325, a multiplexer 330, and possibly other circuitry (e.g., carry logic) not illustrated in FIG. 3B. However, in the half-slice 315b, the user register 325 can also be configured as a latch. In addition, the half-slice 315b also includes a multiplexer 350. In half-slice 315b, the multiplexer 350 receives the output of the LUT 320 instead of the register/latch 325, which receives this output in half-slice 315a. The multiplexer 350 also receives a signal from outside of the half-slice 315b. Based on its select signal, the multiplexer 350 then supplies one of the two signals that it receives to the register/latch 325. In this manner, the register/latch 325 can be used to store (1) the output signal of the LUT 320 or (2) a signal from outside the half-slice 315b.

The use of user registers to store such data is at times undesirable, as it typically requires data to be passed at a clock's rising edge or a clock's fall edge. In other words, registers often do not provide flexible control over the data passing between the various circuits of the configurable IC. In addition, the placement of a register or a latch in the logic circuit increases the signal delay through the logic circuit, as it requires the use of at least one multiplexer 330 to select between the output of a register/latch 325 and the output of a LUT 320. The placement of a register or a latch in the logic circuit further hinders the design of an IC as the logic circuit becomes restricted to performing either storage operations or logic operations, but not both.

Accordingly, there is a need for a configurable IC that has a more flexible approach for storing data and passing data that utilizes and is compatible with the IC's existing routing pathways and circuit array structures. More generally, there is a need for more flexible storage and routing mechanisms in configurable ICs.

SUMMARY OF THE INVENTION

Some embodiments provide an integrated circuit ("IC") that includes a configurable routing fabric with storage elements (elements may be alternatively referred to as "circuits"). The IC of some embodiments also includes other configurable circuits for configurably performing operations (e.g., logic operations). In some of these embodiments, the configurable circuits of the IC are arranged in a particular manner, e.g., in groups of the circuits (or "tiles") that include multiple inputs and outputs. In some embodiments, the configurable circuits and/or storage elements are sub-cycle reconfigurable circuits and/or storage elements that may receive different configuration data in different sub-cycles. A sub-cycle in some embodiments may be a division of a clock cycle (i.e., there are multiple sub-cycles for each clock cycle) while in other embodiments a sub-cycle and a clock cycle may be the same duration. Sub-cycles of reconfigurable circuits may be alternatively referred to as "reconfiguration cycles."

In some embodiments, the routing fabric provides a communication pathway that routes signals to and from source and destination components (e.g., to and from configurable circuits of the IC). The routing fabric of some embodiments provides the ability to selectively store the signals passing through the routing fabric within the storage elements of the routing fabric. In this manner, a source or destination component continually performs operations (e.g., computational or routing) irrespective of whether a previous signal from or to such a component is stored within the routing fabric. The source and destination components include configurable logic circuits, configurable interconnect circuits, and various other circuits that receive or distribute signals throughout the configurable IC.

In some embodiments, the routing fabric includes configurable interconnect circuits, the wire segments (e.g., the metal or polysilicon segments) that connect to the interconnect circuits, and/or vias that connect to these wire segments and to the terminals of the interconnect circuits. In some of these embodiments, the routing fabric also includes buffers for achieving one or more objectives (e.g., maintaining the signal strength, reducing noise, altering signal delay, etc.) with respect to the signals passing along the wire segments. In conjunction with or instead of these buffer circuits, the routing fabric of some of these embodiments might also include one or more non-configurable circuits (e.g., non-configurable interconnect circuits).

Different embodiments place storage elements at different locations in the routing fabric or elsewhere on the IC. Examples of such locations include storage elements coupled to or within the input stage of interconnect circuits, storage elements coupled to or within the output stage of interconnect circuits, storage elements coupled to, cross-coupled to, or adjacent to buffer circuits in the routing fabric, and storage elements at other locations of the routing fabric or elsewhere on the IC.

In some embodiments, the routing fabric includes interconnect circuits with multiple storage elements located at their output stage. For a particular interconnect circuit that connects a particular source circuit to a particular destination circuit, the output of the particular interconnect circuit's storage element connects to an input of the destination circuit. When enabled, this storage element holds the output of the source circuit for a particular duration (e.g., for one or more user design clock cycles or one or more sub-cycles). Typically, such a storage element is used to store data for a relatively small amount of time as its storage operation prevents the interconnect circuit from performing its routing operation. Accordingly, at times, this storage element is referred to below as a "short-term" storage element.

In addition to placing a short-term storage element at the output stage of an interconnect circuit, some embodiments place a "long-term" storage element in a feedback path between an output and input of the interconnect circuit. Such a storage element is referred to as a long-term storage element as it can be used to store data for a time duration that can be relatively long as the storage element does not disable the interconnect circuit's routing operation. In other words, the placement of the storage element in a feedback path of the interconnect circuit allows the interconnect circuit to continue performing its routing operations even when the storage element stores data. In some embodiments, either the short-term or long-term storage element of an interconnect circuit is performing a storage operation at any given time. In some embodiments, both the short-term and long-term storage elements of an interconnect circuit perform storage operations at any given time. In some embodiments, neither the short-term nor the long-term storage elements of an interconnect circuit perform storage operations at any given time (i.e., both the short-term and long-term storage elements of an interconnect circuit perform routing operations at any given time).

Some embodiments place the long-term storage element and the feedback path in series with the short-term storage element. For instance, in some embodiments, the output of the interconnect circuit that passes through the short-term storage element (1) is distributed to a destination component and (2) is distributed along the feedback path through the long-term storage element to an input of the interconnect circuit.

Other embodiments position the long-term storage element and the feedback path in parallel with the short-term storage element. For instance, the output of the interconnect circuit can be distributed along two separate output paths. The first output path passes the output of the interconnect circuit through the short-term storage before reaching the input of a destination circuit (where in some embodiments this path reaches the destination circuit's input possibly through one or more wire segments, vias, and/or buffers). The second parallel output path passes the output of the interconnect circuit through the long-term storage element along the feedback path before passing this output back to an input of the interconnect circuit.

Some embodiments do not utilize any short-term storage at the output of an interconnect circuit, but only utilize a long-term storage in a feedback path between the output and input of an interconnect circuit. Other embodiments utilize a long-term storage that receives the output of an interconnect circuit but does not supply its output back to the same interconnect circuit.

Some embodiments utilize multiple short-term storage elements (e.g., two) at the outputs of each of several interconnect circuits. In some embodiments, the multiple short-term storage elements are built into the output stage of a particular interconnect circuit, while in other embodiments one or more of the multiple short-term storage elements are placed after a particular interconnect circuit (i.e., the input of a storage element receives a signal that is supplied by the output of the particular interconnect circuit). For a particular interconnect circuit that connects a particular source circuit to a particular destination circuit (or circuits), the output of each of the particular interconnect circuit's short-term storage elements connects to an input of one or more of the destination circuit(s). When enabled, each storage element holds the output of the source circuit for a particular duration (e.g., for one or more user design clock cycles or one or more sub-cycles). When disabled, each storage element allows the particular interconnect circuit to route its output signal to the particular destination circuit through the storage element. By using multiple short-term storage elements at the output of the interconnect circuit, such storage elements may be used to store data for either a relatively small amount of time, or a relatively long period of time, because one element's storage operation does not prevent the interconnect circuit from performing its routing operation through the other storage element(s).

In addition to placing multiple short-term storage elements at the output stage of an interconnect circuit, some embodiments place a long-term storage element in a feedback path between an output and input of the interconnect circuit. In some embodiments, the output of a long-term storage element may also be supplied to another destination circuit (e.g., to another interconnect circuit that is nearby or far away). In some embodiments, some combination of short-term storage elements and long-term storage elements of an interconnect circuit are performing a storage operation at any given time (i.e., one or more of the short-term storage elements and/or the long term storage element may perform a storage operation). In some embodiments, all of the short-term and long-term storage elements of an interconnect circuit perform storage operations at any given time. In some embodiments, none of the short-term or long-term storage elements of an interconnect circuit perform storage operations at any given time.

In some embodiments, the routing fabric includes interconnect circuits with at least one storage element located at their input stage. For a particular interconnect circuit that connects a particular source circuit to a particular destination circuit, the input of the particular interconnect circuit's storage element connects to an output of the source circuit. When enabled, the storage element holds the input of the interconnect circuit for a particular duration (e.g., for one or more user design clock cycles or one or more sub-cycles). Such a storage element may be used to hold the value at the input of the interconnect circuit while the interconnect circuit is not being used to route data, while the interconnect circuit is being used to route data that is being held by the storage element, or while the interconnect circuit is being used to route data that the interconnect circuit receives along another one of its inputs. In some embodiments, the storage element may be a short-term storage element (because its storage operation prevents the interconnect circuit from receiving other data on that input).

In some embodiments, the storage elements are configurable storage elements that are controlled by configuration data. In some of these embodiments, each configurable storage element is controlled by a separate configuration data signal, while in other of these embodiments, multiple configurable storage elements are controlled by a single configuration data signal.

The storage elements described above are transparent (or unclocked) storage elements that can controllably store data for arbitrary durations of time (i.e., the control of these storage elements is not necessarily defined with reference to a clock signal). In some embodiments, some or all of these storage elements are controlled by user design signals. In some embodiments, some or all of these storage elements are configurable storage elements whose storage operation is controlled by a set of configuration data stored in the IC. For instance, in some embodiments, the set of configuration bits determines the configuration cycles in which a short-term or long-term storage element receives and/or stores data. In some embodiments, some or all of these transparent storage elements are hybrid storage elements whose storage operation is at least partly controlled by a combination of configuration data and user design signals. In some embodiments, some or all of these transparent storage elements may also be at least partly controlled by a clock signal or a signal derived from a clock signal.

In addition to the transparent storage elements described above, in some embodiments, the routing fabric includes clocked storage elements. In some embodiments, each clocked storage element includes at least one input, at least one output, and a series of clocked delay elements connected sequentially. In some embodiments, each clocked delay element has at least one data input and at least one data output, where the data supplied to the input is stored during one clock cycle (or sub-cycle, etc.) and the stored data is provided at the output one clock cycle later. For a particular clocked storage element that connects a particular source circuit to a particular destination circuit, the input of the particular clocked storage element connects to an output of the source circuit, while the output of the particular clocked storage element connects to an input of the destination circuit.

In some embodiments, each clocked storage element receives a clock signal. The clock signal controls whether the storage element stores a signal received at its input and provides a previously-stored signal to its output. In some embodiments, the clocked storage elements allow new data to be stored during each clock cycle (or reconfiguration cycle, user design cycle, sub-cycle, etc.). For example, data at the input may be stored on each rising edge of the clock signal. In addition, some embodiments of the clocked storage element provide previously-stored data during each clock cycle. For example, new data may be provided at the output on every falling edge of the clock signal. In some embodiments, data received at the clocked storage element's input is stored during a particular clock cycle, while data stored during a previous clock cycle is simultaneously provided at its output.

As noted above, the clocked storage elements of some embodiments include one or more clocked delay elements. The number of delay elements alters the performance of the clocked storage element. For example, in a clocked storage circuit including two clocked delay elements, data may be stored during a particular clock cycle, while the data stored two clock cycles earlier is provided at the output. By using clocked storage elements placed between a source and destination circuit, such storage elements may be used to continuously store data from the source circuit during each clock cycle while simultaneously providing previously-stored data to the destination circuit.

In some embodiments, the routing fabric includes controllable clocked storage elements. In some embodiments, each controllable clocked storage element includes at least one input, at least one output, a configurable interconnect circuit with multiple inputs, and a series of clocked delay elements connected sequentially. In addition, some embodiments connect each input of the configurable interconnect circuit to an output of one of the clocked delay elements. For a particular controllable clocked storage element that connects a particular source circuit to a particular destination circuit, the input of the particular controllable storage element connects to an output of the source circuit, while the output of the particular controllable storage element connects to an input of the destination circuit.

In some embodiments, the configurable interconnect circuit has a set of inputs, a set of select lines, and at least one output. The configurable interconnect circuit of some embodiments selects an input from the set of inputs based on data supplied to the set of select lines. In some embodiments, the configurable interconnect circuit is controlled by configuration data supplied to its select lines. In some embodiments, the configurable interconnect circuit is controlled by user design data supplied to its select lines. In some embodiments, the configurable interconnect circuit is controlled by a combination of configuration data and user design data supplied to its select lines.

In some embodiments, each controllable clocked storage element receives a clock signal and a control signal for controllably storing a signal received at its input and controllably providing a signal to its output. In some embodiments, the controllable clocked storage element allows new data to be stored during each clock cycle (or reconfiguration cycle, user design cycle, etc.). In addition, some embodiments of the controllable clocked storage element provide previously-stored data during each clock cycle. By using controllable clocked storage elements placed between a source and destination circuit, such storage elements may be used to continuously store data from the source circuit during each clock cycle while simultaneously providing previously-stored data to the destination circuit. In addition, by selecting from among the inputs of the configurable interconnect circuit, the delay (in terms of the number of clock cycles) from the input to the output of the controllable clocked storage element may be selected from among several values (e.g., the data stored at the input during a particular clock cycle is available at the output either two or four clock cycles later depending on the state of the control signal). In some embodiments, the control signal is synchronous with the clock signal, while in other embodiments, the two signals may be asynchronous.

In some embodiments, the routing fabric includes configurable clocked storage elements. In some embodiments, each configurable clocked storage element includes at least one input, at least one output, and a series of controllable clocked delay elements connected sequentially. When enabled, each controllable clocked delay element of some embodiments operates as described above in reference to the clocked delay element. When disabled, each controllable clocked delay element neither stores data supplied at its input nor provides data at its output. For a particular configurable clocked storage element that connects a particular source circuit to a particular destination circuit, the input of the particular configurable clocked storage element connects to an output of the source circuit, while the output of the particular configurable clocked storage element connects to an input of the destination circuit.

Each configurable clocked storage element receives a configuration signal and a clock signal for configurably storing a signal received at its input and configurably providing a signal to its output. In some embodiments, the configurable clocked storage element allows new data to be stored during each clock cycle (or reconfiguration cycle, etc.). In some embodiments, the configurable clocked storage element provides previously-stored data during each clock cycle. By using configurable clocked storage elements placed between a source and destination circuit, such storage elements may be used to continuously store data from the source circuit during each clock cycle while simultaneously providing previously-stored data to the destination circuit.

In addition, in some embodiments, during each particular clock cycle, the configurable clocked storage element receives at least one configuration data signal that controls whether the configurable clocked storage element stores a signal that the configurable clocked storage element receives and/or whether the configurable clocked storage element passes a signal that the configurable clocked storage element received during a previous clock cycle. In other words, in some embodiments, configuration data may be used to program an arbitrary number of delay and hold clock cycles of the configurable clocked storage element. In some embodiments, the configuration data is provided to the control input of the controllable clocked delay elements. In some embodiments, the configuration signal is synchronous with the clock signal, while in other embodiments, the two signals may be asynchronous.

In addition to placing the clocked storage element, controllable clocked storage element, or configurable clocked storage element within the routing fabric, some embodiments place these storage elements in other locations on the IC. Some embodiments include at least one configurable storage element, at least one controllable clocked storage element, at least one clocked storage element, and/or at least one configurable clocked storage element in each tile of the IC. Some embodiments include multiple configurable storage elements, multiple controllable clocked storage elements, multiple clocked storage elements, and/or multiple configurable clocked storage elements located in the routing fabric of the IC, or elsewhere on the IC.

In some embodiments, some or all of the clocked storage elements described above may be at least partly controlled by user design signals. In some embodiments, some or all of these clocked storage elements are configurable storage elements whose storage operation is at least partly controlled by a set of configuration data stored in configuration data storage of the IC. For instance, in some embodiments, the set of configuration bits determines the number of clock cycles in which a clocked storage element presents data at its output. In some embodiments, the clocked storage element receives a signal derived from a clock signal that at least partly controls its storage operation.

In addition to the structure and operation of the storage elements circuits above, some embodiments include a process for reducing power consumption during the operation of the IC by using any idle storage elements, interconnect circuits, and/or other circuits to eliminate unnecessary toggling of signals in the IC. For instance, the configurable storage element described above that includes multiple storage elements built in the output stage of a configurable interconnect circuit may be used for power savings when one or more of the storage elements located at its outputs is not needed for a routing or storage operation. The configurable storage element's unused output(s) may be configured to hold its previous output value in order to eliminate switching at the output, and at any wires or other circuitry connected to the output (e.g., at the input of an interconnect circuit, buffer, etc.). Several processes to achieve reduced power consumption utilizing the storage elements discussed above are described below.

Some embodiments of the process configure an IC that includes multiple reconfigurable circuits, where several of the reconfigurable circuits are reconfigurable storage elements and each of the reconfigurable storage elements has an association with another reconfigurable circuit. In some embodiments, a reconfigurable storage element has an association with a reconfigurable circuit when an output (or input) of the reconfigurable circuit is directly connected to an input (or output) of the reconfigurable storage element. In some embodiments a direct connection may include multiple wires, vias, buffers, and/or non-configurable circuits. In some embodiments, a reconfigurable storage element may be configured, based on a configuration data, to either pass-through a value during a particular reconfiguration cycle, or hold a value that it was outputting during a previous reconfiguration cycle. In some of these embodiments, the reconfigurable storage elements are short-term storage elements and/or long-term storage elements.

In some embodiments, a user design that includes multiple user operations is received and each of the user operations is assigned to at least one reconfigurable circuit to be performed during at least one reconfiguration cycle. Some of these embodiments identify any reconfigurable circuits that have outputs that are not examined by other circuits during a particular reconfiguration cycle. For that particular reconfiguration cycle, some embodiments define a configuration for a particular reconfigurable storage element associated with the identified reconfigurable circuit that directs the particular reconfigurable storage element to hold a value that it was outputting in a prior reconfiguration cycle, in order to prevent unnecessary transitions at the output of the particular reconfigurable storage element.

In some embodiments, several of the reconfigurable circuits are reconfigurable interconnect circuits. In some embodiments, each reconfigurable interconnect circuit has a set of inputs, a set of select lines, and at least one output. The reconfigurable interconnect circuit of some embodiments selects an input from the set of inputs based on data supplied to the set of select lines. In some embodiments, the reconfigurable interconnect circuit is controlled by configuration data supplied to its select lines.

In some embodiments, reconfigurable interconnect circuits, each associated with a reconfigurable storage element, are identified as having an input and an output that are not examined during a particular reconfiguration cycle. In some embodiments, a configuration is defined for each reconfigurable storage element associated with each identified reconfigurable interconnect circuit that directs the reconfigurable storage element to hold a value it was outputting in a reconfiguration cycle prior to the particular reconfiguration cycle. In addition, a configuration is defined for each identified reconfigurable interconnect circuit directing it to select an input that is directly connected to the particular reconfigurable storage element associated with the identified reconfigurable interconnect circuit in order to prevent unnecessary transitions at the output of the identified reconfigurable interconnect circuit.

Although the processes above were discussed with reference to reconfiguration cycles and circuits, some embodiments may use configurable circuits and cycles to implement these processes. In addition, while the processes were described with reference to particular circuits and specific combinations or arrangements of these circuits, some embodiments may be implemented with different combinations or arrangements of the circuit elements.

BRIEF DESCRIPTION OF THE DRAWINGS

The novel features of the invention are set forth in the appended claims. However, for the purpose of explanation, several embodiments of the invention are set forth in the following figures.

FIG. 1 illustrates an example of a configurable logic circuit.

FIG. 2 illustrates an example of a configurable interconnect circuit.

DETAILED DESCRIPTION

Figure 3A:
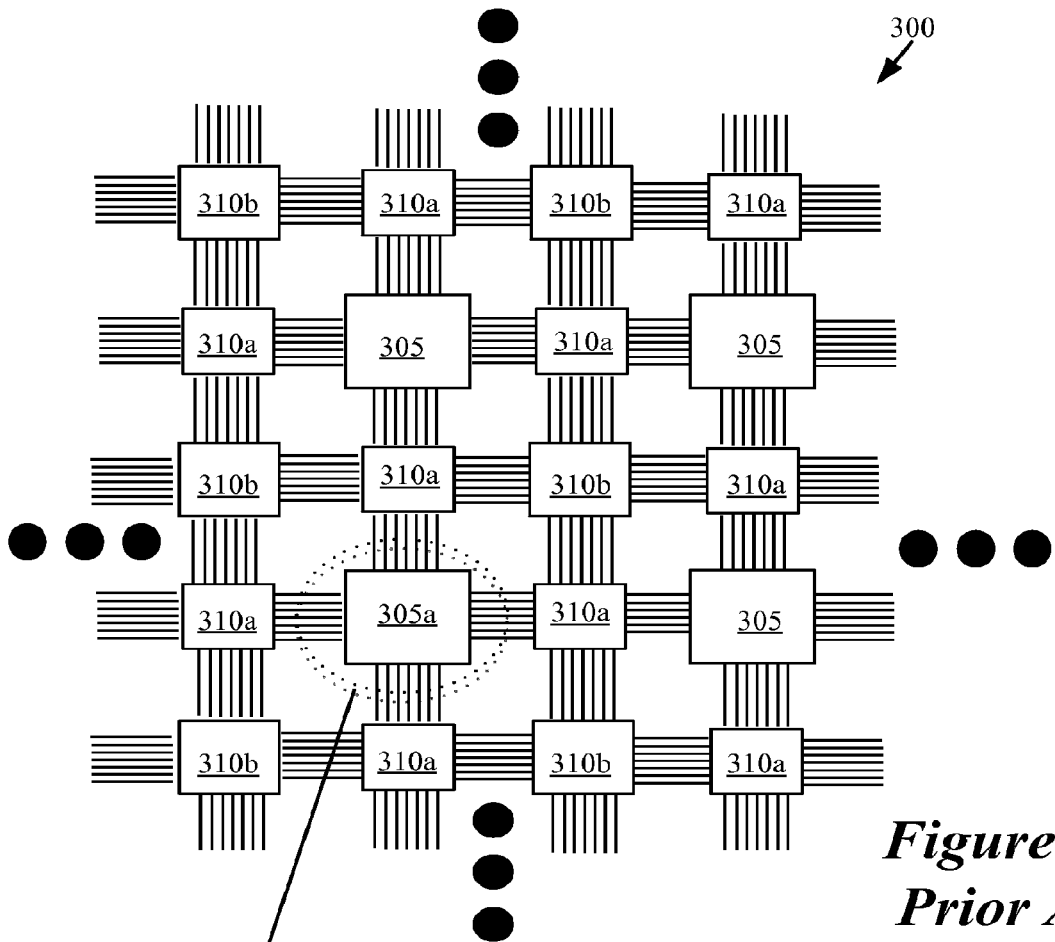
FIG. 3A illustrates a portion of a prior art configurable IC.
Figure 3A:
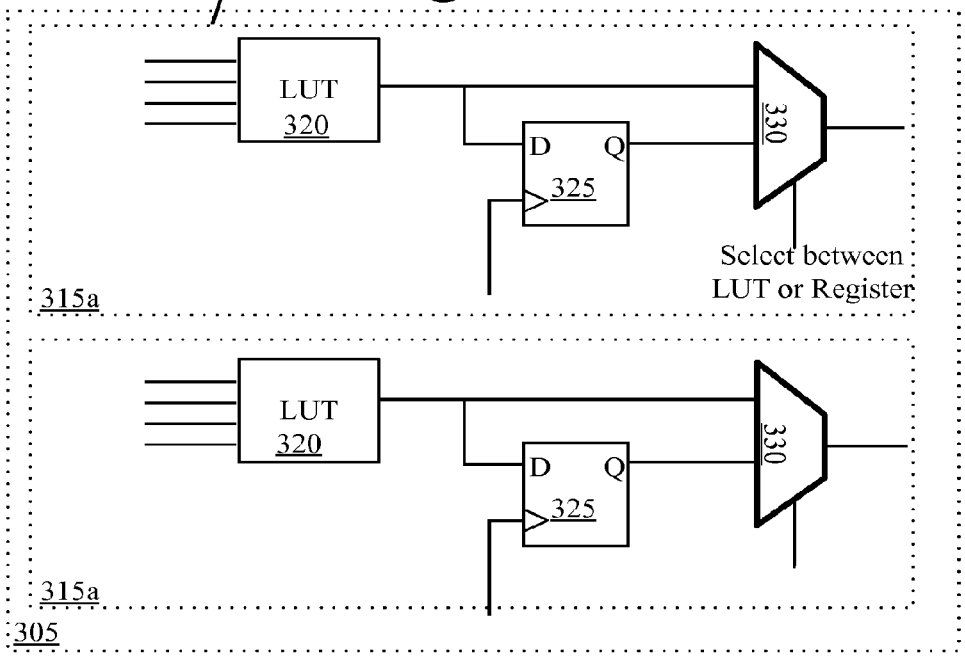
Figure 3B:
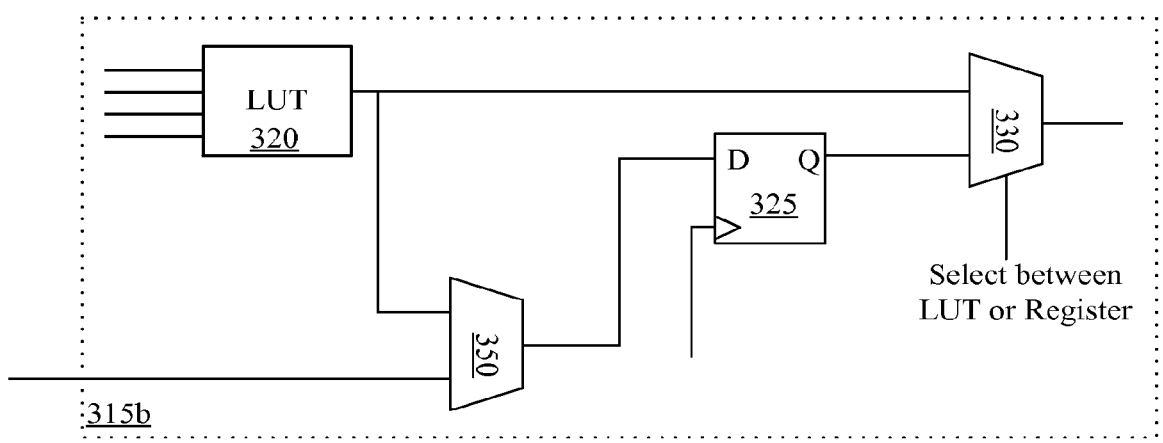
FIG. 3B illustrates an alternative way of constructing half a slice in a logic circuit of FIG. 3A.

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

I. Overview

Some embodiments provide a configurable integrated circuit ("IC") that includes a configurable routing fabric with storage elements. Examples of such storage elements include transparent storage elements (e.g. latches) and non-transparent storage elements (e.g. registers). A latch is a storage element that can operate transparently, not needing, for example, a clock signal. Specifically, based on an enable signal, a latch either holds its output constant (i.e., is closed) or passes its input to its output (i.e., is open). For instance, a latch (1) might pass a signal on its input terminal to its output terminal when the enable signal is not active (e.g., when the signal on the enable terminal is logic low) and (2) might store a value and hold its output constant at this value when the enable signal is active (e.g., when the signal is logic high). Such a latch typically stores the value that it was receiving when the enable signal transitions from its inactive state (e.g., low) to its active state (e.g., high). Some latches do not include a separate enable signal, instead the input signal (or combination of input signals) to the latch acts as an enable signal.

A register is a storage element that cannot operate transparently. For instance, some registers operate based on a control signal (e.g., a periodic clock signal) received on the control terminal. Based on this signal, the register either holds its output constant or passes its input to its output. For instance, when the control signal makes a transition (e.g., goes from logic low to logic high), the register samples its input. Next, when the control signal is constant or makes the other transition, the register provides at its output the value that it most recently sampled at its input. In a register, the input data typically must be present a particular time interval before and after the active clock transition. A register is often operated by a clock signal that causes the register to pass a value every clock cycle, while a latch is often controlled by a control signal and may pass or hold its value irrespective of the control signal's relationship to any clock signal. However, in other cases, a latch may be directly controlled by a clock signal while a register is controlled by another, non-periodic, control signal.

The IC of some embodiments also includes other configurable circuits for configurably performing operations (e.g., logic operations). In some of these embodiments, the configurable circuits of the IC are arranged in a particular manner, e.g., in groups of the circuits (or "tiles") that include multiple inputs and outputs. In some embodiments, the configurable circuits and/or storage elements are sub-cycle reconfigurable circuits and/or storage elements that may receive different configuration data in different sub-cycles. A sub-cycle in some embodiments may be a division of a clock cycle (i.e., there are multiple sub-cycles for each clock cycle) while in other embodiments a sub-cycle and a clock cycle may be the same duration. Sub-cycles of reconfigurable circuits may be alternatively referred to as "reconfiguration cycles."

In some embodiments, the routing fabric provides a communication pathway that routes signals to and from source and destination components (e.g., to and from configurable circuits of the IC). The routing fabric of some embodiments provides the ability to selectively store the signals passing through the routing fabric within the storage elements of the routing fabric. In this manner, a source or destination component continually performs operations (e.g., computational or routing) irrespective of whether a previous signal from or to such a component is stored within the routing fabric. The source and destination components include configurable logic circuits, configurable interconnect circuits, and various other circuits that receive or distribute signals throughout the configurable IC.

In some embodiments, the routing fabric includes configurable interconnect circuits, the wire segments (e.g., the metal or polysilicon segments) that connect to the interconnect circuits, and/or vias that connect to these wire segments and to the terminals of the interconnect circuits. In some of these embodiments, the routing fabric also includes buffers for achieving one or more objectives (e.g., maintaining the signal strength, reducing noise, altering signal delay, etc.) with respect to the signals passing along the wire segments. In conjunction with or instead of these buffer circuits, the routing fabric of some of these embodiments might also include one or more non-configurable circuits (e.g., non-configurable interconnect circuits).

Different embodiments place storage elements at different locations in the routing fabric or elsewhere on the IC. Examples of such locations include storage elements coupled to or within the input stage of interconnect circuits, storage elements coupled to or within the output stage of interconnect circuits, storage elements coupled to, cross-coupled to, or adjacent to buffer circuits in the routing fabric, and storage elements at other locations of the routing fabric or elsewhere on the IC.

In some embodiments, the routing fabric includes interconnect circuits with multiple storage elements located at their output stage. For a particular interconnect circuit that connects a particular source circuit to a particular destination circuit, the output of the particular interconnect circuit's storage element connects to an input of the destination circuit. When enabled, this storage element holds the output of the source circuit for a particular duration (e.g., for one or more user design clock cycles or one or more sub-cycles). Typically, such a storage element is used to store data for a relatively small amount of time as its storage operation prevents the interconnect circuit from performing its routing operation. Accordingly, at times, this storage element is referred to below as a "short-term" storage element.

In addition to placing a short-term storage element at the output stage of an interconnect circuit, some embodiments place a "long-term" storage element in a feedback path between an output and input of the interconnect circuit. Such a storage element is referred to as a long-term storage element as it can be used to store data for a time duration that can be relatively long as the storage element does not disable the interconnect circuit's routing operation. In other words, the placement of the storage element in a feedback path of the interconnect circuit allows the interconnect circuit to continue performing its routing operations even when the storage element stores data. In some embodiments, either the short-term or long-term storage element of an interconnect circuit is performing a storage operation at any given time. In some embodiments, both the short-term and long-term storage elements of an interconnect circuit perform storage operations at any given time. In some embodiments, neither the short-term nor the long-term storage elements of an interconnect circuit perform storage operations at any given time (i.e., both the short-term and long-term storage elements of an interconnect circuit perform routing operations at any given time).

Some embodiments place the long-term storage element and the feedback path in series with the short-term storage element. For instance, in some embodiments, the output of the interconnect circuit that passes through the short-term storage element (1) is distributed to a destination component and (2) is distributed along the feedback path through the long-term storage element to an input of the interconnect circuit.

Other embodiments position the long-term storage element and the feedback path in parallel with the short-term storage element. For instance, the output of the interconnect circuit can be distributed along two separate output paths. The first output path passes the output of the interconnect circuit through the short-term storage before reaching the input of a destination circuit (where in some embodiments this path reaches the destination circuit's input possibly through one or more wire segments, vias, and/or buffers). The second parallel output path passes the output of the interconnect circuit through the long-term storage element along the feedback path before passing this output back to an input of the interconnect circuit.

Some embodiments do not utilize any short-term storage at the output of an interconnect circuit, but only utilize a long-term storage in a feedback path between the output and input of an interconnect circuit. Other embodiments utilize a long-term storage that receives the output of an interconnect circuit but does not supply its output back to the same interconnect circuit.

Some embodiments utilize multiple short-term storage elements (e.g., two) at the outputs of each of several interconnect circuits. In some embodiments, the multiple short-term storage elements are built into the output stage of a particular interconnect circuit, while in other embodiments one or more of the multiple short-term storage elements are placed after a particular interconnect circuit (i.e., the input of a storage element receives a signal that is supplied by the output of the particular interconnect circuit). For a particular interconnect circuit that connects a particular source circuit to a particular destination circuit (or circuits), the output of each of the particular interconnect circuit's short-term storage elements connects to an input of one or more of the destination circuit(s). When enabled, each storage element holds the output of the source circuit for a particular duration (e.g., for one or more user design clock cycles or one or more sub-cycles). When disabled, each storage element allows the particular interconnect circuit to route its output signal to the particular destination circuit through the storage element. By using multiple short-term storage elements at the output of the interconnect circuit, such storage elements may be used to store data for either a relatively small amount of time, or a relatively long period of time, because one element's storage operation does not prevent the interconnect circuit from performing its routing operation through the other storage element(s).

In addition to placing multiple short-term storage elements at the output stage of an interconnect circuit, some embodiments place a long-term storage element in a feedback path between an output and input of the interconnect circuit. In some embodiments, the output of a long-term storage element may also be supplied to another destination circuit (e.g., to another interconnect circuit that is nearby or far away). In some embodiments, some combination of short-term storage elements and long-term storage elements of an interconnect circuit are performing a storage operation at any given time (i.e., one or more of the short-term storage elements and/or the long term storage element may perform a storage operation). In some embodiments, all of the short-term and long-term storage elements of an interconnect circuit perform storage operations at any given time. In some embodiments, none of the short-term or long-term storage elements of an interconnect circuit perform storage operations at any given time.

In some embodiments, the routing fabric includes interconnect circuits with at least one storage element located at their input stage. For a particular interconnect circuit that connects a particular source circuit to a particular destination circuit, the input of the particular interconnect circuit's storage element connects to an output of the source circuit. When enabled, the storage element holds the input of the interconnect circuit for a particular duration (e.g., for one or more user design clock cycles or one or more sub-cycles). Such a storage element may be used to hold the value at the input of the interconnect circuit while the interconnect circuit is not being used to route data, while the interconnect circuit is being used to route data that is being held by the storage element, or while the interconnect circuit is being used to route data that the interconnect circuit receives along another one of its inputs. In some embodiments, the storage element may be a short-term storage element (because its storage operation prevents the interconnect circuit from receiving other data on that input).

In some embodiments, the storage elements are configurable storage elements that are controlled by configuration data. In some of these embodiments, each configurable storage element is controlled by a separate configuration data signal, while in other of these embodiments, multiple configurable storage elements are controlled by a single configuration data signal.

The storage elements described above are transparent (or unclocked) storage elements that can controllably store data for arbitrary durations of time (i.e., the control of these storage elements is not necessarily defined with reference to a clock signal). In some embodiments, some or all of these storage elements are controlled by user design signals. In some embodiments, some or all of these storage elements are configurable storage elements whose storage operation is controlled by a set of configuration data stored in the IC. For instance, in some embodiments, the set of configuration bits determines the configuration cycles in which a short-term or long-term storage element receives and/or stores data. In some embodiments, some or all of these transparent storage elements are hybrid storage elements whose storage operation is at least partly controlled by a combination of configuration data and user design signals. In some embodiments, some or all of these transparent storage elements may also be at least partly controlled by a clock signal or a signal derived from a clock signal.

In addition to the transparent storage elements described above, in some embodiments, the routing fabric includes clocked storage elements. In some embodiments, each clocked storage element includes at least one input, at least one output, and a series of clocked delay elements connected sequentially. In some embodiments, each clocked delay element has at least one data input and at least one data output, where the data supplied to the input is stored during one clock cycle (or sub-cycle, etc.) and the stored data is provided at the output one clock cycle later. For a particular clocked storage element that connects a particular source circuit to a particular destination circuit, the input of the particular clocked storage element connects to an output of the source circuit, while the output of the particular clocked storage element connects to an input of the destination circuit.

In some embodiments, each clocked storage element receives a clock signal. The clock signal controls whether the storage element stores a signal received at its input and provides a previously-stored signal to its output. In some embodiments, the clocked storage elements allow new data to be stored during each clock cycle (or reconfiguration cycle, user design cycle, sub-cycle, etc.). For example, data at the input may be stored on each rising edge of the clock signal. In addition, some embodiments of the clocked storage element provide previously-stored data during each clock cycle. For example, new data may be provided at the output on every falling edge of the clock signal. In some embodiments, data received at the clocked storage element's input is stored during a particular clock cycle, while data stored during a previous clock cycle is simultaneously provided at its output.

As noted above, the clocked storage elements of some embodiments include one or more clocked delay elements. The number of delay elements alters the performance of the clocked storage element. For example, in a clocked storage circuit including two clocked delay elements, data may be stored during a particular clock cycle, while the data stored two clock cycles earlier is provided at the output. By using clocked storage elements placed between a source and destination circuit, such storage elements may be used to continuously store data from the source circuit during each clock cycle while simultaneously providing previously-stored data to the destination circuit.

In some embodiments, the routing fabric includes controllable clocked storage elements. In some embodiments, each controllable clocked storage element includes at least one input, at least one output, a configurable interconnect circuit with multiple inputs, and a series of clocked delay elements connected sequentially. In addition, some embodiments connect each input of the configurable interconnect circuit to an output of one of the clocked delay elements. For a particular controllable clocked storage element that connects a particular source circuit to a particular destination circuit, the input of the particular controllable storage element connects to an output of the source circuit, while the output of the particular controllable storage element connects to an input of the destination circuit.

In some embodiments, the configurable interconnect circuit has a set of inputs, a set of select lines, and at least one output. The configurable interconnect circuit of some embodiments selects an input from the set of inputs based on data supplied to the set of select lines. In some embodiments, the configurable interconnect circuit is controlled by configuration data supplied to its select lines. In some embodiments, the configurable interconnect circuit is controlled by user design data supplied to its select lines. In some embodiments, the configurable interconnect circuit is controlled by a combination of configuration data and user design data supplied to its select lines.

In some embodiments, each controllable clocked storage element receives a clock signal and a control signal for controllably storing a signal received at its input and controllably providing a signal to its output. In some embodiments, the controllable clocked storage element allows new data to be stored during each clock cycle (or reconfiguration cycle, user design cycle, etc.). In addition, some embodiments of the controllable clocked storage element provide previously-stored data during each clock cycle. By using controllable clocked storage elements placed between a source and destination circuit, such storage elements may be used to continuously store data from the source circuit during each clock cycle while simultaneously providing previously-stored data to the destination circuit. In addition, by selecting from among the inputs of the configurable interconnect circuit, the delay (in terms of the number of clock cycles) from the input to the output of the controllable clocked storage element may be selected from among several values (e.g., the data stored at the input during a particular clock cycle is available at the output either two or four clock cycles later depending on the state of the control signal). In some embodiments, the control signal is synchronous with the clock signal, while in other embodiments, the two signals may be asynchronous.

In some embodiments, the routing fabric includes configurable clocked storage elements. In some embodiments, each configurable clocked storage element includes at least one input, at least one output, and a series of controllable clocked delay elements connected sequentially. When enabled, each controllable clocked delay element of some embodiments operates as described above in reference to the clocked delay element. When disabled, each controllable clocked delay element neither stores data supplied at its input nor provides data at its output. For a particular configurable clocked storage element that connects a particular source circuit to a particular destination circuit, the input of the particular configurable clocked storage element connects to an output of the source circuit, while the output of the particular configurable clocked storage element connects to an input of the destination circuit.

Each configurable clocked storage element receives a configuration signal and a clock signal for configurably storing a signal received at its input and configurably providing a signal to its output. In some embodiments, the configurable clocked storage element allows new data to be stored during each clock cycle (or reconfiguration cycle, etc.). In some embodiments, the configurable clocked storage element provides previously-stored data during each clock cycle. By using configurable clocked storage elements placed between a source and destination circuit, such storage elements may be used to continuously store data from the source circuit during each clock cycle while simultaneously providing previously-stored data to the destination circuit.

In addition, in some embodiments, during each particular clock cycle, the configurable clocked storage element receives at least one configuration data signal that controls whether the configurable clocked storage element stores a signal that the configurable clocked storage element receives and/or whether the configurable clocked storage element passes a signal that the configurable clocked storage element received during a previous clock cycle. In other words, in some embodiments, configuration data may be used to program an arbitrary number of delay and hold clock cycles of the configurable clocked storage element. In some embodiments, the configuration data is provided to the control input of the controllable clocked delay elements. In some embodiments, the configuration signal is synchronous with the clock signal, while in other embodiments, the two signals may be asynchronous.

In addition to placing the clocked storage element, controllable clocked storage element, or configurable clocked storage element within the routing fabric, some embodiments place these storage elements in other locations on the IC. Some embodiments include at least one configurable storage element, at least one controllable clocked storage element, at least one clocked storage element, and/or at least one configurable clocked storage element in each tile of the IC. Some embodiments include multiple configurable storage elements, multiple controllable clocked storage elements, multiple clocked storage elements, and/or multiple configurable clocked storage elements located in the routing fabric of the IC, or elsewhere on the IC.

In some embodiments, some or all of the clocked storage elements described above may be at least partly controlled by user design signals. In some embodiments, some or all of these clocked storage elements are configurable storage elements whose storage operation is at least partly controlled by a set of configuration data stored in configuration data storage of the IC. For instance, in some embodiments, the set of configuration bits determines the number of clock cycles in which a clocked storage element presents data at its output. In some embodiments, the clocked storage element receives a signal derived from a clock signal that at least partly controls its storage operation.

Some embodiments implement the storage elements and operations described above using registers for all of the storage elements. Other embodiments use latches for some or all the storage elements. Other embodiments use a combination of latches and registers for the storage elements. In some situations, latches have several advantages. For instance, a latch is usually not clock driven, and can operate solely in response to an enable signal. Hence, they can typically operate transparently in response to enable signals that can even be asynchronous. This ability to operate transparently allows the operations of the latches to adjust flexibly to receive and output data whenever such data is provided or needed. On the other hand, edge triggered devices are capable of storing multiple values over several reconfiguration cycles. Thus, the combination of both types of storage elements allows the greatest amount of flexibility.

Some embodiments use complementary pass logic to implement some or all of their circuits. Some of these embodiments use a set of cross-coupling transistors to form some or all of the storage elements. Cross-coupling transistors remove the signal delay associated with traditional storage elements such as registers or latches. Also, cross-coupling transistors operate solely in response to an enable signal and therefore allow the storage elements to operate transparently in response to the enable signal.

In addition to the structure and operation of the storage elements circuits above, some embodiments include a process for reducing power consumption during the operation of the IC by using any idle storage elements, interconnect circuits, and/or other circuits to eliminate unnecessary toggling of signals in the IC. For instance, the configurable storage element described above that includes multiple storage elements built in the output stage of a configurable interconnect circuit may be used for power savings when one or more of the storage elements located at its outputs is not needed for a routing or storage operation. The configurable storage element's unused output(s) may be configured to hold its previous output value in order to eliminate switching at the output, and at any wires or other circuitry connected to the output (e.g., at the input of an interconnect circuit, buffer, etc.). Several processes to achieve reduced power consumption utilizing the storage elements discussed above are described below.

Some embodiments of the process configure an IC that includes multiple reconfigurable circuits, where several of the reconfigurable circuits are reconfigurable storage elements and each of the reconfigurable storage elements has an association with another reconfigurable circuit. In some embodiments, a reconfigurable storage element has an association with a reconfigurable circuit when an output (or input) of the reconfigurable circuit is directly connected to an input (or output) of the reconfigurable storage element. In some embodiments a direct connection may include multiple wires, vias, buffers, and/or non-configurable circuits. In some embodiments, a reconfigurable storage element may be configured, based on a configuration data, to either pass-through a value during a particular reconfiguration cycle, or hold a value that it was outputting during a previous reconfiguration cycle. In some of these embodiments, the reconfigurable storage elements are short-term storage elements and/or long-term storage elements.

In some embodiments, a user design that includes multiple user operations is received and each of the user operations is assigned to at least one reconfigurable circuit to be performed during at least one reconfiguration cycle. Some of these embodiments identify any reconfigurable circuits that have outputs that are not examined by other circuits during a particular reconfiguration cycle. For that particular reconfiguration cycle, some embodiments define a configuration for a particular reconfigurable storage element associated with the identified reconfigurable circuit that directs the particular reconfigurable storage element to hold a value that it was outputting in a prior reconfiguration cycle, in order to prevent unnecessary transitions at the output of the particular reconfigurable storage element.

In some embodiments, several of the reconfigurable circuits are reconfigurable interconnect circuits. In some embodiments, each reconfigurable interconnect circuit has a set of inputs, a set of select lines, and at least one output. The reconfigurable interconnect circuit of some embodiments selects an input from the set of inputs based on data supplied to the set of select lines. In some embodiments, the reconfigurable interconnect circuit is controlled by configuration data supplied to its select lines.

In some embodiments, reconfigurable interconnect circuits, each associated with a reconfigurable storage element, are identified as having an input and an output that are not examined during a particular reconfiguration cycle. In some embodiments, a configuration is defined for each reconfigurable storage element associated with each identified reconfigurable interconnect circuit that directs the reconfigurable storage element to hold a value it was outputting in a reconfiguration cycle prior to the particular reconfiguration cycle. In addition, a configuration is defined for each identified reconfigurable interconnect circuit directing it to select an input that is directly connected to the particular reconfigurable storage element associated with the identified reconfigurable interconnect circuit in order to prevent unnecessary transitions at the output of the identified reconfigurable interconnect circuit.

Although the processes above were discussed with reference to reconfiguration cycles and circuits, some embodiments may use configurable circuits and cycles to implement these processes. In addition, while the processes were described with reference to particular circuits and specific combinations or arrangements of these circuits, some embodiments may be implemented with different combinations or arrangements of the circuit elements.

Several more detailed embodiments of the invention are described in the sections below. Before describing these embodiments further, an overview of the configurable IC architecture used by some embodiments to implement the routing fabric with storage elements is given in Section II below. This discussion is followed by the discussion in Section III of an overview of the reconfigurable IC architecture used by some embodiments to implement the routing fabric with storage elements. Next, Section IV describes various implementations of a configurable IC that includes storage elements in its routing fabric. This description is followed by the discussion in Section V of various implementations of a configurable IC that includes clocked storage elements. Next, Section VI describes the use of the different storage elements located within the routing fabric of a configurable IC. Last, Section VII describes an electronics system that has an IC which implements some of the embodiments of the invention.

II. Configurable IC Architecture

An IC is a device that includes numerous electronic components (e.g., transistors, resistors, diodes, etc.) that are embedded typically on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

A configurable IC is an integrated circuit that has configurable circuits. A configurable circuit is a circuit that can "configurably" perform a set of operations. Specifically, a configurable circuit receives a configuration data set that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data bits that can configure the configurable IC (or more accurately, the configurable IC's configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

A configurable interconnect circuit is a circuit that can configurably connect an input set to an output set in a variety of ways. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in some or all of their interconnect circuits.

The configurable IC of some embodiments includes configurable logic circuits and configurable interconnect circuits for routing the signals to and from the configurable logic circuits. In addition to configurable circuits, a configurable IC also typically includes non-configurable circuits (e.g., non-configurable logic circuits, interconnect circuits, memories, etc.).

Figure 4:
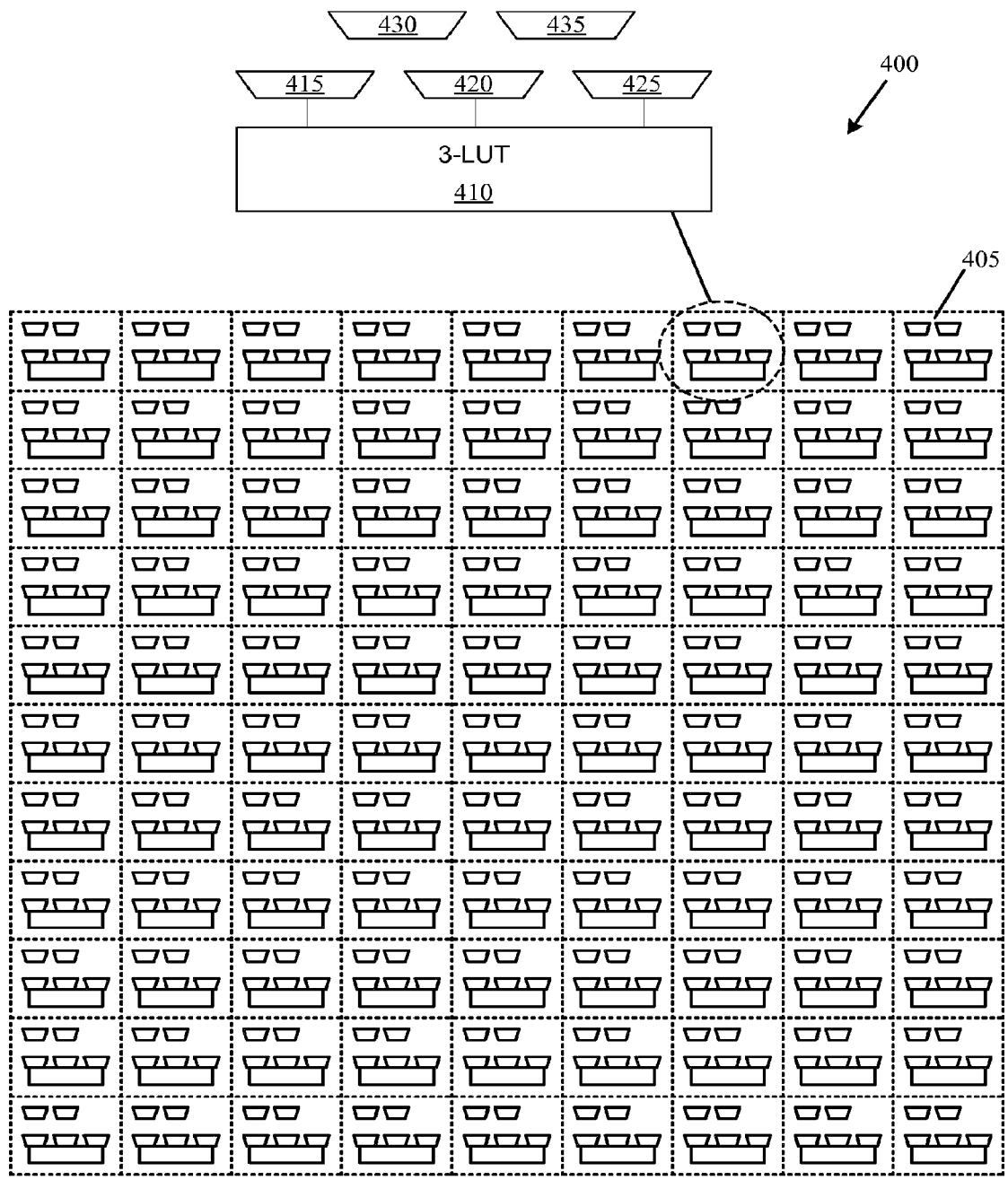
FIG. 4 illustrates a configurable circuit architecture that is formed by numerous configurable tiles that are arranged in an array with multiple rows and columns of some embodiments.
Figure 5:
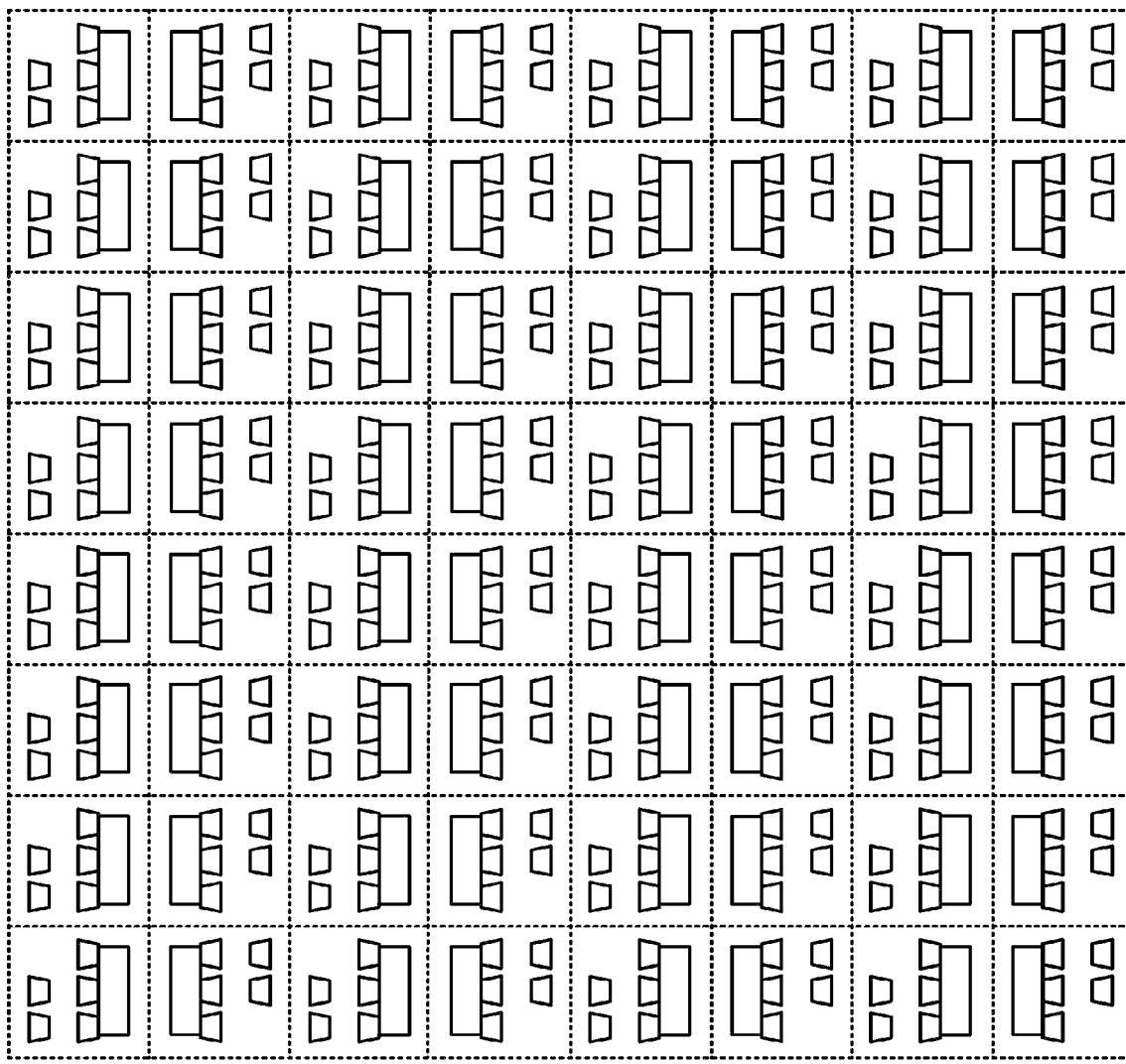
FIG. 5 provides one possible physical architecture of the configurable IC illustrated in FIG. 4 of some embodiments.
Figure 6:
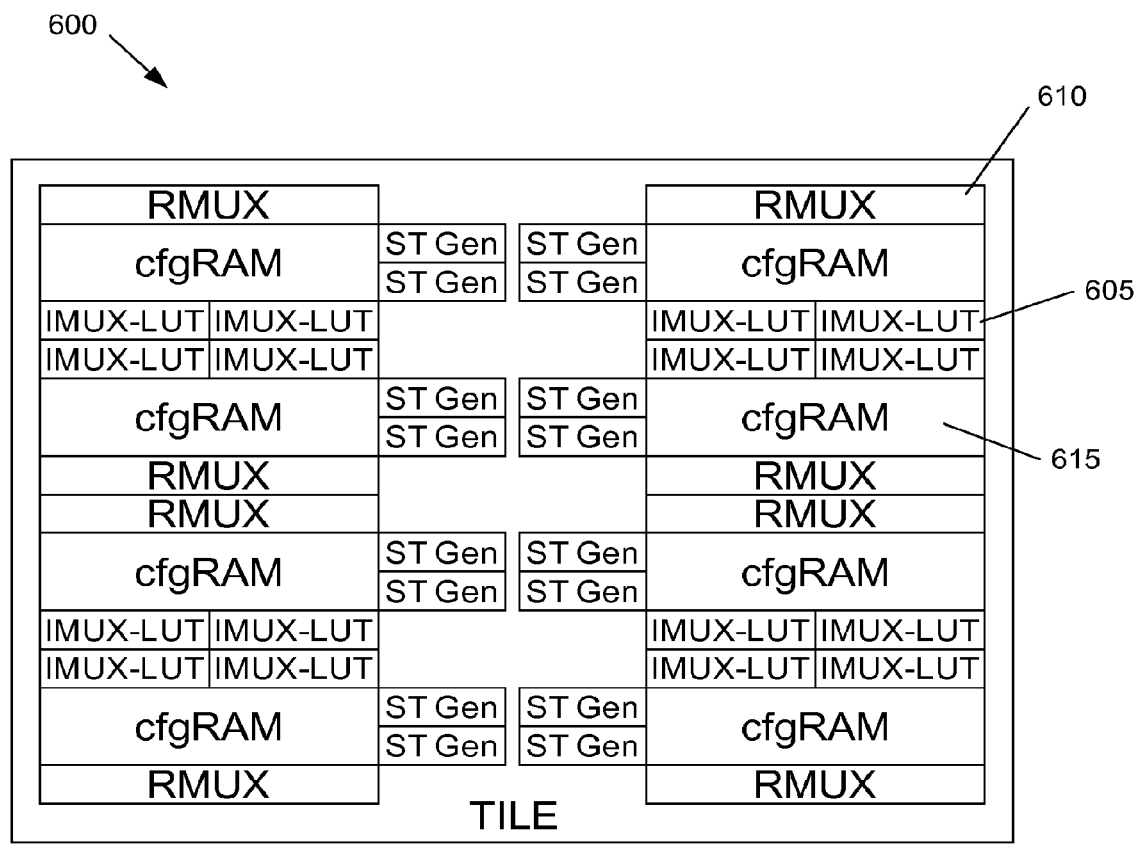
FIG. 6 illustrates the detailed tile arrangement of some embodiments of some embodiments.

In some embodiments, the configurable circuits might be organized in an arrangement that has all the circuits organized in an array with several aligned rows and columns. In addition, within such a circuit array, some embodiments disperse other circuits (e.g., memory blocks, processors, macro blocks, IP blocks, SERDES controllers, clock management units, etc.). FIGS. 4-6 illustrate several configurable circuit arrangements/architectures that include the invention's circuits. One such architecture is illustrated in FIG. 4.

The architecture of FIG. 4 is formed by numerous configurable tiles 405 that are arranged in an array with multiple rows and columns. In FIG. 4, each configurable tile includes a configurable three-input LUT 410, three configurable input-select multiplexers 415, 420, and 425, and two configurable routing multiplexers 430 and 435. Different embodiments have different number of configurable interconnect circuits 430. For instance, some embodiments may have eight configurable interconnect circuits while others may have more or less such circuits. For each configurable circuit, the configurable IC 400 includes a set of storage elements (e.g., a set of SRAM cells) for storing a set of configuration data bits. Note that storage elements may alternatively be referred to as storage circuits.

In some embodiments, the logic circuits are look-up tables while the interconnect circuits are multiplexers. Also, in some embodiments, the LUTs and the multiplexers are sub-cycle reconfigurable circuits (sub-cycles of reconfigurable circuits may be alternatively referred to as "reconfiguration cycles"). In some of these embodiments, the configurable IC stores multiple sets of configuration data for a sub-cycle reconfigurable circuit, so that the reconfigurable circuit can use a different set of configuration data in different sub-cycles. Other configurable tiles can include other types of circuits, such as memory arrays instead of logic circuits.

In FIG. 4, an input-select multiplexer (also referred to as an "IMUX") 415 is an interconnect circuit associated with the LUT 410 that is in the same tile as the input select multiplexer. One such input select multiplexer receives several input signals for its associated LUT and passes one of these input signals to its associated LUT. In some embodiments, some of the input-select multiplexers are hybrid input-select/logic circuits (referred to as "HMUXs") capable of performing logic operations as well as functioning as input select multiplexers. An HMUX is a multiplexer that can receive "user-design signals" along its select lines.

A user-design signal within a configurable IC is a signal that is generated by a circuit (e.g., logic circuit) of the configurable IC. The word "user" in the term "user-design signal" connotes that the signal is a signal that the configurable IC generates for a particular application that a user has configured the IC to perform. User-design signal is abbreviated to user signal in some of the discussion in this document. In some embodiments, a user signal is not a configuration or clock signal that is generated by or supplied to the configurable IC. In some embodiments, a user signal is a signal that is a function of at least a portion of the set of configuration data received by the configurable IC and at least a portion of the inputs to the configurable IC. In these embodiments, the user signal can also be dependent on (i.e., can also be a function of) the state of the configurable IC. The initial state of a configurable IC is a function of the set of configuration data received by the configurable IC and the inputs to the configurable IC. Subsequent states of the configurable IC are functions of the set of configuration data received by the configurable IC, the inputs to the configurable IC, and the prior states of the configurable IC.

In FIG. 4, a routing multiplexer (also referred to as an RMUX) 430 is an interconnect circuit that at a macro level connects other logic and/or interconnect circuits. In other words, unlike an input select multiplexer in these figures that only provides its output to a single logic circuit (i.e., that only has a fan out of 1), a routing multiplexer in some embodiments either provides its output to several logic and/or interconnect circuits (i.e., has a fan out greater than 1), or provides its output to at least one other interconnect circuit.

In some embodiments, the RMUXs depicted in FIG. 4 form the routing fabric along with the wire-segments that connect to the RMUXs, and the vias that connect to these wire segments and/or to the RMUXs. In some embodiments, the routing fabric further includes buffers for achieving one or more objectives (e.g., to maintain the signal strength, reduce noise, alter signal delay, etc.) with respect to the signals passing along the wire segments.

Various wiring architectures can be used to connect the RMUXs, IMUXs, and LUTs. Several examples of the wire connection scheme are described in U.S. application Ser. No. 11/082,193 entitled "Configurable IC with Routing Circuits with Offset Connections", filed on Mar. 15, 2005.

Several embodiments are described below by reference to a "direct connection." In some embodiments, a direct connection is established through a combination of one or more wire segments, and potentially one or more vias, but no intervening circuit. In some embodiments, a direct connection might however include one or more intervening buffer circuits but no other type of intervening circuits. In yet other embodiments, a direct connection might include intervening non-configurable circuits instead of or in conjunction with buffer circuits. In some of these embodiments, the intervening non-configurable circuits include interconnect circuits, while in other embodiments they do not include interconnect circuits.

In the discussion below, two circuits might be described as directly connected. This means that the circuits are connected through a direction connection. Also, some connections are referred to below as configurable connections and some circuits are described as configurably connected. Such references signifies that the circuits are connected through a configurable interconnect circuit (such as a configurable routing circuit).

In some embodiments, the examples illustrated in FIG. 4 represent the actual physical architecture of a configurable IC. However, in other embodiments, the examples illustrated in FIG. 4 topologically illustrate the architecture of a configurable IC (i.e., they conceptually show the configurable IC without specifying a particular geometric layout for the position of the circuits).

In some embodiments, the position and orientation of the circuits in the actual physical architecture of a configurable IC are different from the position and orientation of the circuits in the topological architecture of the configurable IC. Accordingly, in these embodiments, the ICs physical architecture appears quite different from its topological architecture. For example, FIG. 5 provides one possible physical architecture of the configurable IC 400 illustrated in FIG. 4.

Having the aligned tile layout with the same circuit elements of FIG. 5 simplifies the process for designing and fabricating the IC, as it allows the same circuit designs and mask patterns to be repetitively used to design and fabricate the IC. In some embodiments, the similar aligned tile layout not only has the same circuit elements but also have the same exact internal wiring between their circuit elements. Having such layout further simplifies the design and fabrication processes as it further simplifies the design and mask making processes.

Some embodiments might organize the configurable circuits in an arrangement that does not have all the circuits organized in an array with several aligned rows and columns. Therefore, some arrangements may have configurable circuits arranged in one or more arrays, while other arrangements may not have the configurable circuits arranged in an array.

Some embodiments might utilize alternative tile structures. For instance, FIG. 6 illustrates an alternative tile structure that is used in some embodiments. This tile 600 has four sets 605 of 4-aligned LUTs along with their associated IMUXs. It also includes eight sets 610 of RMUXs and eight banks 615 of configuration RAM storage. Each 4-aligned LUT tile shares one carry chain. One example of which is described in U.S. application Ser. No. 11/082,193 entitled "Configurable IC with Routing Circuits with Offset Connections", filed on Mar. 15, 2005. One of ordinary skill in the art would appreciate that other organizations of LUT tiles may also be used in conjunction with the invention and that these organizations might have fewer or additional tiles.

III. Reconfigurable IC Architecture

Some embodiments of the invention can be implemented in a reconfigurable integrated circuit that has reconfigurable circuits that reconfigure (i.e., base their operation on different sets of configuration data) one or more times during the operation of the IC. Specifically, reconfigurable ICs are configurable ICs that can reconfigure during runtime. A reconfigurable IC typically includes reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it bases its operation on a different set of configuration data.

A reconfigurable circuit of some embodiments that operates on four sets of configuration data receives its four configuration data sets sequentially in an order that loops from the first configuration data set to the last configuration data set. Such a sequential reconfiguration scheme is referred to as a 4 "loopered" scheme. Other embodiments, however, might be implemented as six or eight loopered sub-cycle reconfigurable circuits. In a six or eight loopered reconfigurable circuit, a reconfigurable circuit receives six or eight configuration data sets in an order that loops from the last configuration data set to the first configuration data set.

Figure 7:
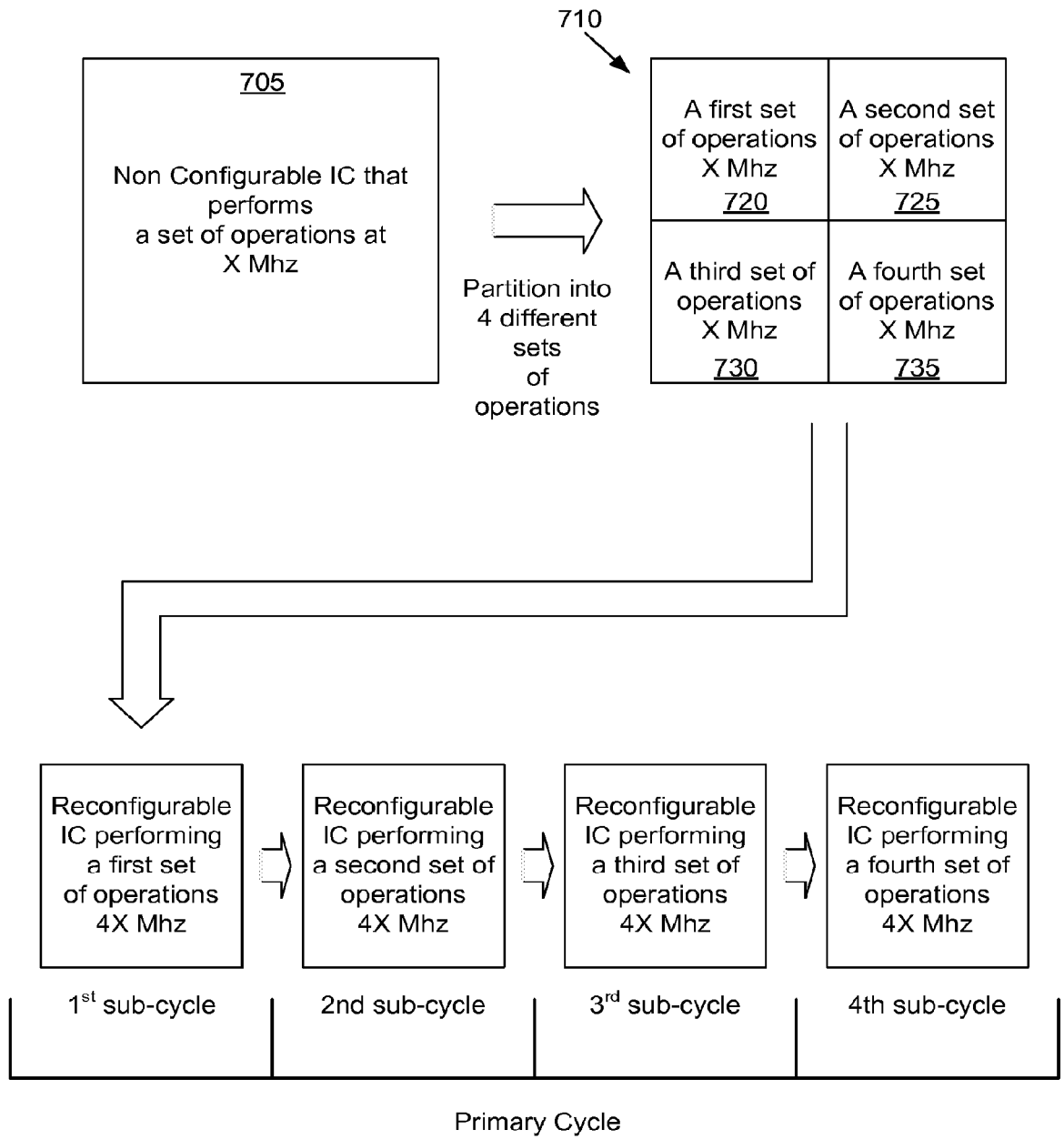
FIG. 7 illustrates an example of a sub-cycle reconfigurable IC of some embodiments.

FIG. 7 conceptually illustrates an example of a sub-cycle reconfigurable IC (i.e., an IC that is reconfigurable on a sub-cycle basis). In this example, the sub-cycle reconfigurable IC implements an IC design 705 that operates at a clock speed of X MHz. The operations performed by the components in the IC design 705 can be partitioned into four sets of operations 720-735, with each set of operations being performed at a clock speed of X MHz.

FIG. 7 then illustrates that these four sets of operations 720-735 can be performed by one sub-cycle reconfigurable IC 710 that operates at 4X MHz. In some embodiments, four cycles of the 4X MHz clock correspond to four sub-cycles within a cycle of the X MHz clock. Accordingly, this figure illustrates the reconfigurable IC 710 reconfiguring four times during four cycles of the 4X MHz clock (i.e., during four sub-cycles of the X MHz clock). During each of these reconfigurations (i.e., during each sub-cycle), the reconfigurable IC 710 performs one of the identified four sets of operations. In other words, the faster operational speed of the reconfigurable IC 710 allows this IC to reconfigure four times during each cycle of the X MHz clock, in order to perform the four sets of operations sequentially at a 4X MHz rate instead of performing the four sets of operations in parallel at an X MHz rate.

IV. Transparent Storage Elements within the Routing Fabric

As mentioned above, the configurable routing fabric of some embodiments is formed by configurable RMUXs along with the wire-segments that connect to the RMUXs, vias that connect to these wire segments and/or to the RMUXs, and buffers that buffer the signals passing along one or more of the wire segments. In addition to these components, the routing fabric of some embodiments further includes configurable storage elements.

Having the storage elements within the routing fabric is highly advantageous. For instance, such storage elements obviate the need to route data computed by a source component to a second component that stores the computed data before routing the data to a destination component that will use the data. Instead, such computed data can be stored optimally within storage elements located along the existing routing paths between source and destination components, which can be logic and/or interconnect circuits within the IC.

Such storage functionality within the routing fabric is ideal when in some embodiments the destination component is unable to receive or process the signal from the source component during a certain time period. This functionality is also useful in some embodiments when a signal from a source component has insufficient time to traverse the defined route to reach the destination within a single clock cycle or sub-cycle and needs to be temporarily stored along the route before reaching the destination in a later clock cycle (e.g., user-design clock cycle) or in a later sub-cycle in case of a sub-cycle reconfigurable IC. By providing storage within the routing fabric, the source and destination components continue to perform operations (e.g., computational or routing) during the required storage time period.

Figure 8:
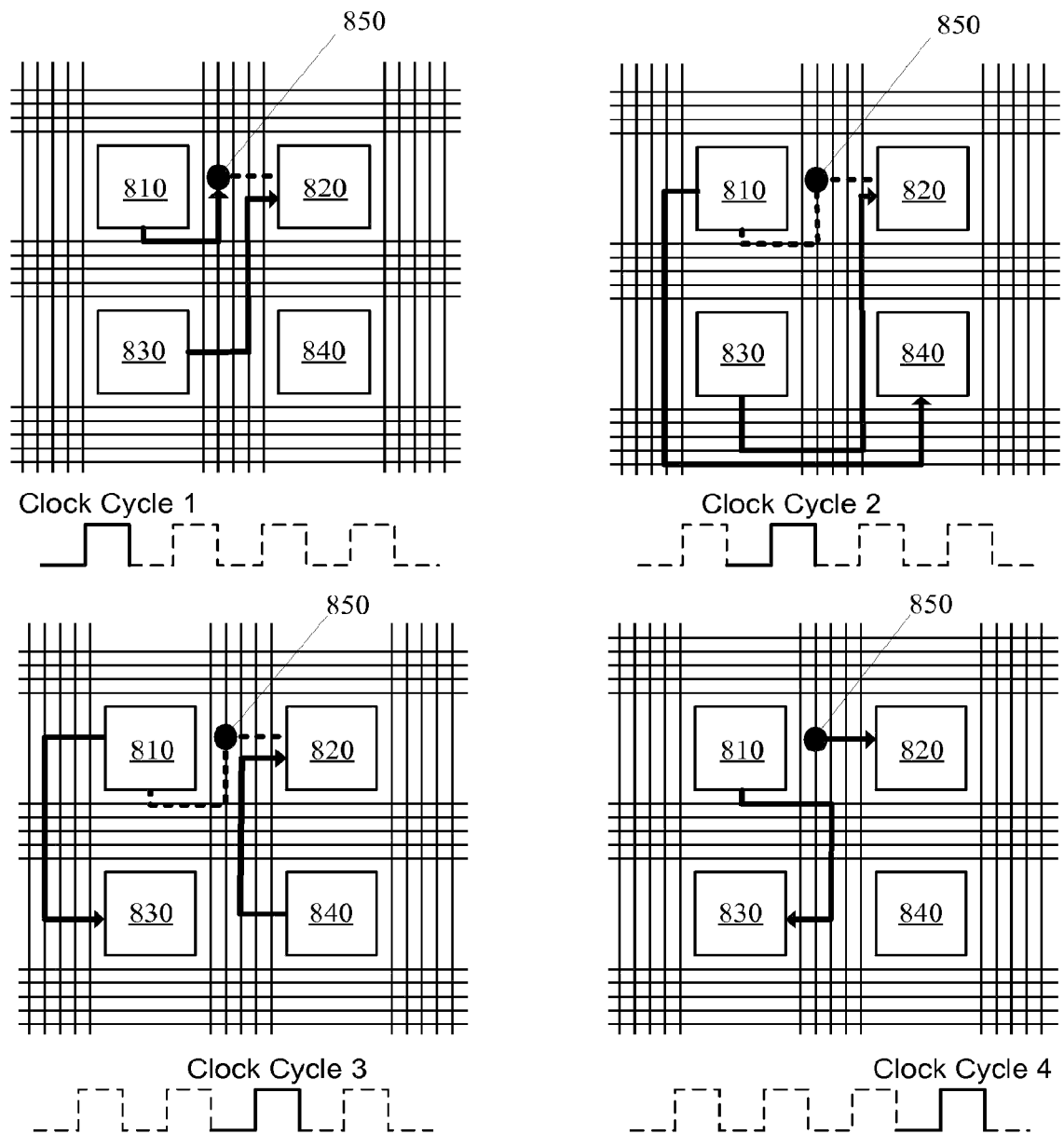
FIG. 8 provides an illustrative embodiment of the functionality provided by placing storage elements within the routing fabric of a configurable IC of some embodiments.

FIG. 8 provides an illustrative example of the functionality provided by placing storage elements within the routing fabric of a configurable IC. In FIG. 8, a component 810 is outputting a signal for processing by component 820 at clock cycle 1. However, component 820 is receiving a signal from component 830 at clock cycles 1 and 2 and a signal from component 840 at clock cycle 3. Therefore, the signal from 810 may not be routed to 820 until clock cycle 4. Hence, the signal is stored within the storage element 850 located within the routing fabric. By storing the signal from 810 within the routing fabric during clock cycles 1 through 3, components 810 and 820 remain free to perform other operations during this time period. At clock cycle 4, 820 is ready to receive the stored signal and therefore the storage element 850 releases the value. It should be apparent to one of ordinary skill in the art that the clock cycles of some embodiments described above could be either (1) sub-cycles within or between different user design clock cycles of a reconfigurable IC, (2) user-design clock cycles, or (3) any other clock cycle.

Figure 9:
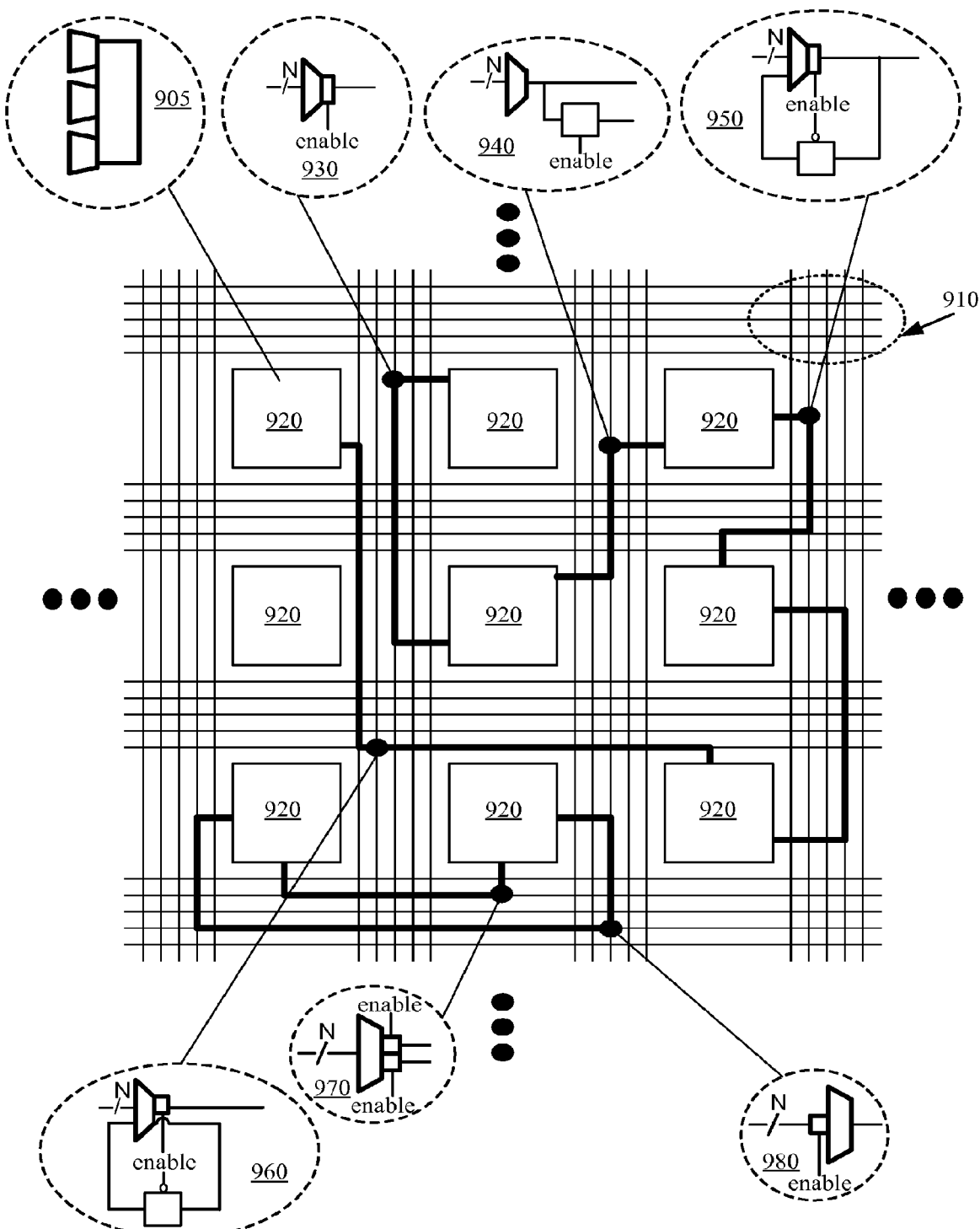
FIG. 9 illustrates placement of a storage element within the routing fabric of a configurable IC of some embodiments.

FIG. 9 illustrates several examples of different types of controllable storage elements 930-980 that can be located throughout the routing fabric 910 of a configurable IC. Each storage element 930-980 can be controllably enabled to store an output signal from a source component that is to be routed through the routing fabric to some destination component. In some embodiments, some or all of these storage elements are configurable storage elements whose storage operation is controlled by a set of configuration data stored in configuration data storage of the IC. U.S. patent application Ser. No. 11/081,859 describes a two-tiered multiplexer structure for retrieving enable signals on a sub-cycle basis from configuration data storage for a particular configurable storage. It also describes building the first tier of such multiplexers within the output circuitry of the configuration storage that stores a set of configuration data. Such multiplexer circuitry can be used in conjunction with the configurable storage elements described above and below. U.S. patent application Ser. No. 11/081,859 is incorporated herein by reference.

As illustrated in FIG. 9, outputs are generated from the circuit elements 920. The circuit elements 920 are configurable logic circuits (e.g., 3-input LUTs and their associated IMUXs as shown in expansion 905), while they are other types of circuits in other embodiments. In some embodiments, the outputs from the circuit elements 920 are routed through the routing fabric 910 where the outputs can be controllably stored within the storage elements 930-980 of the routing fabric. Storage element 930 is a storage element that is coupled to the output of a routing multiplexer. This storage element will be further described below by reference to FIGS. 10 and 11. Storage element 940 includes a routing circuit with a parallel distributed output path in which one of the parallel distributed paths includes a storage element. This storage element will be further described below by reference to FIGS. 17A and 17B. Storage elements 950 and 960 include a routing circuit with a set of storage elements in which a second storage element is connected in series or in parallel to the output path of the routing circuit. Storage element 950 will be further described below by reference to FIG. 21 and storage element 960 by reference to FIG. 20. Storage element 970 has multiple storage elements coupled to the output of a routing multiplexer. Storage element 970 will be further described below by reference to FIGS. 13 and 14. Storage element 980 is a storage element that is coupled to the input of a routing multiplexer. Storage element 980 will be further described below by reference to FIGS. 15-16.

One of ordinary skill in the art will realize that the depicted storage elements within the routing fabric sections of FIG. 9 only present some embodiments of the invention and do not include all possible variations. Some embodiments use all these types of storage elements, while other embodiments do not use all these types of storage elements (e.g., some embodiments use only one or two of these types of storage elements). Some embodiments may place the storage elements at locations other than the routing fabric (e.g., between or adjacent to the configurable logic circuits within the configurable tiles of the IC).

A. Storage Elements at Output of a Routing Multiplexer

Figure 10:
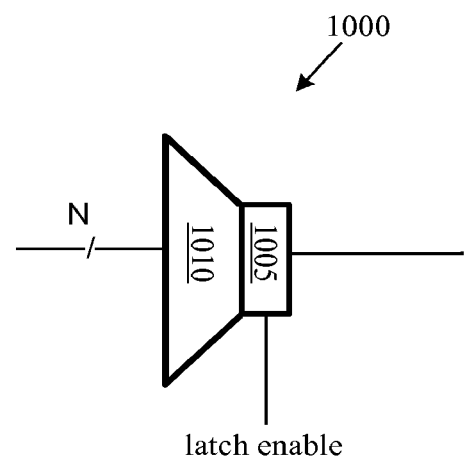
FIG. 10 illustrates a circuit representation of a storage circuit of some embodiments.

FIG. 10 illustrates a circuit representation of the storage element 930. In some embodiments, the storage element 930 is a latch 1005 that is built in or placed at the output stage of a multiplexer 1010. The latch 1005 receives a latch enable signal. When the latch enable signal is inactive, the circuit simply acts as a routing circuit. On the other hand, when the latch enable signal is active, the circuit acts as a latch that outputs the value that the circuit was previously outputting while serving as a routing circuit. Accordingly, when another circuit in a second later configuration cycle needs to receive the value of circuit 1000 in a first earlier configuration cycle, the circuit 1000 can be used. The circuit 1000 may receive and latch the value in a cycle before the second later configuration cycle (e.g., in the first earlier cycle) and output the value to the second circuit in the second later sub-cycle.

Figure 11:
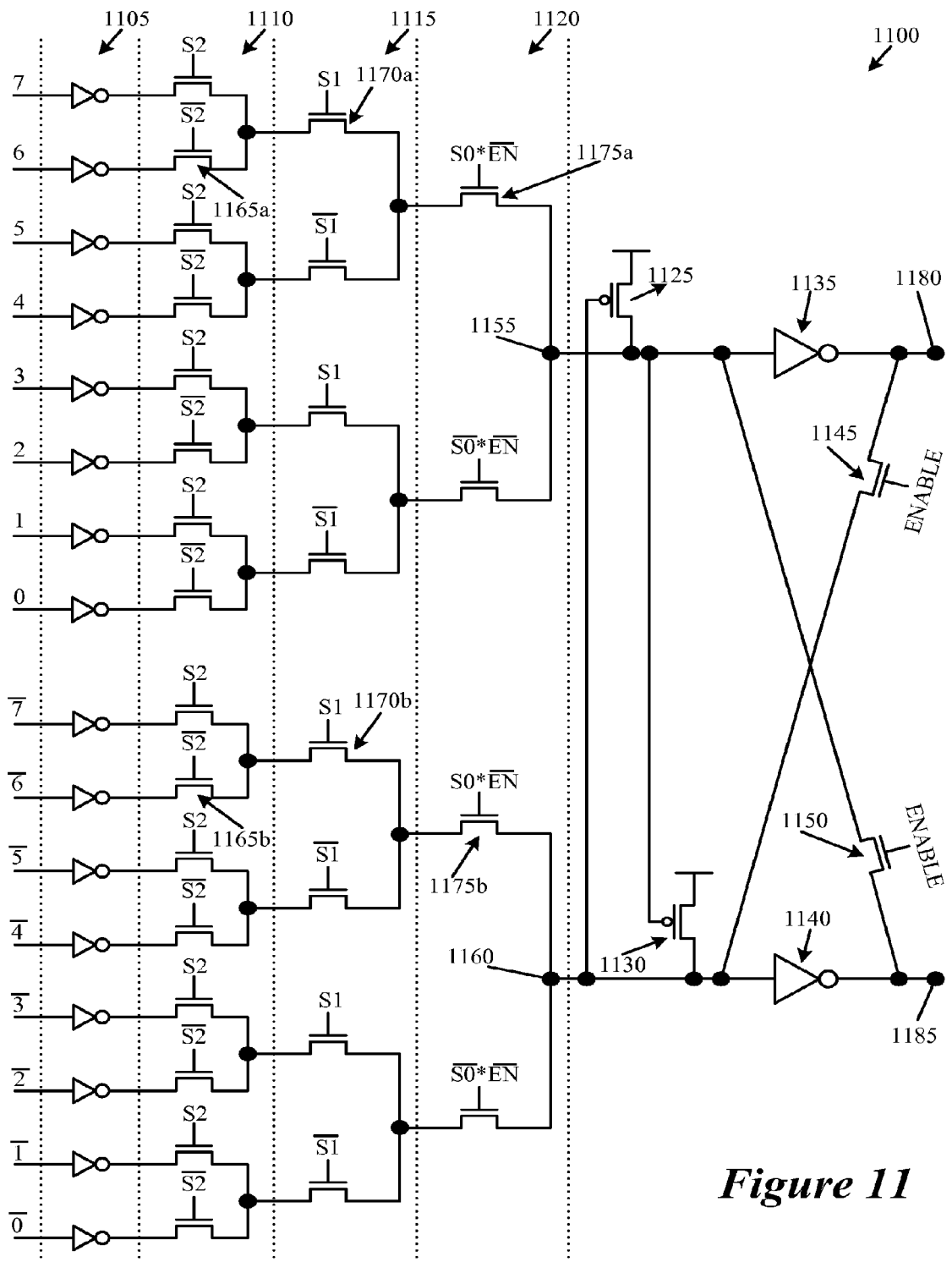
FIG. 11 illustrates another alternative implementation of a storage circuit of some embodiments.

FIG. 11 illustrates an implementation of the circuit 1000, where the latch is built into the output stage of the multiplexer 1010 by using a pair of cross-coupling transistors. As shown in this figure, the circuit 1100 includes (1) one set of input buffers 1105, (2) three sets 1110, 1115, and 1120 of NMOS pass gate transistors, (3) two pull-up PMOS transistors 1125 and 1130, (4) two inverting output buffers 1135 and 1140, and (5) two cross-coupling transistors 1145 and 1150.

The circuit 1100 is an eight-to-one multiplexer that can also serve as a latch. The inclusions of the two transistors 1145 and 1150 that cross couple the two output buffers 1135 and 1140 and the inclusion of the enable signal with a signal that drives the last set 1120 of the pass transistors of the eight-to-one multiplexer allow the eight-to-one multiplexer 1100 to act as a storage element whenever the enable signal is active (which, in this case, means whenever the enable signal is high).

In a complementary pass-transistor logic ("CPL") implementation of a circuit, a complementary pair of signals represents each logic signal, where an empty circle at or a bar over the input or output of a circuit denotes the complementary input or output of the circuit in the figures. In other words, the circuit receives true and complement sets of input signals and provides true and complement sets of output signals. Accordingly, in the multiplexer 1100 of FIG. 11, one subset of the input buffers 1105 receives eight input bits (0-7), while another subset of the input buffers 1105 receives the complement of the eight inputs bits. These input buffers serve to buffer the first set 1110 of pass transistors.

The first set 1110 of pass transistors receive the third select bit S2 or the complement of this bit, while the second set 1115 of pass transistors receive the second select bit S1 or the complement of this bit. The third set 1120 of pass transistors receive the first select bit or its complement after this bit has been "AND'ed" by the complement of the enable signal. When the enable bit is not active (i.e., in this case, when the enable bit is low), the three select bits S2, S1, and S0 cause the pass transistors to operate to pass one of the input bits and the complement of this input bit to two intermediate output nodes 1155 and 1160 of the circuit 1100. For instance, when the enable signal is low, and the select bits are 011, the pass transistors 1165a, 1170a, 1175a, and 1165b, 1170b, and 1175b turn on to pass the 6 and $\bar{6}$ input signals to the intermediate output nodes 1155 and 1160.

In some embodiments, the select signals S2, S1, and S0 as well as the enable signal are a set of configuration data stored in configuration data storage of the IC. In some embodiments, the configuration data storage stores multiple configuration data sets. The multiple configuration data sets define the operation of the storage elements during differing clock cycles, where the clock cycles of some embodiments include user design clock cycles or sub-cycles of a user design clock cycle of a reconfigurable IC. Circuitry for retrieving a set of configuration data bits from configuration data storage is disclosed in U.S. patent application Ser. No. 11/081,859.

The pull-up PMOS transistors 1125 and 1130 are used to pull-up quickly the intermediate output nodes 1155 and 1160, and to regenerate the voltage levels at the nodes that have been degenerated by the NMOS threshold drops, when these nodes need to be at a high voltage. In other words, these pull-up transistors are used because the NMOS pass transistors are slower than PMOS transistors in pulling a node to a high voltage. Thus, for instance, when the $6^{th}$ input signal is high, the enable signal is low, and the select bits are 011, the pass transistors 1165-1175 start to pull node 1155 high and to push node 1160 low. The low voltage on node 1160, in turn, turns on the pull-up transistor 1125, which, in turn, accelerates the pull-up of node 1155.

The output buffer inverters 1135 and 1140 are used to isolate the circuit 1100 from its load. Alternatively, these buffers may be formed by more than one inverter, but the feedback is taken from an inverting node. The outputs of these buffers are the final output 1180 and 1185 of the multiplexer/latch circuit 1100. It should be noted that, in an alternative implementation, the output buffers 1135 and 1140 are followed by multiple inverters.

The output of each buffer 1135 or 1140 is cross-coupling to the input of the other buffer through a cross-coupling NMOS transistor 1145 or 1150. These NMOS transistors are driven by the enable signal. Whenever the enable signal is low, the cross-coupling transistors are off, and hence the output of each buffer 1135 or 1140 is not cross-coupling with the input of the other buffer. Alternatively, when the enable signal is high, the cross-coupling transistors are ON, which cause them to cross-couple the output of each buffer 1135 or 1140 to the input of the other buffer. This cross-coupling causes the output buffers 1135 and 1140 to hold the value at the output nodes 1180 and 1185 at their values right before the enable signal went active. Also, when the enable signal goes active, the signal that drives the third set 1120 of pass transistors (i.e., the "AND'ing" of the complement of the enable signal and the first select bit S0) goes low, which, in turn, turns off the third pass-transistor set 1120 and thereby turns off the multiplexing operation of the multiplexer/latch circuit 1100.

Figure 12:
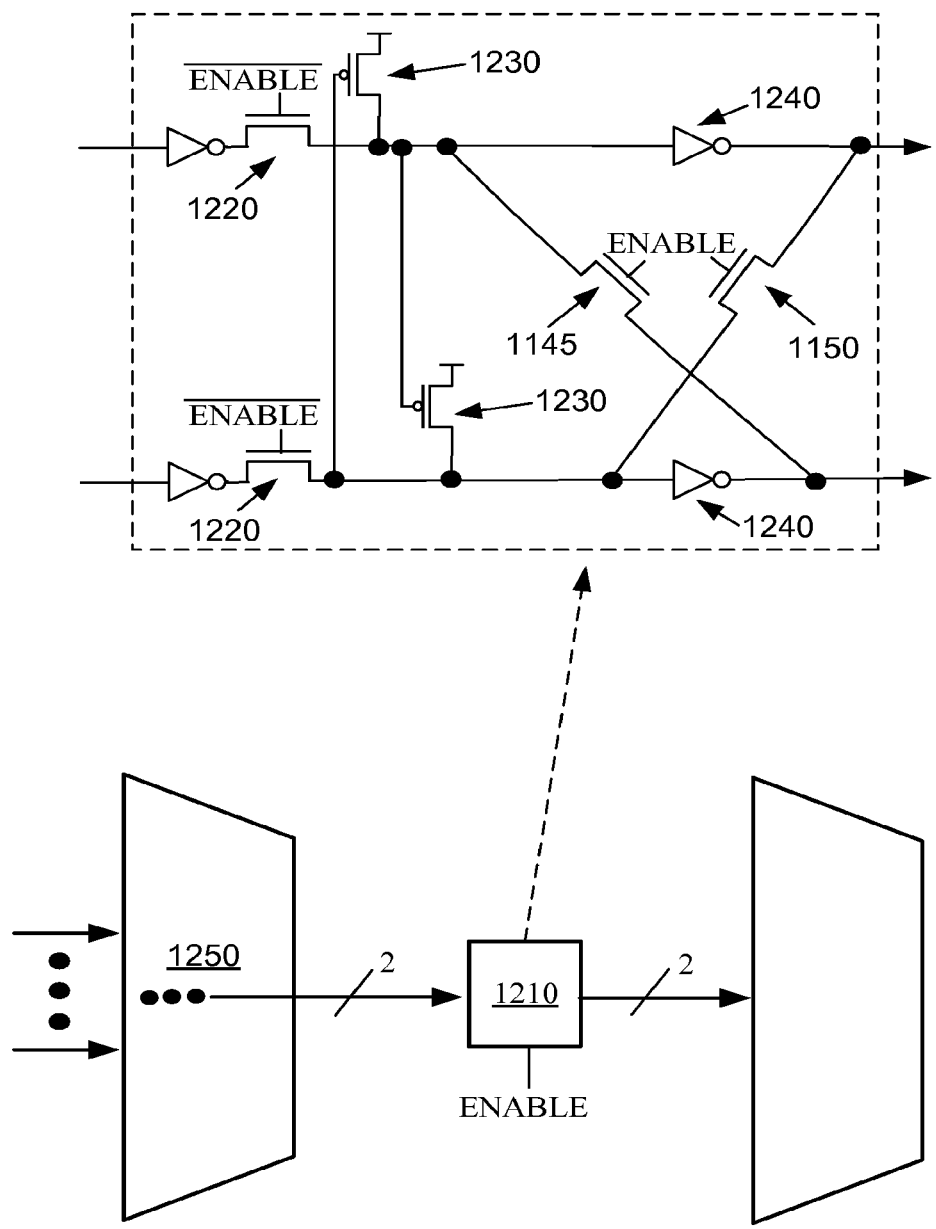
FIG. 12 illustrates an implementation of a storage circuit within the routing fabric of some embodiments.

In FIG. 11, the transistors 1145 and 1150 are cross-coupled at the output stage of the routing circuit. Alternatively, as illustrated in FIG. 12, some embodiments place the cross-coupled transistors 1145 and 1150 in the routing fabric to establish a configurable storage element within the routing fabric outside of the routing multiplexer (such as multiplexer 1100). In FIG. 12, the routing multiplexer 1250 of some embodiments comprises sections 1105, 1110, 1115, and 1120 of FIG. 11. In order to isolate the signal within the storage element 1210 of the routing fabric, some embodiments place isolation devices 1220 within or immediately before the storage element 1210. The isolation devices prevent the input signals to the storage element 1210 from converging with the signals passing through the cross-coupled transistors 1145 and 1150 of the storage element 1210 when the enable signal is asserted. Therefore, when the enable signal is asserted, the isolation devices 1220 prevent further input signals from entering the storage element 1210. Moreover, the asserted enable signal causes the cross coupled transistors 1145 and 1150 to store the signal currently passing through the storage element 1210. Furthermore, a pair of level restorers 1230 are used to quickly restore degraded high levels passing into the storage element 1210 and to prevent leakage in the inverters 1240 that the level restorers are driving.

In some embodiments (e.g., some embodiments that are not runtime reconfigurable), the latch enable signal of FIG. 10, 11, or 12 (referred to as Latch Enable in FIG. 10 and ENABLE in FIGS. 11 and 12) is one configuration data bit for all clock cycles. In other embodiments (e.g., some embodiments that are runtime reconfigurable), this enable signal corresponds to multiple configuration data sets, with each set defining the operation of the storage elements 1005, 1190, and 1210 during differing clock cycles. These differing clock cycles might be different user design clock cycles, or different sub-cycles of a user design clock cycle or some other clock cycle.

In FIGS. 10 and 11, the operations of the multiplexers 1010 and 1105-1120 are controlled by configuration data retrieved from configuration data storage. In some embodiments (e.g., some embodiments that are not runtime reconfigurable), the configuration data for each multiplexer is one configuration data set for all clock cycles. In other embodiments (e.g., some embodiments that are runtime reconfigurable), this configuration data corresponds to multiple configuration data sets, with each set defining the operation of the multiplexer during differing clock cycles, which might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

Other embodiments might construct the storage element 1210 differently (e.g., the storage element 1210 might not use isolation devices 1220 and/or the level restorers 1230). Some embodiments might also use an alternative circuit structure for defining storage elements outside of RMUXs in the routing fabric.

Figure 13:
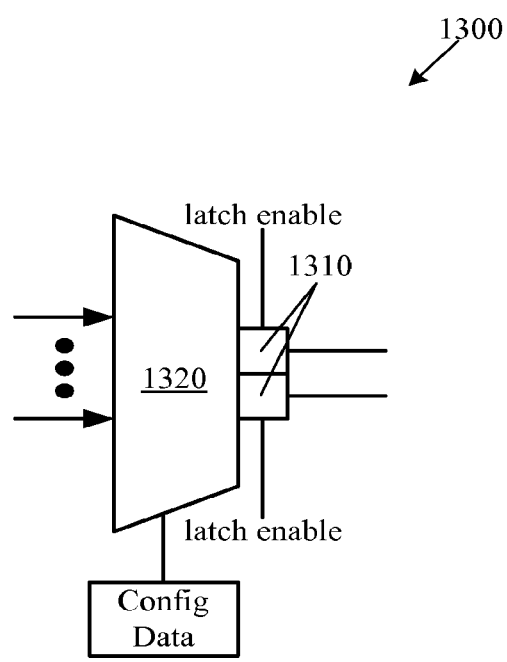
FIG. 13 illustrates a storage circuit with multiple latches at its output for providing simultaneous routing and storage capability at the interconnect, or for storing multiple values of some embodiments.

FIG. 13 illustrates a circuit representation of the storage element 970. In some embodiments, the storage element 970 has multiple latches 1310 that are built in or placed at or near the output stage of a multiplexer 1320. The latches 1310 each receive a latch enable signal. When the latch enable signals are inactive, the circuit simply acts as a routing circuit, passing the input signal through both latches. When one latch enable signal is inactive and one latch enable signal is active, the circuit acts as both a routing circuit and a latch that outputs the value that the circuit was previously outputting while serving as a routing circuit. When both latch enable signals are active, the circuit acts as a pair of latches where each outputs the value that the circuit was previously outputting while the latch was serving as a routing circuit. Since each latch enable signal may be activated independently and asynchronously, the storage element 970 may store a different value in each latch, or store the same value in each latch.

Accordingly, when other circuits in later configuration cycles need to receive the value (or values) of circuit 1300 in an earlier configuration cycle (or cycles), the circuit 1300 can be used. Alternatively, if no other circuits need to receive the value (or values) of circuit 1300 in an earlier configuration cycle (or cycles), the circuit 1300 can be used to hold the value (or values) at its outputs to prevent bit flicker on the wires or circuits that are connected to the output of the circuit 1300, thus conserving power. The circuit 1300 may receive and latch multiple values in multiple cycles before the later configuration cycle and output multiple values to circuits in the later sub-cycles. One of ordinary skill will recognize that the storage element 970 is not limited to two latches on its output. In fact, any number of latches may be placed at the output depending on the needs and constraints of the configurable IC.

Figure 14:
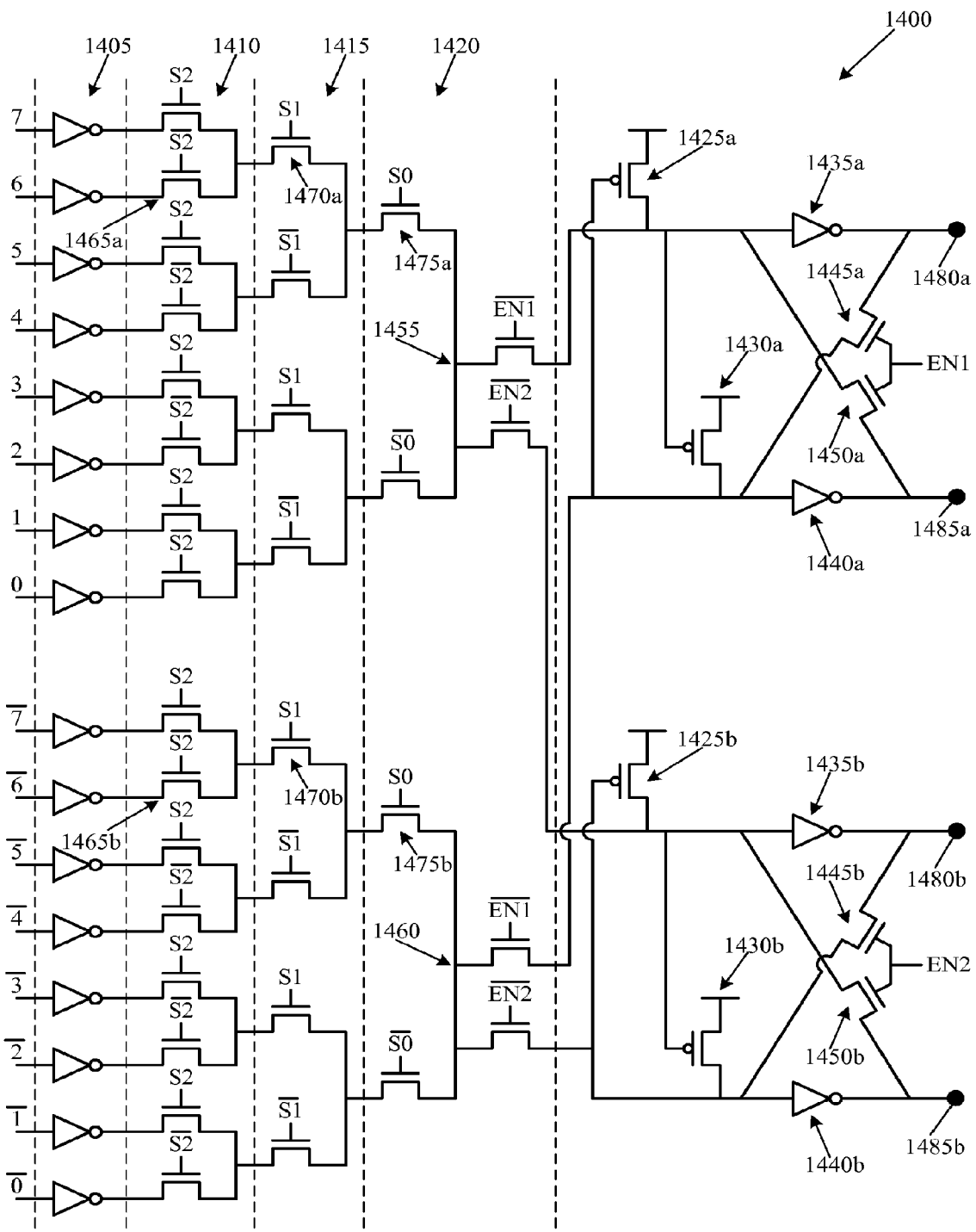
FIG. 14 illustrates an alternative representation of the storage circuit of FIG. 13 of some embodiments.

FIG. 14 illustrates an implementation of the circuit 1300, where the latches are built into the output stage of the multiplexer 1320 by using pairs of cross-coupling transistors. As shown in this figure, the circuit 1400 includes (1) one set of input buffers 1405, (2) three sets 1410, 1415, and 1420 of NMOS pass gate transistors, (3) four pull-up PMOS transistors 1425 and 1430, (4) four inverting output buffers 1435 and 1440, and (5) four cross-coupling transistors 1445 and 1450.

The circuit 1400 is an eight-to-one multiplexer that can also serve as multiple latches. The inclusions of the four transistors 1445 and 1450 that cross couple the four output buffers 1435 and 1440 and the inclusion of the enable signals with a signal that drives the last set 1420 of the pass transistors of the eight-to-one multiplexer allow the eight-to-one multiplexer 1400 to act as multiple storage elements whenever the enable signals are active (which, in this case, means whenever the enable signals are high). The operation of the multiplexer and latches was described in relation to FIG. 11 above.

In FIG. 14, the transistors 1445 and 1450 are cross-coupled at the output stage of the routing circuit. Alternatively, as illustrated in FIG. 12 and discussed above, some embodiments place the cross-coupled transistors 1445 and 1450 in the routing fabric to establish a configurable storage element within the routing fabric outside of the routing multiplexer (such as multiplexer 1100).

In some embodiments (e.g., some embodiments that are not runtime reconfigurable), the latch enable signal of FIG. 13 or 14 (referred to as Config Data in FIG. 13 and ENABLE in FIG. 14) is one configuration data bit for all clock cycles. In other embodiments (e.g., some embodiments that are runtime reconfigurable), this enable signal corresponds to multiple configuration data sets, with each set defining the operation of the storage elements during differing clock cycles. These differing clock cycles might be different user design clock cycles, or different sub-cycles of a user design clock cycle or some other clock cycle.

B. Storage Elements at Input of Routing Multiplexer

Figure 15:
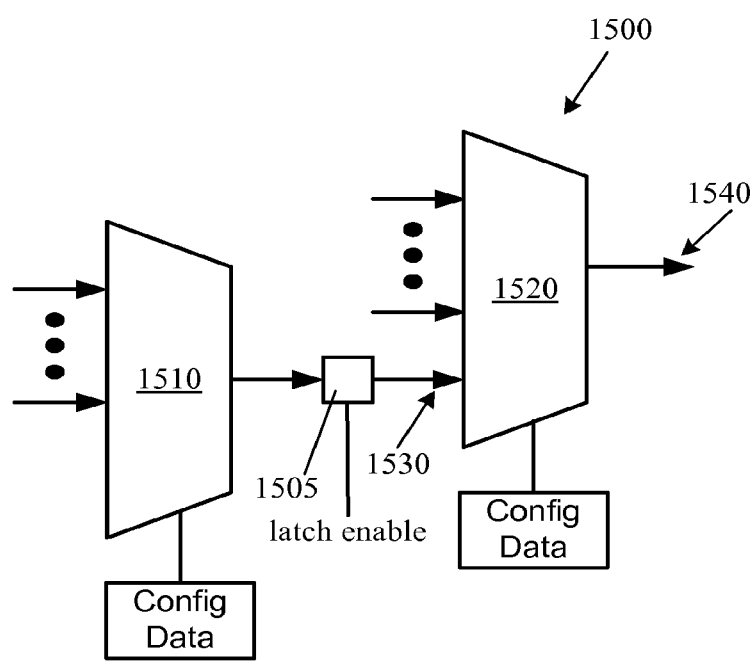
FIG. 15 illustrates a circuit representation of a storage circuit of some embodiments.

FIG. 15 illustrates a circuit representation of the storage element 980. In some embodiments, the storage element 980 is a latch 1505 that is built in or placed at the input stage of a multiplexer 1520. In other embodiments, the latch 1505 is physically placed at the output of another circuit 1510, or within the routing fabric of the IC, and is directly connected to the input of the multiplexer 1520. The latch 1505 receives a latch enable signal. When the latch enable signal is inactive, the circuit simply acts as a routing circuit. On the other hand, when the latch enable signal is active, the circuit acts as a latch that holds the value that an upstream circuit 1510 was previously outputting while the storage element 980 was serving as a routing circuit. Accordingly, when the multiplexer 1520 is not being used to route a changing input, or to select among inputs, the circuit 1500 can be used. By using the circuit 1500 when the multiplexer 1520 is not being used for routing, the storage element 980 eliminates bit flicker along the wire leading to the input of multiplexer 1520. Additionally, in some embodiments, to conserve power, the routing multiplexer may select the input 1530 where the latch 1505 has been placed, when the latch is enabled, which will eliminate bit flicker at the output 1540 of the multiplexer 1520, and consequently, wiring and/or any circuits connected to the output 1540 of the multiplexer 1520.

Figure 16:
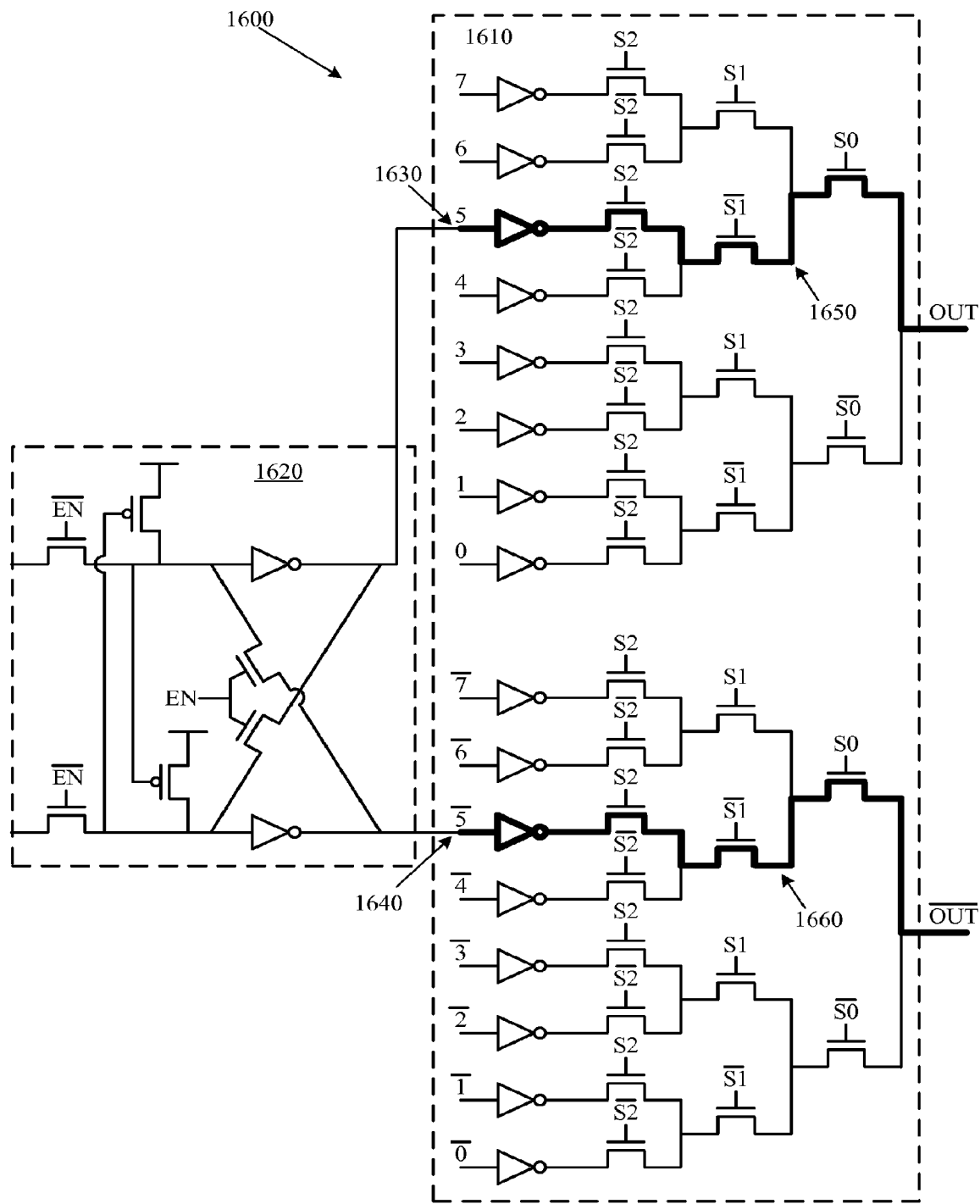
FIG. 16 illustrates an alternative representation of the storage circuit of FIG. 15 of some embodiments.

FIG. 16 illustrates an implementation of the circuit 1600, where the latch is placed at the input of a routing multiplexer 1610. In this example, the latch 1620 is placed at input 5 1630 of the multiplexer 1610. Alternatively, the latch could be routed to input 5 (or any other input) through the routing fabric or another signal path (e.g., an interconnect circuit, pass transistor, buffer, or wire). Likewise, the complementary output of the latch 1620 is placed at (or routed to) complementary input 5 1640 of the multiplexer 1610. In this example, the selection of input 5 1630 and complementary input 5 1640, the values stored in latch 1620 are carried along paths 1650 and 1660 to the outputs of multiplexer 1610. By holding a value in latch 1620 and selecting the corresponding inputs 1630 and 1640, bit flicker at the outputs of the multiplexer 1610 is eliminated (and at any circuits or wires connected to those outputs).

C. Storage Via a Parallel Distributed Path

In different embodiments, storage elements can be defined at different locations in the routing fabric. FIGS. 17-33 illustrate several examples, though one of ordinary skill in the art will realize that it is, of course, not possible to describe every conceivable combination of components or methodologies for different embodiments of the invention. One of ordinary skill in the art will recognize that many further combinations and permutations of the invention are possible.

Figure 17A:
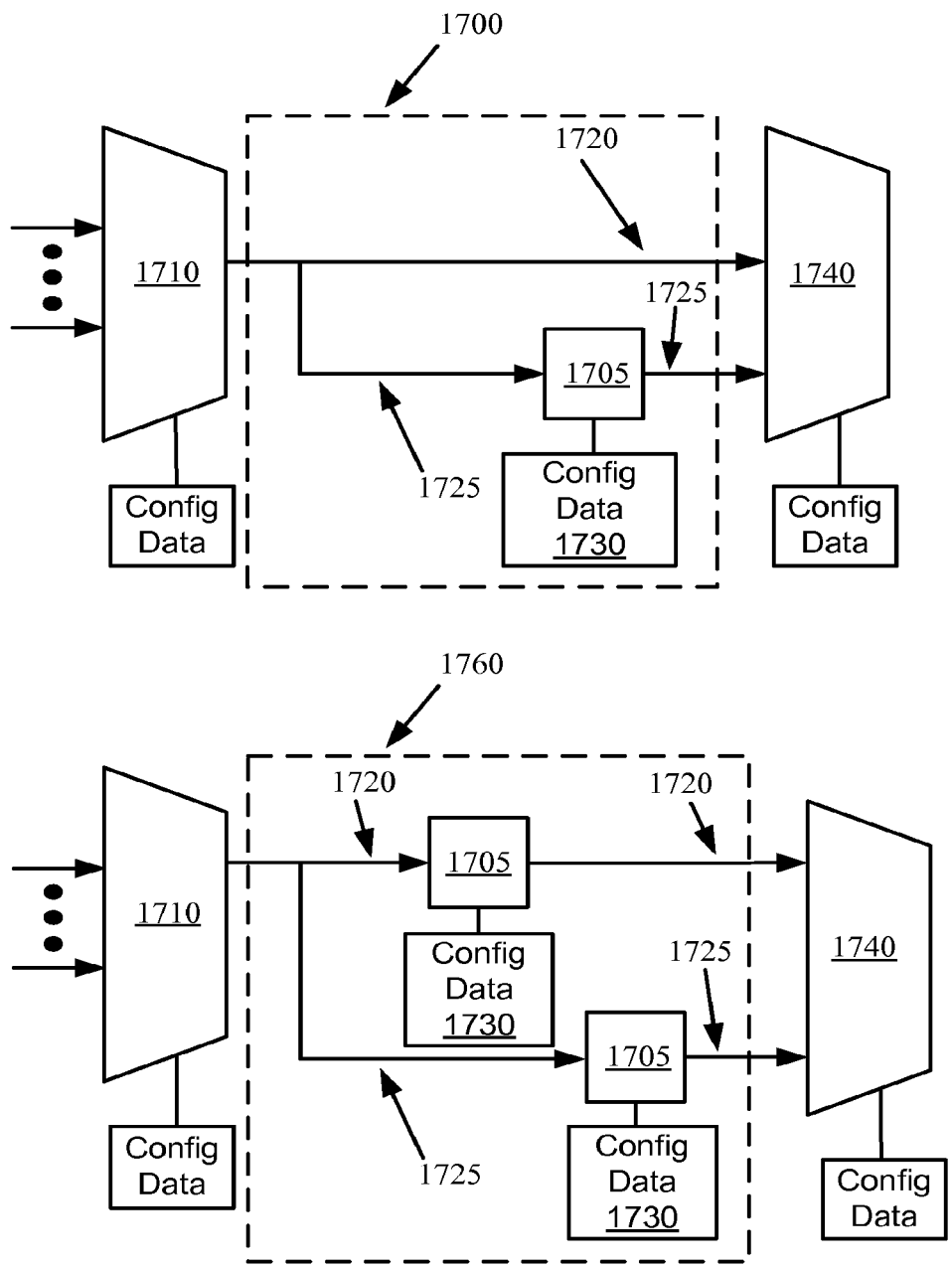
FIG. 17A illustrates a storage circuit with a parallel distributed output path for providing simultaneous routing and storage capability at the interconnect of some embodiments.

FIG. 17A presents one exemplary embodiment of a routing fabric section 1700 that performs routing and storage operations by distributing an output signal of a routing circuit 1710 through a parallel distributed path ("PDP") to a first input of a destination 1740, which in some embodiments might be (1) an input-select circuit for a logic circuit, (2) a routing circuit, or (3) some other type of circuit. The PDP includes a first path and a second path. In some embodiments, the first path 1720 of the PDP directly connects the output of the routing circuit 1710 to the destination 1740 (i.e., the first path 1720 is a direct connection that routes the output of the routing circuit directly to the destination 1740).

In some embodiments, the second parallel path 1725 runs in parallel with the first path 1720 and passes the output of the routing circuit 1710 through a controllable storage element 1705, where the output may be optionally stored (e.g., when the storage element 1705 is enabled) before reaching a second input of the destination 1740. In some embodiments, the connection between the circuit 1710 and storage element 1705 and the connection between the storage element 1705 and the circuit 1740 are direct connections.

FIG. 17A presents another exemplary embodiment of a routing fabric section 1760 that performs routing and storage operations by distributing an output signal of a routing circuit 1710 through a PDP to a first input of a destination 1740. The PDP includes a first path and a second path. In some embodiments, the first path 1720 of the PDP passes the output of the routing circuit 1710 through a controllable storage element 1705, where the output may be optionally stored (e.g. when the storage element 1705 is enabled) before reaching a first input of the destination 1740. In some embodiments, the second path 1725 of the PDP passes the output of the routing circuit 1710 through a second controllable storage element 1705, where the output may be optionally stored (e.g. when the storage element 1705 is enabled) before reaching a second input of the destination 1740. In some embodiments, the connection between the circuit 1710 and storage elements 1705 and the connection between the storage elements 1705 and the circuit 1740 are direct connections.

As mentioned above, a direct connection is established through a combination of one or more wire segments and/or one or more vias. In some of these embodiments, a direct connection might include intervening non-configurable circuits, such as (1) intervening buffer circuits in some embodiments, (2) intervening non-buffer, non-configurable circuits in other embodiments, or (3) a combination of such buffer and non-buffer circuits in yet other embodiments. In some embodiments, one or more of the connections between circuits 1710, 1705 and 1740 are configurable connections.

Because of the second parallel path, the routing circuit 1710 of FIG. 17A is used for only one clock cycle to pass the output into the controllable storage element 1705. Therefore, storage can be provided for during the same clock cycle in which the routing operation occurs. Moreover, the PDP allows the output stage of the routing circuit 1710 to remain free to perform routing operations (or a second storage operation) in subsequent clock cycles while storage occurs.

Figure 17B:
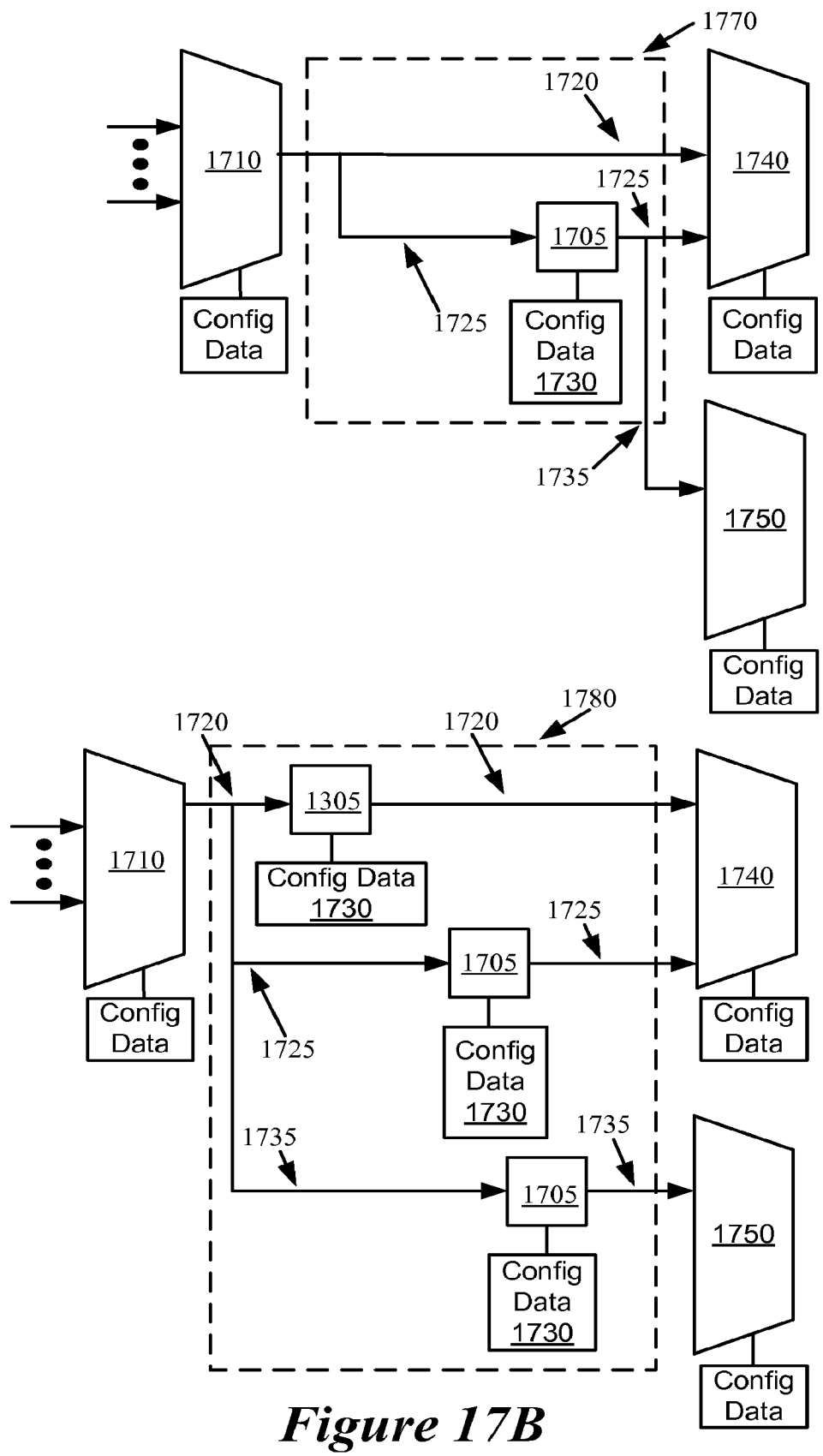
FIG. 17B illustrates a storage circuit with a parallel distributed in which the parallel path is distributed to multiple destinations of some embodiments.

Some embodiments require the second parallel path of a PDP to reach (i.e., connect) to every destination that the first parallel path of the PDP reaches (i.e., connects). Some of these embodiments allow, however, the second parallel path to reach (i.e., to connect) destinations that are not reached (i.e., that are not connected to) by the first parallel path. FIG. 17B illustrates an example of this concept.

In FIG. 17B, within routing fabric 1770, the first path 1720 and the second path 1725 of the PDP connect to the destination 1740. Additionally, the second path 1725 connects (e.g., directly connects in some embodiments while configurably connecting in other embodiments) to an alternate destination 1750. This additional connection to the destination 1750 permits the storage element 1705 within the second path 1725 to provide storage for multiple destination circuits 1740 and 1750 without restricting the functionality of the source circuit 1710 or the multiple destination circuits 1740 and 1750. Moreover, the stored signal can be distributed to multiple destination circuits at different clock cycles without having to re-store the signal or store the signal at a different location. For example, paths 1725 and 1735 of FIG. 17B route the signal within storage element 1705 to destinations 1740 and

1750 at a first clock cycle. During this first clock cycle, destination 1740 may elect to receive the signal while destination 1750 ignores the input from path 1735 until it is ready to process the signal at a second clock cycle. The storage element 1705 can nevertheless continue storing the signal until the second clock cycle at which time the destination 1750 receives the signal.

In FIG. 17B, within routing fabric 1770, the first path 1720 and the second path 1725 of the PDP connect to the destination 1740. Additionally, the third path 1735 connects (e.g., directly connects in some embodiments while configurably connecting in other embodiments) to an alternate destination 1750. The PDP includes a first path, second path, and a third path. In some embodiments, as shown in routing fabric 1780, the first path 1720 of the PDP passes the output of the routing circuit 1710 through a controllable storage element 1705, where the output may be optionally stored (e.g. when the storage element 1705 is enabled) before reaching a first input of the destination 1740. In some embodiments, as shown in routing fabric 1770, the connection between the circuit 1710 and storage element 1705 and the connection between the storage element 1705 and the circuit 1740 are direct connections. In some embodiments, as shown in routing fabric 1780, the second path 1725 also passes the output of the routing circuit 1710 through a controllable storage element 1705, where the output may be optionally stored before reaching a second input of the destination 1740. In some embodiments, the connection between the circuit 1710 and storage element 1705 and the connection between the storage element 1705 and the circuit 1740 are direct connections. In some embodiments, as shown in routing fabric 1780, the third path 1735 passes the output of the routing circuit 1710 through a controllable storage element 1705, where the output may be optionally stored before reaching a first input of the destination 1750. In some embodiments, the connection between the circuit 1710 and storage element 1705 and the connection between the storage element 1705 and the circuit 1740 are direct connections.

The controllable storage elements 1705 of FIGS. 17A and 17B controllably store the value output from the routing circuit 1710. When the storage elements 1705 are enabled (e.g., receives a high enable signal) by the set of configuration data 1730, the storage elements 1705 store the output of the routing circuit 1710. Storage may occur for multiple subsequent clock cycles as determined by the set of configuration data 1730. During storage, alternate output paths of the routing circuit 1710 remain unrestricted, therefore permitting the routing fabric section 1700, 1760, 1770, or 1780 to simultaneously perform routing and storage operations. For instance, at a first clock cycle, the configuration data sets of the circuits 1705 and 1710 cause the routing circuit 1710 to output one of its inputs and cause the storage element 1705 to store this output of the routing circuit 1710. At a second clock cycle, the set of configuration data 1730 can cause the routing circuit 1710 to output another value from the same or different input than the input used in the first clock cycle, while the storage element 1705 continues storing the previous output. The output of the routing circuit 1710 generated during the second clock cycle is then routed to the destination 1740 via the first output path 1720 (which may also include a storage element 1705 in some embodiments).

In some embodiments, the configuration data set 1730 for the storage element 1705 come at least partly from configuration data storage of the IC. In some embodiments (e.g., some embodiments that are not runtime reconfigurable), the configuration data storage stores one configuration data set (e.g., one bit or more than one bit) for all clock cycles. In other embodiments (e.g., embodiments that are runtime reconfigurable and have runtime reconfigurable circuits), the configuration data storage 1730 stores multiple configuration data sets, with each set defining the operation of the storage element during differing clock cycles. These differing clock cycles might be different user design clock cycles, or different sub-cycles of a user design clock cycle or some other clock cycle.

As shown in FIGS. 17A and 17B, the routing operations of the routing circuit 1710 are controlled by configuration data. In some embodiments (e.g., some embodiments that are not runtime reconfigurable), this configuration data is one configuration data set for all clock cycles. However, in other embodiments (e.g., some embodiments that are runtime reconfigurable circuits), the configuration data includes multiple configuration data sets, each set for defining the operation of the routing circuit 1710 during different clock cycles. The different clock cycles might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

Figure 18:
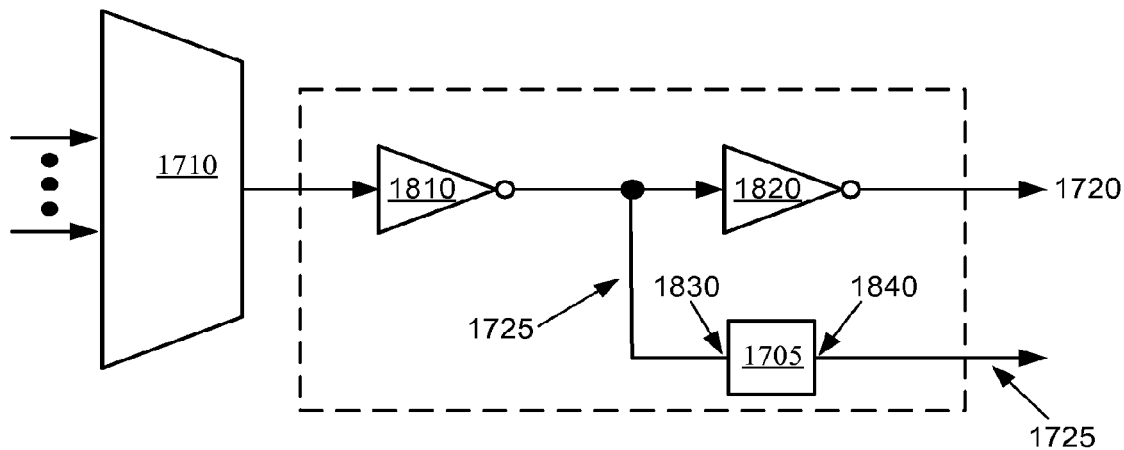
FIG. 18 illustrates a circuit for generating a parallel distributed output path of some embodiments.
Figure 19:
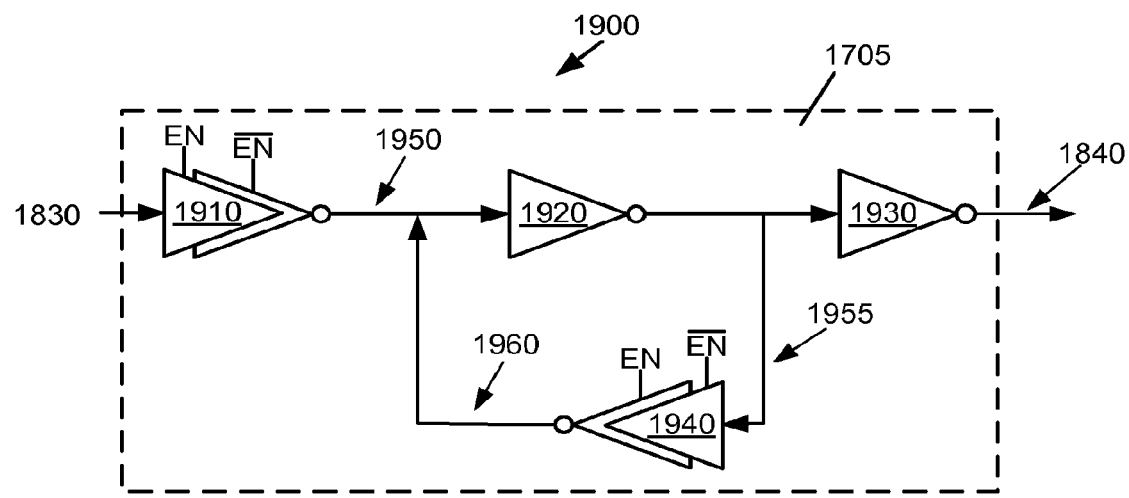
FIG. 19 illustrates a cross-coupling transistor storage element of some embodiments.

FIGS. 18 and 19 present an implementation of the routing fabric section 1700 with the direct connections of the parallel distributed path of some embodiments. As shown in FIG. 14, the parallel distributed output paths 1720 and 1725 from the routing circuit 1710 are generated by first passing the output of the routing circuit 1710 through a series of inverters. In some embodiments, some or all of these inverters 1810 and 1820 are separate from the routing circuit 1710. Alternatively, in some embodiments, some or all these inverters 1810 and 1820 are part of the routing circuit 1710 (e.g., are part of the output stage of the routing circuit 1710).

In FIG. 18, the first path of the parallel distributed output 1720 is generated from the value of the second inverter 1820 which is subsequently routed to a destination. By passing the output of the routing circuit 1710 through a pair of inverters 1810 and 1820, the destination receives the same output value it would have directly received had the output of the routing circuit 1710 been directly routed to the destination. The second path of the parallel distributed output 1725 is generated from the output of the first inverter 1810. In this manner, the storage element 1705 receives the inverted output of the routing circuit 1710.

In some embodiments of the routing fabric section 1700 of FIGS. 17A and 17B, the storage element 1705 may be implemented with any traditional storage element such as flip-flops, registers, latches, etc. However, in conjunction with FIG. 18, some embodiments must couple an inverter to the storage element 1705 to restore the original output value of the routing circuit 1710 when outputting to the destination or other destinations through the second parallel path 1725. In other embodiments of the routing fabric section 1700, instead of using traditional latches for the storage elements, some embodiments implement the storage elements using the CPL cross-coupling transistor implementation of FIG. 11 or alternatively through a CMOS implementation.

Figure 20A:
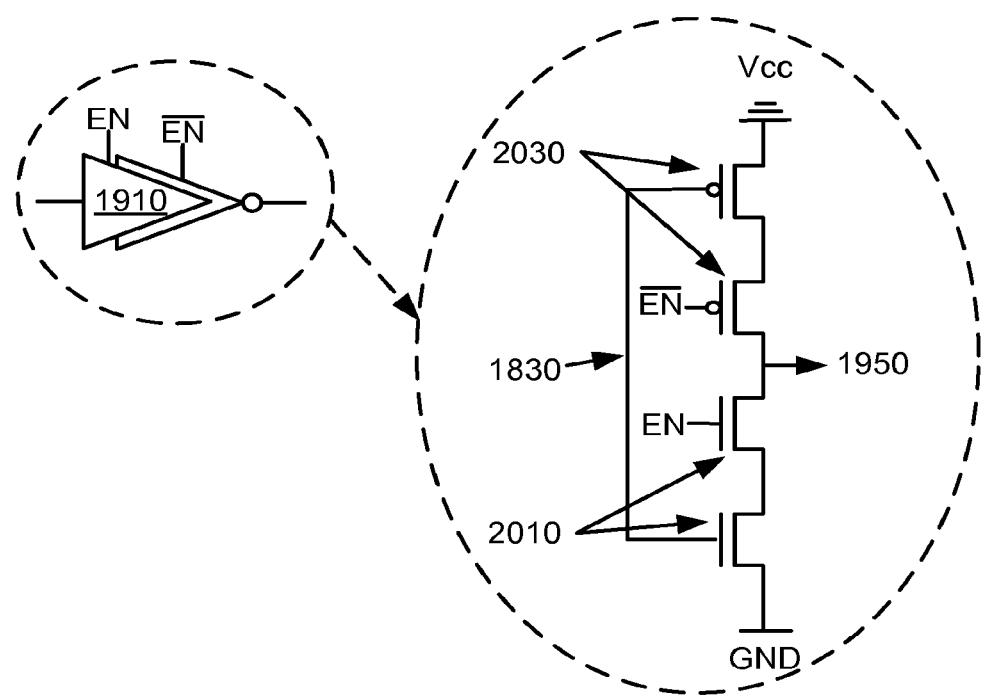
FIG. 20A illustrates a circuit representation for a first tri-state inverter of FIG. 19 of some embodiments.
Figure 20B:
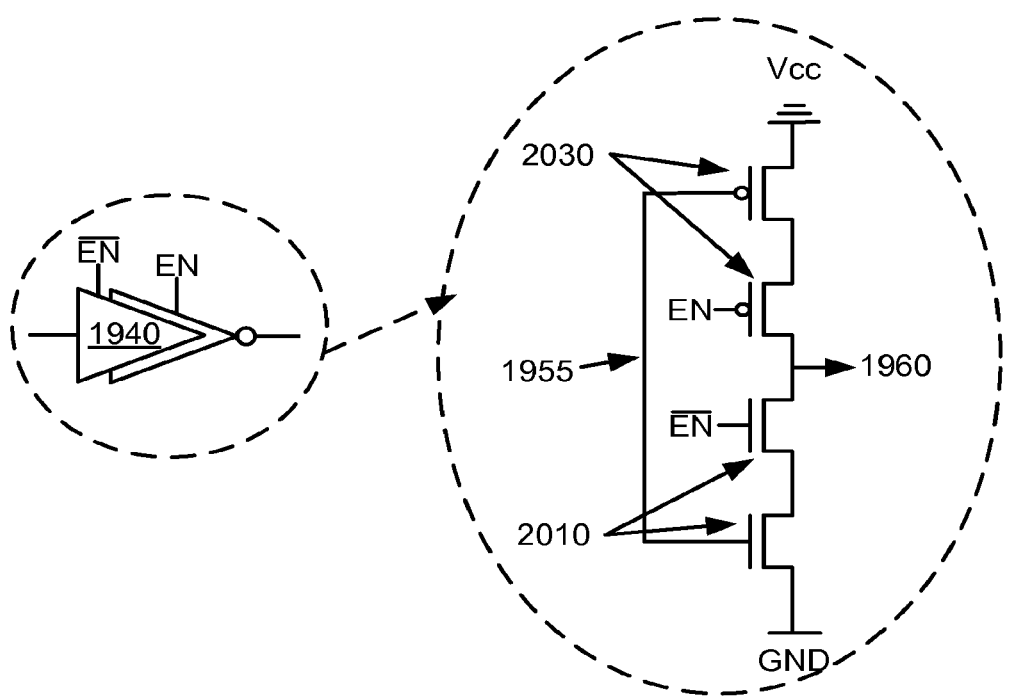
FIG. 20B illustrates a circuit representation for a second tri-state inverter of FIG. 19 of some embodiments.

FIGS. 19 and 20 illustrate one such CMOS implementation of the storage element 1705 of FIG. 18. The storage element 1900 receives as its input the signal 1830 passing through the directly connected parallel path 1725 with a source component and outputs the signal 1840 to the second path directly connected to a destination component. The storage element 1705 includes a pair of CMOS inverters 1920 and 1930 and a pair of tri-state inverters 1910 and 1940, which, as further described below by reference to FIGS. 20A and 20B, are controlled by an enable signal and its complement.

Inverters 1910, 1920, and 1930 are connected in series. When the enable signal is high, the series of inverters 1910, 1920, and 1930 pass through and invert the input from the parallel path 1725 after the input has passed through the inverter 1810 above. Upon output at the third inverter 1930, the original value of the multiplexer 1710 will have been restored. As shown in FIG. 17A, this restored original value will be passed from the storage element 1705 and will continue along the second parallel path 1725 until reaching destination 1740 or the multiple destinations 1740 and 1750 of FIG. 17B.

If the enable signal to the first tri-state inverter 1910 is low, the first tri-state inverter 1910 does not pass through and invert the signal coming in from the second parallel path 1725. Instead, the first tri-state inverter 1910 acts to isolate the storage element 1900 from the signal. FIG. 20A illustrates an example of a circuit implementation for the first tri-state inverter 1910. The tri-state inverter 1910 includes two NMOS transistors 2010, one which receives the input 1830 and one which receives the enable signal. The tri-state inverter further includes two PMOS transistors 2030, one which receives the input 1830 and the other which receives the complement of the enable signal. In FIG. 20A, the tri-state inverter 1910 inverts the input 1830 when the enable signal is high and acts as an open circuit (e.g., open switch) when the enable signal is low.

FIG. 20B illustrates an example of a circuit implementation for the second tri-state inverter 1940. Unlike the first tri-state inverter 1910, the second tri-state inverter 1940 is activated by a low enable signal. By swapping the enable signal and the complement to the enable signal, the second tri-state inverter 1940 has the opposite functionality to that of the first tri-state inverter 1910. Therefore, the second tri-state inverter 1940 acts as an open switch when the enable is high and acts as an inverter that sets up an inverting feedback path between the output 1960 and input 1955 of the inverter 1940 when the enable is low.

Moreover, because the inverter 1910 is not propagating the signal 1725 when the signal is low, this coupling of inverters 1920 and 1940 creates a feedback path that stores a value within the circuit 1900 so long as the enable signal remains low. During this time, the third inverter 1930 will receive its input from the feedback path. Therefore, while the enable signal is low, the circuit 1900 will output at 1840 the value stored within the feedback path to destination 1740 via the second parallel path 1725.

Re-assertion of the enable signal (e.g., enable is high) stops the inverter 1940 from propagating the stored signal, effectively removing the feedback path which causes the circuit 1900 to stop storing a value. Instead, a new value is input into the storage element 1900 via the first inverter 1910 which resumes signal propagation.

D. Storage Via a Feedback Path Connected in Series

In some embodiments, the routing fabric provides storage through storage elements located within a feedback path and/or at the output stage of routing circuits. For a particular routing circuit that connects a particular source circuit to a particular destination circuit, the output of the particular routing circuit's storage element connects to an input of the destination circuit. When enabled, this storage holds the output of the source circuit for a particular duration (e.g., for one or more clock cycles). Typically, such a storage element is used to store data for a relatively small amount of time as its storage operation prevents the routing circuit from performing its routing operation. Accordingly, at times, this storage element is referred to below as a short-term storage element.

In addition to placing a short-term storage element at the output stage of a routing circuit, some embodiments place a "long-term" storage element in a feedback path between an output and input of the routing circuit. Such a storage element is referred to as a long-term storage element as it can be used to store data for a time duration that can be relatively long as the storage element does not disable the routing circuit's routing operation. In other words, the placement of the storage element in a feedback path of the routing circuit allows the routing circuit to continue performing its routing operations even when the storage element stores data. Moreover, by implementing the long term storage within a feedback circuit, overall wire congestion needed for storage within the routing fabric is reduced as only a single input is required at the destination to route an output signal or a previously stored signal.

Figure 21:
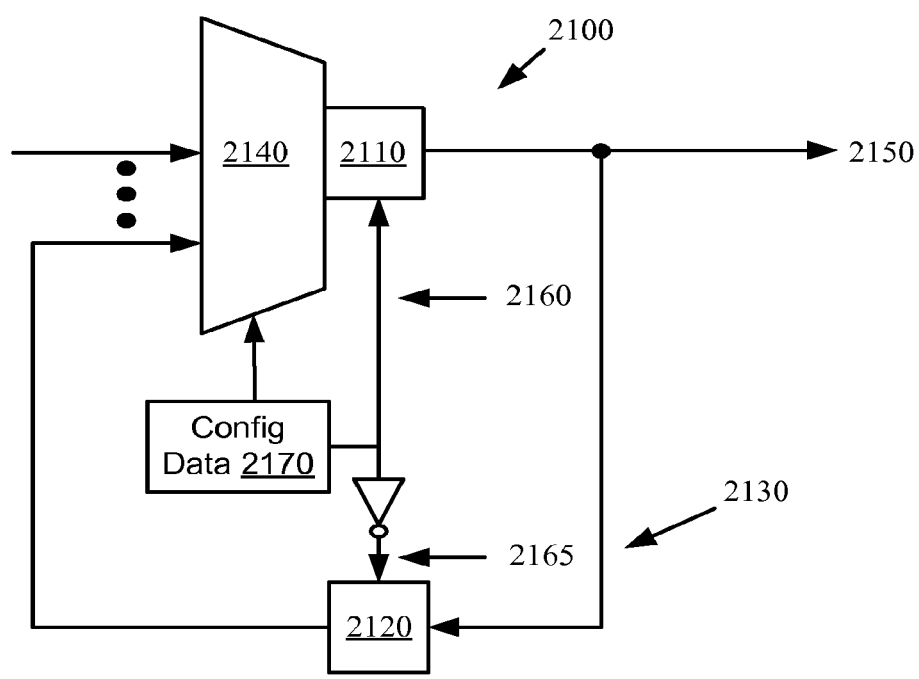
FIG. 21 illustrates a storage element within the routing fabric with a feedback path connected in series to the output of a routing circuit of some embodiments.

FIG. 21 illustrates an example of short and long term storage elements. The routing fabric section 2100 includes the short term configurable storage element 2110 at the output stage of a source component 2140. The source 2140 is illustrated in FIG. 21 as an interconnect circuit (e.g., a routing multiplexer or other routing circuit), though it should be apparent to one of ordinary skill in the art that the source 2140 may include any configurable IC component which receives or distributes signals throughout the routing fabric. The second configurable storage element, referred to as the long term storage, is implemented via the feedback path 2130 which is connected in series to the short term storage section 2110.

In some embodiments, the short term storage section 2110 operates in a manner similar to those described with respect to FIGS. 10 and 11. The short term storage 2110 receives an enable signal 2160. When the enable signal 2160 is inactive, the circuit simply distributes the current output to the destination 2150 and the feedback path 2130. In some embodiments, the connection from the short term storage 2110 to the destination 2150 is a direct connection. When the enable signal 2160 is active, the circuit acts as a latch that stores the current value and continually outputs that value so long as the enable signal 2160 remains active.

However, continued use of the short term storage 2110 causes the routing fabric section 2100 to perform only storage operations and therefore restricts the routing functionality of the routing fabric section 2100. For example, storing a value within the short term storage 2110 for three clock cycles prevents the routing circuit 2140 of the routing fabric section 2100 from performing routing operations for the later two of the three clock cycles. Therefore, a second storage section 2120 is used for long term storage when storing a value for two or more subsequent clock cycles.

The long term storage is implemented via the feedback path 2130 that is directly connected to the output of the short term storage element 2110. The feedback path 2130 routes the output of the routing circuit 2140 through the controllable storage element 2120 which may store the output before returning the output to the routing circuit 2140 through a second direct connection. The feedback path 2130 receives its input from the output of the short term storage 2110 which is directly distributed to the destination 2150 at the same time that the output passes through the feedback path 2130. By distributing the output of the routing circuit 2140 through the feedback path 2130 which reenters the routing circuit 2140, the storage element 2120 within the feedback path 2130 may store the output value for several clock cycles without impeding the routing functionality of the routing fabric section

2100. The feedback path therefore clears the routing path while simultaneously providing storage during subsequent clock cycles.

As mentioned above, a direct connection is established through a combination of one or more wire segments and/or one or more vias. In some of these embodiments, a direct connection might include intervening non-configurable circuits, such as (1) intervening buffer circuits in some embodiments, (2) intervening non-buffer, non-configurable circuits in other embodiments, or (3) a combination of such buffer and non-buffer circuits in yet other embodiments. In some embodiments, the feedback path 2130 includes a configurable connection (e.g., include a configurable connection between the long term storage 2120 and the input of the circuit 2140).

In some embodiments, one configuration data set controls both the short term storage 2110 and the long term storage 2120 during each clock cycle (e.g., user-design clock cycle or sub-cycle). Accordingly, in these embodiments, the long term storage 2120 stores the output value only when the short term storage 2110 is not storing and vice versa. For instance, positive logic might enable the short term storage 2110 while negative logic might enable the long term storage 2120. By using one configuration data set 2170 and its complement value, the total number of configuration data needed to implement the storage elements of the routing fabric section is reduced. Moreover, it should be apparent to one of ordinary skill in the art that the configuration data set 2170 of some embodiments include different sets of configuration data to control each storage element 2110 and 2120 (i.e., the configuration data need not be shared between the storage elements 2110 and 2120). In some such embodiments, the short and long term storage elements would not have to be operated in a complementary manner in each cycle (i.e., one storage element does not have to store a value during one cycle while the other storage element is transparent during that cycle, as both storage elements can be transparent or storing during any cycle).

In some embodiments, the configuration data set that control the short 2110 and long 2120 term storage elements come at least partly from configuration data storage of the IC. In some embodiments (e.g., some embodiments that are not runtime reconfigurable), the configuration data storage stores one configuration data set (e.g., one bit or more than one bit) for all clock cycles. In other embodiments (e.g., some embodiments that are runtime reconfigurable and have runtime reconfigurable circuits), the configuration data storage stores multiple configuration data sets, with each set defining the operation of the storage elements 2110 and 2120 during a different clock cycle. The different clock cycles might be different user design clock cycles, or different sub-cycles of a user design clock cycle or some other clock cycle.

As shown in FIG. 21, the routing operations of the routing circuit 2140 are controlled by configuration data. In some embodiments (e.g., some embodiments that are not runtime reconfigurable), this configuration data is one configuration data set for all clock cycles. However, in other embodiments (e.g., some embodiments that are runtime reconfigurable circuits), the configuration data includes multiple configuration data sets, each set for defining the operation of the routing circuit 2140 during different clock cycles. The different clock cycles might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

In the discussion below, multiple other embodiments (such as those illustrated in FIGS. 24, 28-31, and 33) are described which illustrate two storage elements that are controlled from the same set of configuration data. Like the embodiment illustrated in FIG. 21, these other embodiments do not need to use one set of configuration data for a pair of storage elements. Also, like the embodiment illustrated in FIG. 21, the configuration data sets can include one or more bits for all cycles, or can include different bits for different clock cycles (e.g., different configuration data sets for embodiments that are runtime reconfigurable and have runtime reconfigurable circuits).

Figure 22:
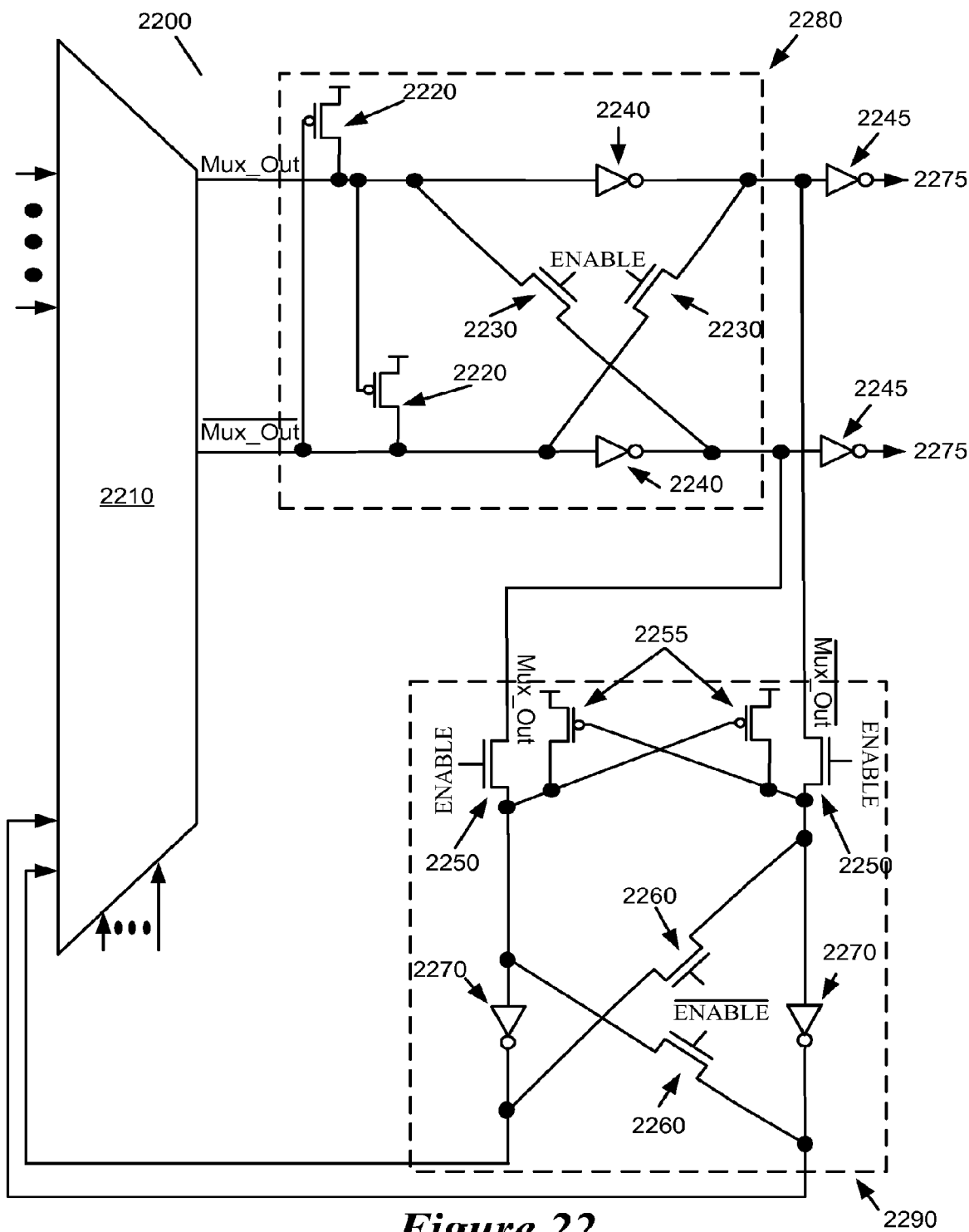
FIG. 22 illustrates an embodiment for the circuit of FIG. 21 of some embodiments.

FIG. 22 presents an embodiment for implementing the storage functionality of the routing fabric section 2100 of FIG. 21. As shown in this figure, the circuit 2200 includes (1) a multiplexer 2210, (2) a first pair of pull-up PMOS transistors 2220, (3) a first pair of cross-coupling transistors 2230, (4) a first pair of inverting output buffers 2240, (5) an output pair of inverting output buffers 2245, (6) a pair of NMOS pass gate transistors 2250, (7) a second pair of pull-up PMOS transistors 2255, (8) a second pair of cross-coupling transistors 2260, and (9) a second pair of inverting output buffer 2270.

The sections 2280 and 22890 implement the short term storage and long term storage elements of FIG. 21 using CPL implementation similar to the one discussed with respect to FIG. 11. The short term storage element 2110 of FIG. 21 is implemented via the first pair of pull-up PMOS transistors 2220, the first pair of cross-coupling transistors 2230, and the first pair of inverting output buffers 2240.

In some embodiments, the multiplexer 2210 is implemented in accordance with circuit representation of FIG. 11 while omitting the set of cross-coupled transistors 1145 and 1150 that provide storage at the output stage as well as the level restoring transistors 1125 and 1130. The multiplexer 2210 of such embodiments is formed by the four stages 1105, 1110, 1115, and 1120 of FIG. 11. In such embodiments, the pull-up PMOS transistors 1820 are similar to the pull-up transistors 1125 and 1130, as they are placed after stage 1120 of FIG. 11 and act as level restorers to quickly restore degraded high levels from the multiplexer 2210 passing into the short term storage element 2280 and to prevent leakage in the inverters 2240.

In some embodiments, the multiplexer 2210 internally includes the level restoring transistors 2220 to restore the output signal before passing the values across the wire segments of the routing fabric. In other embodiments, the multiplexer 2210 internally includes the PMOS transistors 2220, cross-coupled transistors 2230, and inverting buffers 2240, like the multiplexer 1100 which internally includes the level restorers 1125 and 1130, cross-coupled transistors 1145 and 1150, and inverting buffers 1135 and 1140 of FIG. 11.

Figure 23:
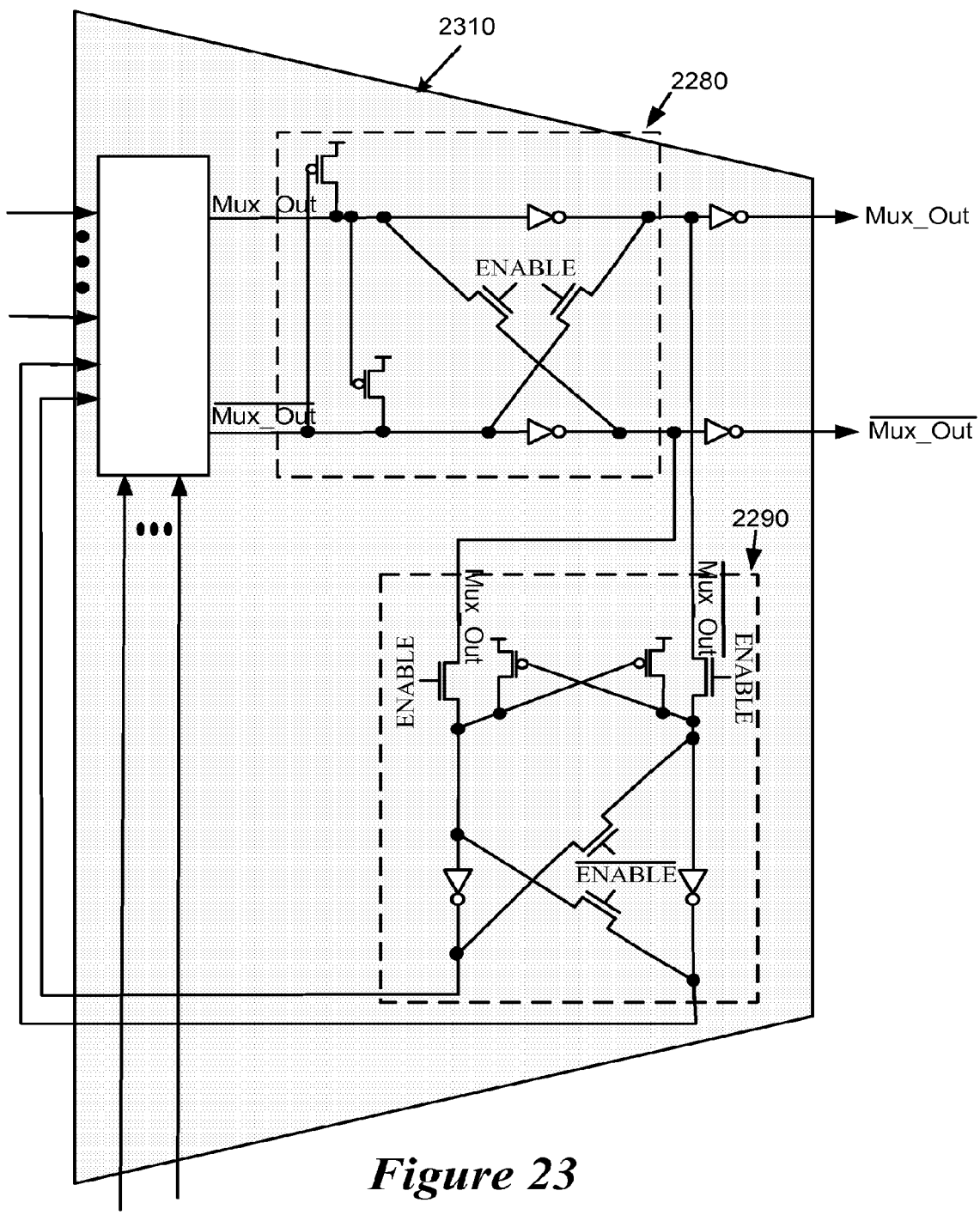
FIG. 23 presents an alternative placement for the storage element of the storage circuit of FIG. 22 of some embodiments.

The long term storage element 2290 of some of these embodiments remains separate from the multiplexer 2210, while this storage element 2290 is part of the multiplexer 2210 in other embodiments, as illustrated in FIG. 23. Specifically, FIG. 23 illustrates both the short and long term storages 2280 and 2290 as part of the internal multiplexer structure 2310.

The first pair of PMOS transistors 2220 receives the output of the routing circuit 2210 and its complementary value. As discussed above, the PMOS transistors 2220 regenerate the voltage levels that may have been degenerated by passing through the NMOS transistors at the output stage of the multiplexer 2210 which results in a threshold drops. A low voltage on the complementary output of Mux_Out turns on the pull-up transistor 2220 connected to the non-complementary Mux_Out, which in turn, accelerates the pull-up of the non-complementary Mux_Out and drives those values to the positive rail. After passing through the pull-up transistors 2220, the outputs continue through the first pair of inverting output buffers 2240, but also through the output pair of inverting buffers 2245 which restore the output of the multiplexer to its original value.

When the enable bit is active (e.g., high in this example), the short term storage section 2280 will act as a latch storing a value. The active enable bit will cause the output inverters 2240 and the pair of cross-coupling transistors 2230 to operate forming a pair of cross-coupling inverters that hold and output the signal propagating through the short term storage section 2280 prior to the enable bit becoming active. The cross-coupling transistors 2230 cross-couple the output of each inverter buffer 2240 to the input of the other buffer. This cross-coupling causes the inverting buffers 2240 to hold the value at the outputs 2275 right before the enable signal went active.

Similar to the implementation of FIG. 21, the same enable bit controlling the short term storage section 2280 also controls the long term storage section 2290. The long term storage 2290 and short term storage sections 2280 are comprised of the same components, namely a pair of pass gate transistors 2250, a second pair of pull-up PMOS transistors 2255, a pair of cross-coupling transistors 2260, and a pair of inverting buffers 2270. One difference is that the long term storage section 2290 receives its complementary set of inputs from the complementary set of outputs of the short term storage 2280. Another difference is that the long term storage section 2290 routes its complimentary set of outputs back into the multiplexer 2210 as opposed to routing the outputs to some other destination 2275. As described above, by routing the outputs of the long term storage 2290 back into the multiplexer 2210, a feedback path is created whereby a value may be stored for multiple clock cycles without impeding the routing operations of the routing fabric section 2200.

Another difference is that the positive logic of the enable bit causes the short term storage 2280 to perform storage operations while the negative logic of the enable bit causes the long term storage 2290 to perform storage operations (e.g., when the enable signal is low, the output of the multiplexer 2210, to destination 2275, which goes through the short term storage element 2250 the long term storage latches the signal at the output of the short term storage element 2250. Therefore, when the long term storage 2290 is performing storage operations, the path through the short term storage 2280 remains clear for performing routing operations.

It will be evident to one of ordinary skill in the art that the various components and functionality of FIGS. 23 and 22 may be implemented differently without diverging from the essence of the invention. For example, the cross-coupling storage elements 2280 and 2290 may be replaced to include traditional D flip-flops.

E. Storage Via a Feedback Path Connected in Parallel

Figure 24:
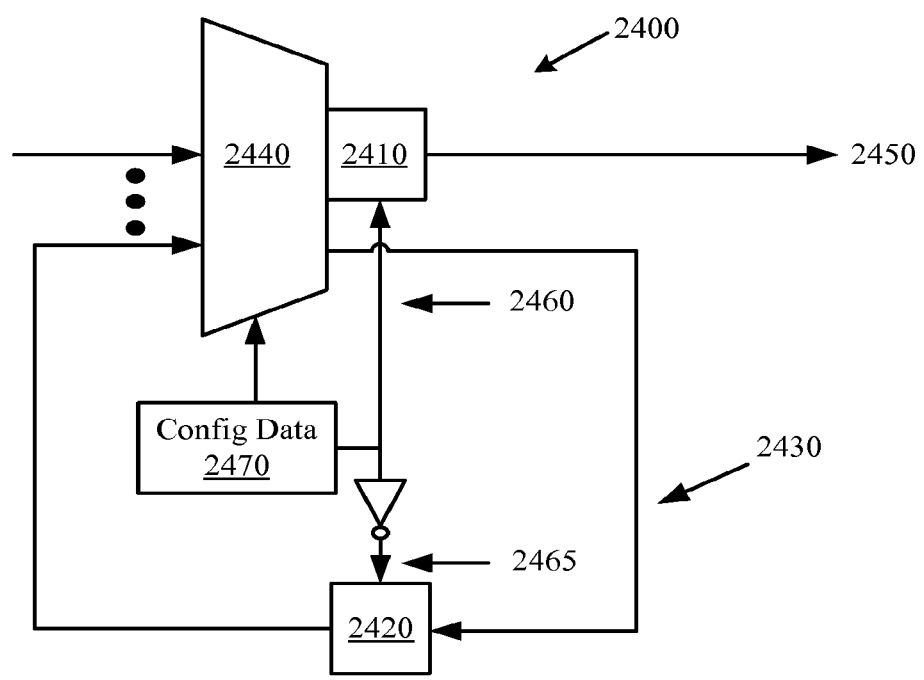
FIG. 24 illustrates a storage element within the routing fabric with a feedback path connected in parallel to the output of a routing circuit of some embodiments.

An alternative implementation of the routing fabric section of FIG. 21 is the routing fabric section of FIG. 24. Similar to FIG. 21, FIG. 24 presents an implementation of a routing fabric section 2400 in which a short term storage section 2410 is connected to the output stage of a routing circuit 2440 and a long term storage section is in a feedback path 2430 between the output and input of the routing circuit 2440. The storage elements 2410 and 2420 are configurably controlled by the set of configuration data 2470. In some embodiments, the storage elements 2410 and 2420 share the same set of configuration data 2470, while in some other embodiments the storage elements 2410 and 2420 are controlled by different sets of configuration data.

The difference between the routing fabric section 2400 and the routing fabric section 2100 is that the input to the feedback path 2430 does not pass through the short term storage section 2410. Rather, the feedback path 2430 is instead connected in parallel to the first output path of the routing circuit 2440. The output of the routing circuit 2440 is therefore distributed via two paths. This alternative approach allows for greater usage flexibility in the design of the routing fabric while also providing short and long term storage without the need to pass through multiple storage elements. Therefore, storage can be achieved in a single clock operation.

In some embodiments of FIG. 24, the first output path of the routing circuit 2440 directly connects to and passes through the short term storage section 2410 en route to destination 2450. The second path includes a pair of direct connections. A first direct connection connects the output of the routing circuit 2440 to the input of the storage element 2420. A second direct connection connects the output of the storage element 2420 back into the input of the routing circuit 2440. In this manner, the direct connections of the second path create the feedback path 2430 which returns the value of the routing circuit 2440 back into the routing circuit 2440 without traversing the short term storage section 2410.

As mentioned above, a direct connection is established through a combination of one or more wire segments and/or one or more vias. In some of these embodiments, a direct connection might include intervening non-configurable circuits, such as (1) intervening buffer circuits in some embodiments, (2) intervening non-buffer, non-configurable circuits in other embodiments, or (3) a combination of such buffer and non-buffer circuits in yet other embodiments. In some embodiments, the feedback path 2430 includes a configurable connection (e.g., include configurable connection between the long term storage 2420 and the input of the circuit 2440).

Figure 25:
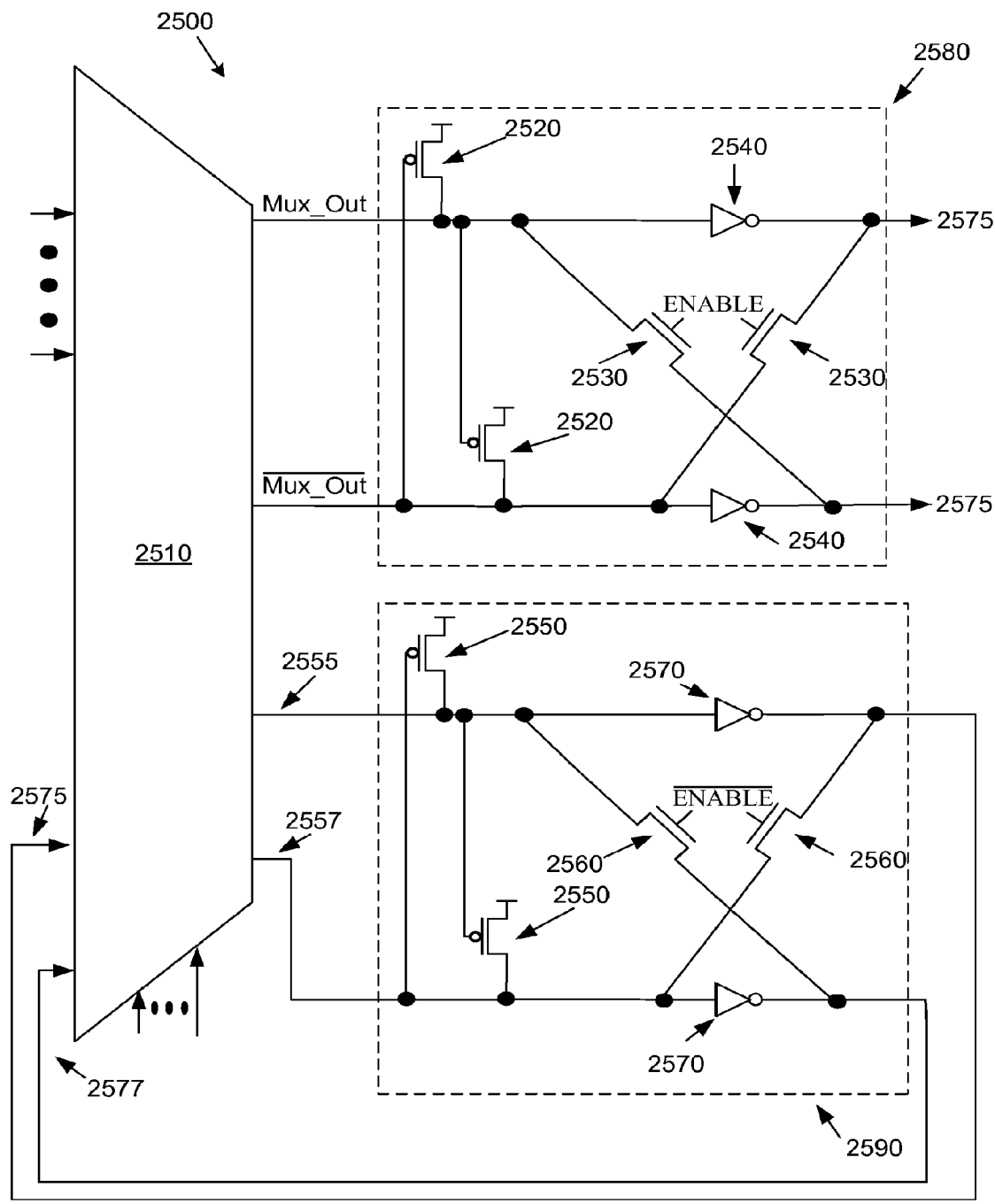
FIG. 25 illustrates an embodiment for the circuit of FIG. 24 of some embodiments.

FIG. 25 presents an illustrative implementation of the routing fabric section of FIG. 24. Similar to FIG. 22 above, FIG. 25 is a CPL implementation of FIG. 24 including (1) a multiplexer 2510, (2) a first pair of pull-up PMOS transistors 2520, (3) a first pair of cross-coupling transistors 2530, (4) a first pair of inverting output buffers 2540, (5) a second pair of pull-up PMOS transistors 2550, (6) a second pair of cross-coupling transistors 2560, (7) a second pair of inverting output buffer 2570, and (8) a configuration data bit set (e.g., ENABLE and the complement of ENABLE) for controlling the cross-coupled transistors 2530 and 2560.

The short term storage section 2580 includes the first pair of pull-up PMOS 2520, the first pair of cross-coupling transistors 2530, and the first pair of inverting output buffers 2540. The first pair of PMOS transistors 2520 receives the output of the multiplexer 2510 and its complementary value. The PMOS transistors 2520 regenerate the voltage levels that may have been degenerated by passing through NMOS threshold drops at the output stage of the multiplexer 2510. A low voltage on the complementary output of Mux_Out turns on the pull-up transistor 2520 connected to the non-complementary Mux_Out, which, in turn, accelerates the pull-up of the non-complementary Mux_Out. After passing through the pull-up transistors 2520, the outputs will continue through the first pair of inverting output buffers 2540, before being output at terminals 2575.

When the enable bit (e.g., configuration data set) is active, the short term storage section 2580 will act as a latch storing a value. The active enable bit will cause the output inverters 2540 and the pair of cross-coupling transistors 2530 to operate forming a pair of cross-coupling inverters that hold and output the signal propagating through the short term storage section 2580 prior to the enable bit becoming active. The cross-coupling transistors 2530 cross-couple the output of each inverter buffer 2540 to the input of the other buffer. This cross-coupling causes the inverting buffers 2540 to hold the value at the outputs 2575 right before the enable signal went active.

The long term storage section 2590 is connected in parallel to the short-term storage 2580. The parallel connection of the long term storage 2590 requires the multiplexer 2510 to provide a parallel set of outputs. As illustrated in FIG. 25, the multiplexer 2510 outputs Mux_Out and its complement to the short term output 2580. Additionally, multiplexer 2510 outputs a parallel set of complementary outputs that are provided along the wire segments 2555 and 2557.

Figure 26:
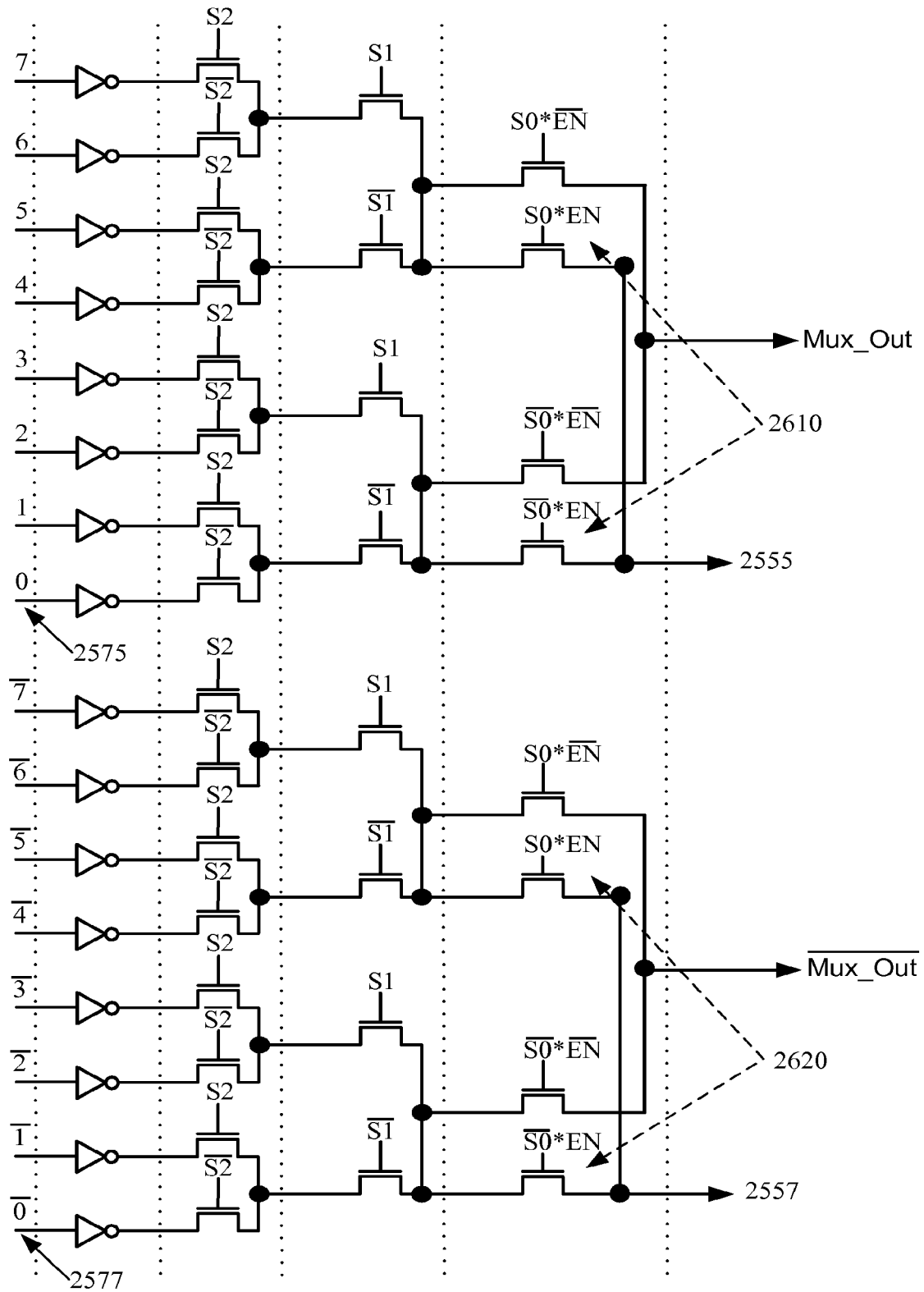
FIG. 26 present a circuit representation for a multiplexer including a parallel set of complementary outputs of some embodiments.

FIG. 26 illustrates one implementation for the multiplexer 2510 of FIG. 25, which generates parallel complementary set of outputs. This multiplexer is similar to the first four stages 1105, 1110, 1115, and 1120 of multiplexer 1110 except that in FIG. 26, the parallel complementary outputs 2555 and 2557 are generated by introducing two additional pairs of NMOS pass gate transistors 2610 and 2620 which are activated using the select bit S0 in conjunction with the EN signal. The outputs 2555 and 2557 are then passed into the long term storage section 2590 which includes the same components as the short term storage section 2580.

Moreover, the long term storage 2590 performs storage operations by using the complementary value of the enable signal described above with reference to the short term storage 2580. Therefore, when the short term storage 2580 is inactive and acts only to propagate the complementary set of outputs of the multiplexer 2510, the long term storage is enabled and stores a parallel set of complementary outputs of the multiplexer 2510 using the second pair of cross-coupling transistors 2560. By routing the outputs of the long term storage 2590 back into the routing circuit 2510, a feedback path is created whereby a value may be stored for multiple clock cycles without impeding the routing operations of the routing circuit 2510. After passing through the controllable storage element in the feedback path, the signals are re-routed back into the inputs 2575 and 2577 of multiplexer 2510.

In some embodiments, the configuration data controlling the short 2580 and long 2590 term storage elements come at least partly from configuration data storage of the IC. In some embodiments (e.g., embodiments that are not runtime reconfigurable), the configuration data storage stores one configuration data set for all clock cycles. In other embodiments (e.g., embodiments that are runtime reconfigurable), the configuration data storage stores multiple configuration data sets, with each set defining the operation of the storage elements 2580 and 2590 during different clock cycles. The different clock cycles might be different user design clock cycles, or different sub-cycles of a user design clock cycle or some other clock cycle.

As shown in FIG. 25, the routing operations of the routing circuit 2510 are controlled by configuration data. In some embodiments (e.g., some embodiments that are not runtime reconfigurable), this configuration data is one configuration data set for all clock cycles. However, in other embodiments (e.g., some embodiments that are runtime reconfigurable circuits), the configuration data includes multiple configuration data sets, each set for defining the operation of the routing circuit 2510 during different clock cycles. The different clock cycles might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

In some embodiments, the multiplexer 2510 not only includes the circuits illustrated in FIG. 26, but also internally includes the level restorers 2520 to restore the output signal before passing the values across the wire segments of the routing fabric. In other embodiments, the multiplexer 2510 internally includes the PMOS transistors 2520, cross-coupled transistors 2530, and inverting buffers 2540, like the multiplexer 1100 which internally includes the level restorers 1125 and 1130, cross-coupled transistors 1145 and 1150, and inverting buffers 1135 and 1140 of FIG. 11.

Figure 27:
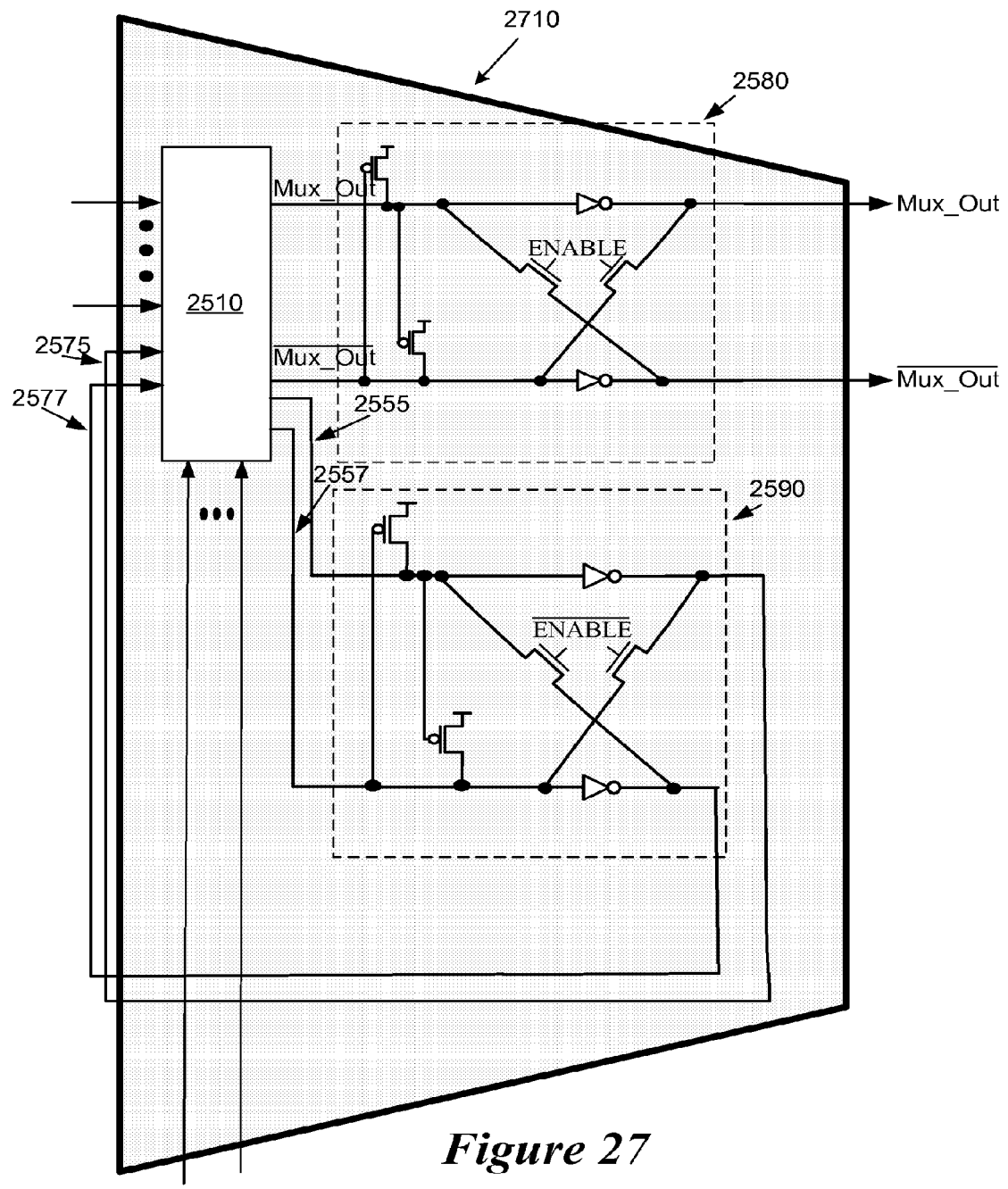
FIG. 27 presents an alternative placement for the storage element of the storage circuit of FIG. 25 of some embodiments.

The long term storage element 2590 of some of these embodiments remains separate from the multiplexer 2510, while this storage element 2590 is part of the multiplexer 2510 in other embodiments, as illustrated in FIG. 27. Specifically, FIG. 27 illustrates both the short and long term storages 2580 and 2590 as part of the internal multiplexer structure 2710. It will be evident to one of ordinary skill in the art that the various components and functionality of FIGS. 27 and 25 may be implemented differently without diverging from the essence of the invention.

Figure 28A:
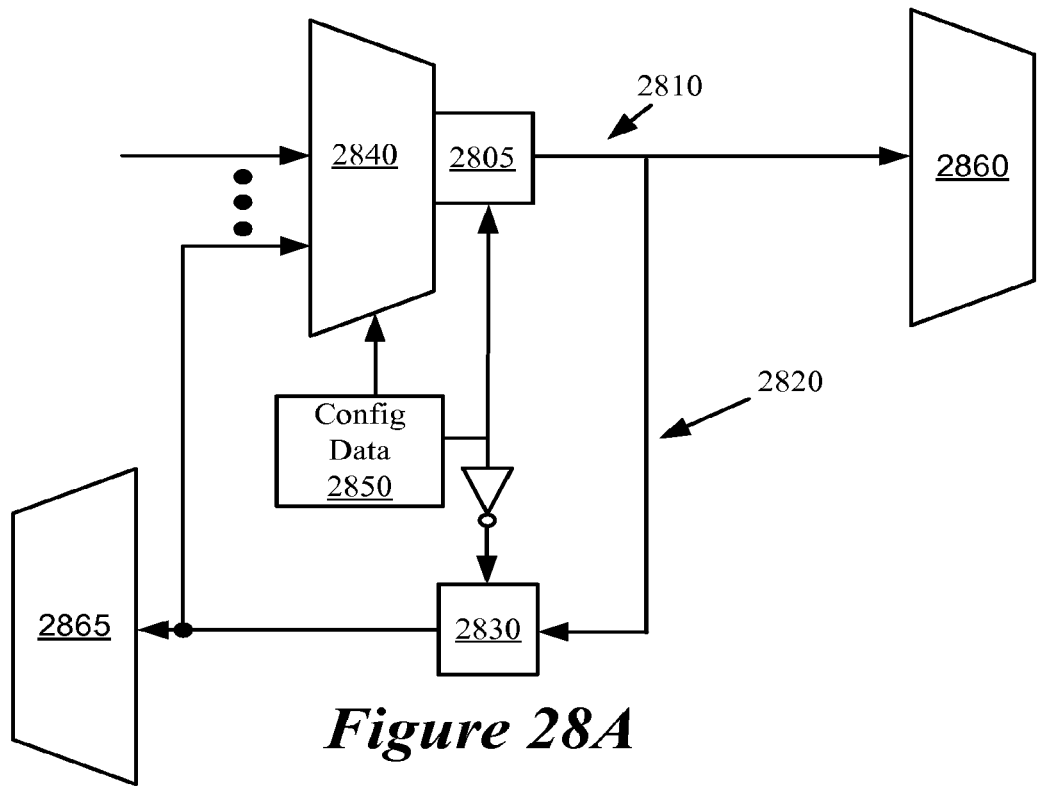
FIG. 28A illustrates a storage element within the routing fabric with a feedback path connected in series to the output of a routing circuit of some embodiments.

FIG. 28A presents an alternative embodiment to FIG. 21 in which the output of the multiplexer 2840 is passed to a short term storage element 2805 before passing to the destination 2860 and the feedback loop 2420 where the output may alternatively appear at a destination 2865. In this manner, the output from multiplexer 2840 can be stored in one section of the routing fabric (e.g. storage element 2830) and appear at a destination 2865 along a different portion of the routing fabric. In some embodiments, the connections between the storage element 2805 and the destination 2860, between the storage element 2805 and the storage element 2830, and between the storage element 2830 and the destination 2865 are direct connections. However, in some embodiments, some of the connections are configurable connections (e.g., the connection between storage element 2830 and destination 2865 might be configurable).

Moreover, because the embodiment of FIG. 28A does not include the parallel distributed path of FIGS. 17A and 17B, this embodiment is no longer restricted to routing the same signal along multiple paths. For example, in FIG. 17B, when the source circuit 1710 routes a signal to destination 1740 along wire segment 1720, the parallel distributed path would require the signal to similarly pass through wire segments 1725. Using some embodiments of FIG. 28A, a signal passes from source circuit 2840 to destination 2860 without having to pass an additional signal from the feedback loop back to destination 2860. Rather, in these embodiments the signal may pass to the destination 2860 along one path and an alternate destination 2865 along another (e.g., where the alternate path includes the feedback path 2820).

Figure 28B:
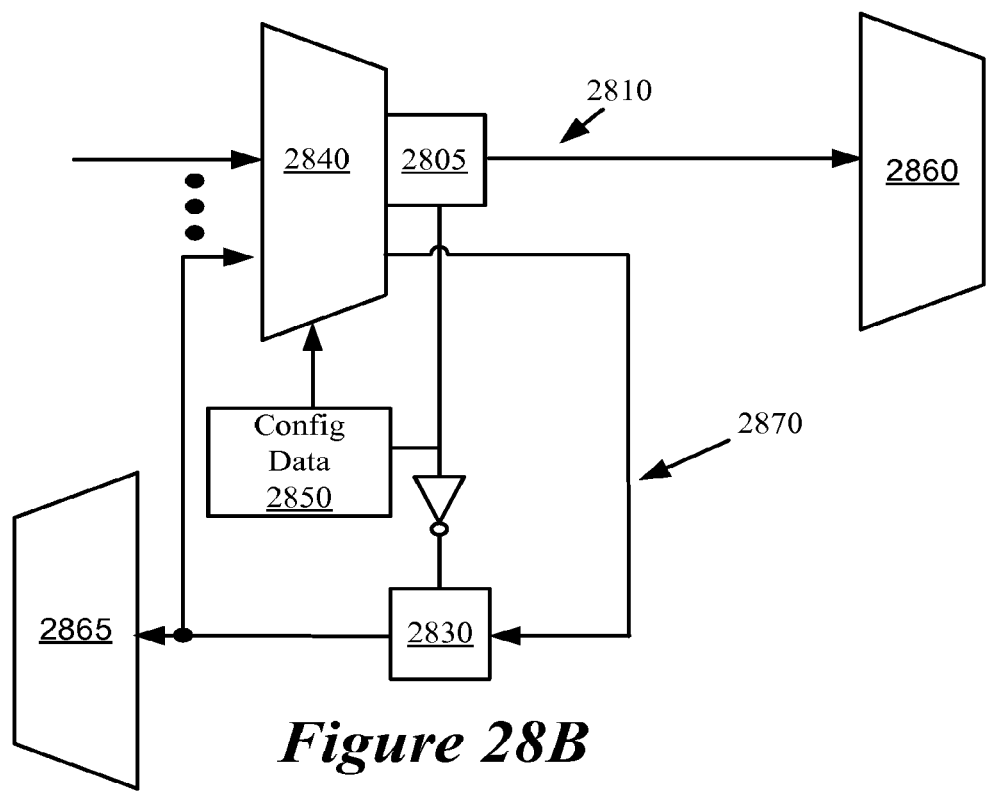
FIG. 28B illustrates a storage element within the routing fabric with a feedback path connected in parallel to the output of a routing circuit of some embodiments.

FIG. 28B presents still another embodiment of the routing fabric section 2400 of FIG. 24. In this figure, a first parallel output path of multiplexer 2840 is routed to a first destination 2860. The second parallel output path 2870 of multiplexer 2840 is routed through the feedback path 2870 back into the multiplexer 2840 and alternatively to a second destination 2865. In this manner, multiple destinations 2860 and 2865 can receive a stored value of a single source 2840. Moreover, the same term storage element 2830 can store different values of the source 2840 for processing by different destinations 2860 and 2865 at different clock cycles. For instance, at a first clock cycle, the storage element 2830 stores a value for destination 2860 and feeds that stored value to destination 2860 at a second clock cycle. At a third clock cycle, the storage element 2830 can alternatively store a value for destination 2865 which receives the stored value at the fourth clock cycle.

In some embodiments, the connections in FIG. 28B between the storage element 2805 and the destination 2860, between the routing circuit 2840 and the storage element 2830, and between the storage element 2830 and the destination 2865 are direct connections. However, it should be apparent to one of ordinary skill in the art that in some embodiments, some of the connections are configurable connections. For example, the connections between the storage element 2805 and the destination 2860, between the storage element 2830 and the destination 2865, or both are configurable connections.

Figure 29:
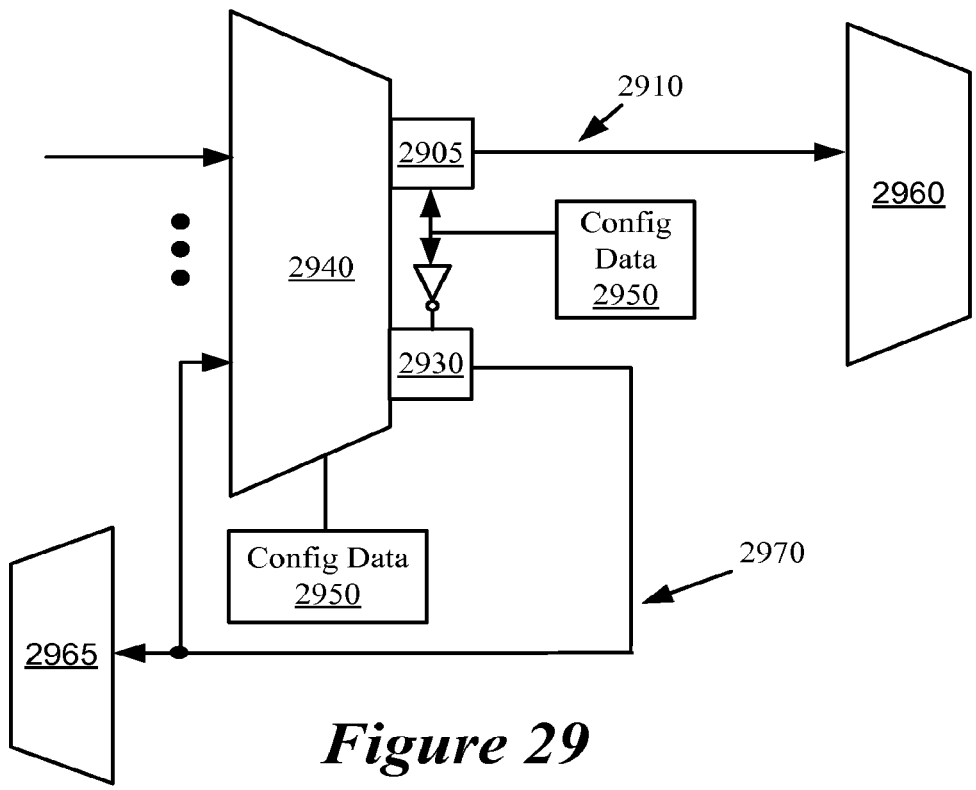
FIG. 29 illustrates a pair of storage elements connected to the output stage of a routing circuit of some embodiments.

In FIG. 28B, the storage element 2830 was illustrated within the feedback path 2870. Alternatively, as illustrated in FIG. 29, some embodiments locate the storage element 2930 at the output stage of the routing circuit 2940, similar to the first storage element 2905. In some embodiments of FIG. 29, the connection between the storage element 2905 and the destination circuit 2960 and the connection between the storage element 2930 and the routing circuits 2940 and 2965 are direct connections. However, in some embodiments, some of these connections are configurable connections. For instance, the connection between the storage element 2905 and the destination circuit 2960 the connection between the storage element 2930 and the destination circuit 2965, or both are configurable.

In some embodiments, the storage elements 2805 and 2830 of FIGS. 28A and 28B and the storage elements 2905 and 2930 of FIG. 29 share the same set of configuration data, while in some other embodiments the storage elements are controlled by different sets of configuration data. In some embodiments, the configuration data sets that control the storage elements of FIGS. 28A, 28B, and 29 come at least partly from configuration data storage of the IC. In some embodiments (e.g., some embodiments that are not runtime reconfigurable), the configuration data storage stores one configuration data set (e.g., one bit or more than one bit) for all clock cycles. In other embodiments (e.g., embodiments that are runtime reconfigurable and have runtime reconfigurable circuits), the configuration data storage stores multiple configuration data sets, with each set defining the operation of the storage elements during different clock cycles. The different clock cycles might be different user design clock cycles, or different sub-cycles of a user design clock cycle or some other clock cycle, As shown in FIGS. 28A, 28B, and 29, the routing operations of the routing circuits are controlled by configuration data. In some embodiments (e.g., some embodiments that are not runtime reconfigurable), this configuration data is one configuration data set for all clock cycles. However, in other embodiments (e.g., some embodiments that are runtime reconfigurable circuits), the configuration data includes multiple configuration data sets, each set for defining the operation of the routing circuits of FIGS. 28A, 28B, and 29 during different clock cycles. The different clock cycles might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

In some embodiments, the storage elements 2905 and 2930 are either both located within the routing circuit 2940 or alternatively one storage element is located at the output stage of the routing circuit 2940 while the other storage element is an internal component of the circuit 2940. It should be apparent to one of ordinary skill in the art that in some embodiments the feedback paths of FIGS. 28A, 28B, and 29 need not route to both the multiplexer (2840 or 2940) and a second destination (2865 or 2965). In some such embodiments, the output of storage elements 2830 or 2930 are routed only to the respective destination 2865 or 2965 and not back into the multiplexer 2840 or 2940.

Figure 30:
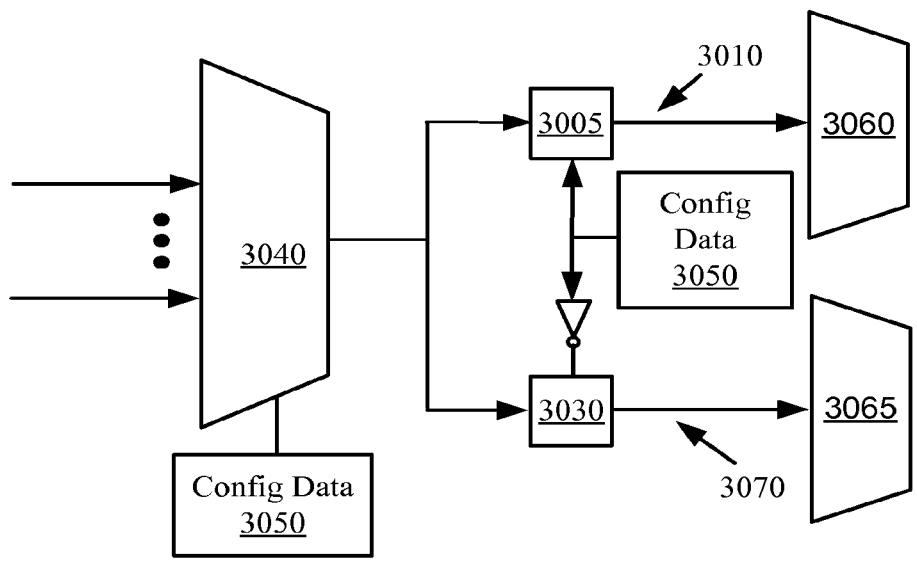
FIG. 30 illustrates a pair of storage elements along a parallel distributed output path of some embodiments.

FIG. 30 presents yet another embodiment of some invention. In FIG. 30, the feedback path 2970 and the parallel set of outputs from the routing circuit 2940 of FIG. 29 are removed. Instead, a single output from the multiplexer 3040 is distributed in two parallel paths. Each path includes a storage element 3005 and 3030. However, neither path is a primary signal path. The output from the first storage element 3005 is directly connected 3010 to a first destination circuit 3060 and the output from the second storage element 3030 is directly connected 3070 to a second destination circuit 3065. However, one of ordinary skill in the art will recognize that in some cases the two parallel paths might not end at the two destinations 3060 and 3065, but instead at a single destination circuit. In this manner, the circuit resembles the circuits of FIGS. 17A and 17B, though the inclusion of the second storage element ameliorates timing issues related to having a first path with a storage element and a second path without a storage element.

As mentioned above, the direct connections of FIG. 28-30 may be established through a combination of one or more wire segments and/or one or more vias. In some of these embodiments, a direct connection might include intervening non-configurable circuits, such as (1) intervening buffer, non-configurable circuits in some embodiments, (2) intervening non-buffer circuits in other embodiments, or (3) a combination of such buffer and non-buffer circuits in yet other embodiments. In some embodiments, one or more of the connections between circuits 3040, 3005, 3030, 3060, and 3065 are configurable connections. For instance the connection between storage element 3005 and the destination 3060, storage element 3030 and the destination 3065, or both can be configurable.

In FIG. 30, the same set of configuration data 3050 is used to control both storage elements 3005 and 3030. In some embodiments, the storage element 3005 latches when the set of configuration data 3050 is high and the storage element 3030 latches when the set of configuration data 3050 is low. In this manner, one path of the parallel distributed path performs storage operations and the other path routes signals to and from the source circuit 3040 to a destination 3060 or 3065. Therefore, the circuit of FIG. 30 transparently provides routing and storage operations within the routing fabric. However, it should be apparent to one or ordinary skill in the art that some embodiments do not use the same set of configuration data 3050 to control each storage element 3005 and 3030.

In some embodiments, the configuration data sets that control the storage elements of FIG. 30 come at least partly from configuration data storage of the IC. In some embodiments (e.g., some embodiments that are not runtime reconfigurable), the configuration data storage stores one configuration data set (e.g., one bit or more than one bit) for all clock cycles. In other embodiments (e.g., some embodiments that are runtime reconfigurable and have runtime reconfigurable circuits), the configuration data storage stores multiple configuration data sets, with each set defining the operation of the storage elements during differing clock cycles. These differing clock cycles might be different user design clock cycles, or different sub-cycles of a user design clock cycle or some other clock cycle.

As shown in FIG. 30, the routing operations of the routing circuit 3040 are controlled by configuration data. In some embodiments (e.g., some embodiments that are not runtime reconfigurable), this configuration data is one configuration data set for all clock cycles. However, in other embodiments (e.g., some embodiments that are runtime reconfigurable circuits), the configuration data includes multiple configuration data sets, each set for defining the operation of the routing circuit 3040 during different clock cycles. The different clock cycles might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

FIG. 30 is illustrated with a single path output from the multiplexer 3040, though some embodiments of the circuit 3040 produce the parallel paths directly from the circuit 3040. A first output of the parallel output path directly connects to storage element 3005 and a second output of the parallel output path directly connects to the storage element 3030. An implementation of such a multiplexer 3040 includes in some embodiments, the multiplexer 2510 of FIG. 25 where the second pair of parallel outputs 2555 and 2557 are directly connected to the second storage element 2590. However, in an implementation consistent with FIG. 30, the outputs from the second storage element 2590 would be directly connected a second destination instead of feeding back into the multiplexer 2510. Moreover, in some embodiments of FIG. 30, the storage elements 3005 and 3030 are built into the output stage of the multiplexer 3040 similar to the storage elements 2580 and 2590 of FIG. 27 without feeding back into the multiplexer 3040.

Figure 31:
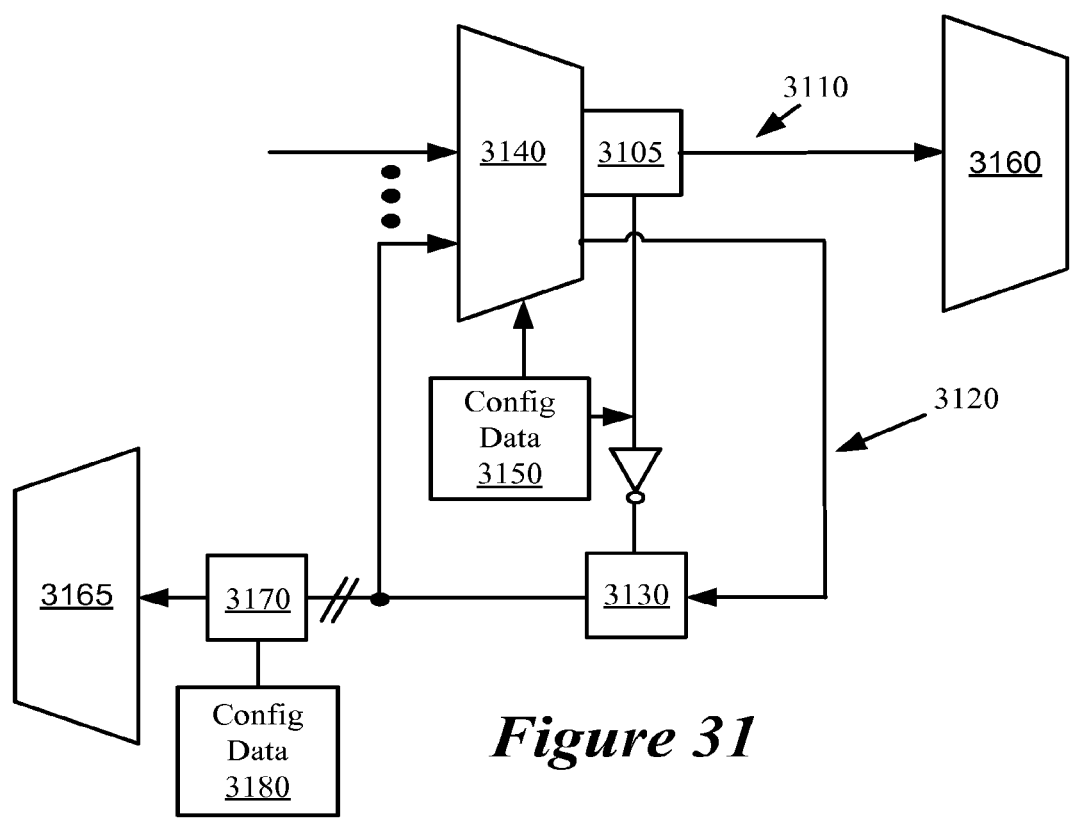
FIG. 31 illustrates using multiple storage elements within the routing fabric for providing long term storage of some embodiments.

FIG. 31 conceptually illustrates how some embodiments of the invention use uncongested areas within the routing fabric to store data and to route data to desired destinations. Some embodiments use the feedback path 3120 to provide values from the multiplexer 3140 to the storage element 3130. However, the different destinations 3160 and 3165 may need different values to be stored within the storage element 3130. For instance, at a first clock cycle, the output from source 3140 may need to be stored for three subsequent clock cycles before arriving at destination 3165, therefore the value is stored in the storage element 3130 located within the feedback path. During a second clock cycle, the output from source 3140 needs to be stored for two subsequent clock cycles before arriving at destination 3160. However, the first output is currently being stored within the storage element 3130.

In order to free the storage element 3130, but nevertheless provide long term storage for the first output, some embodiments of FIG. 31 pass the first stored value within the storage element 3130 to an unused storage element 3170 located elsewhere within the routing fabric. In this manner, the storage element 3130 is now available to store the signal output from the multiplexer 3140 at the second clock cycle. So long as neither storage element 3130 or 3170 is needed during the third clock cycle, these storage elements continue storing their respective values. Then at the fourth clock cycle, the signal stored within storage element 3170 is released and routed to destination 3165 and the signal stored within storage element 3130 is released and routed to destination However, if the storage elements 3130 or 3170 are used for storing other signals or the wire segments upon which the storage elements are located are used for routing other signals, then the storage elements 3130 or 3170 may first pass the stored values to other unused storage elements elsewhere within the routing fabric. In this manner, the storage element and the wiring path on which the storage element is located is freed and storage is provided for at another unused storage element within the routing fabric.

In some embodiments, one or more of the connections between the various circuits illustrated in FIG. 31 are configurable connections. However, in some embodiments, the connections between the storage element 3105 and the destination 3160, between the routing circuit 3140 and the storage element 3130, between the storage element 3130 and the routing circuit 3140, and between the storage element 3130 and the storage element 3170 are direct connections. Additionally, in some embodiments, one or more of these direct connections are long offset direct connections. Such connections are further described below.

Figure 32:
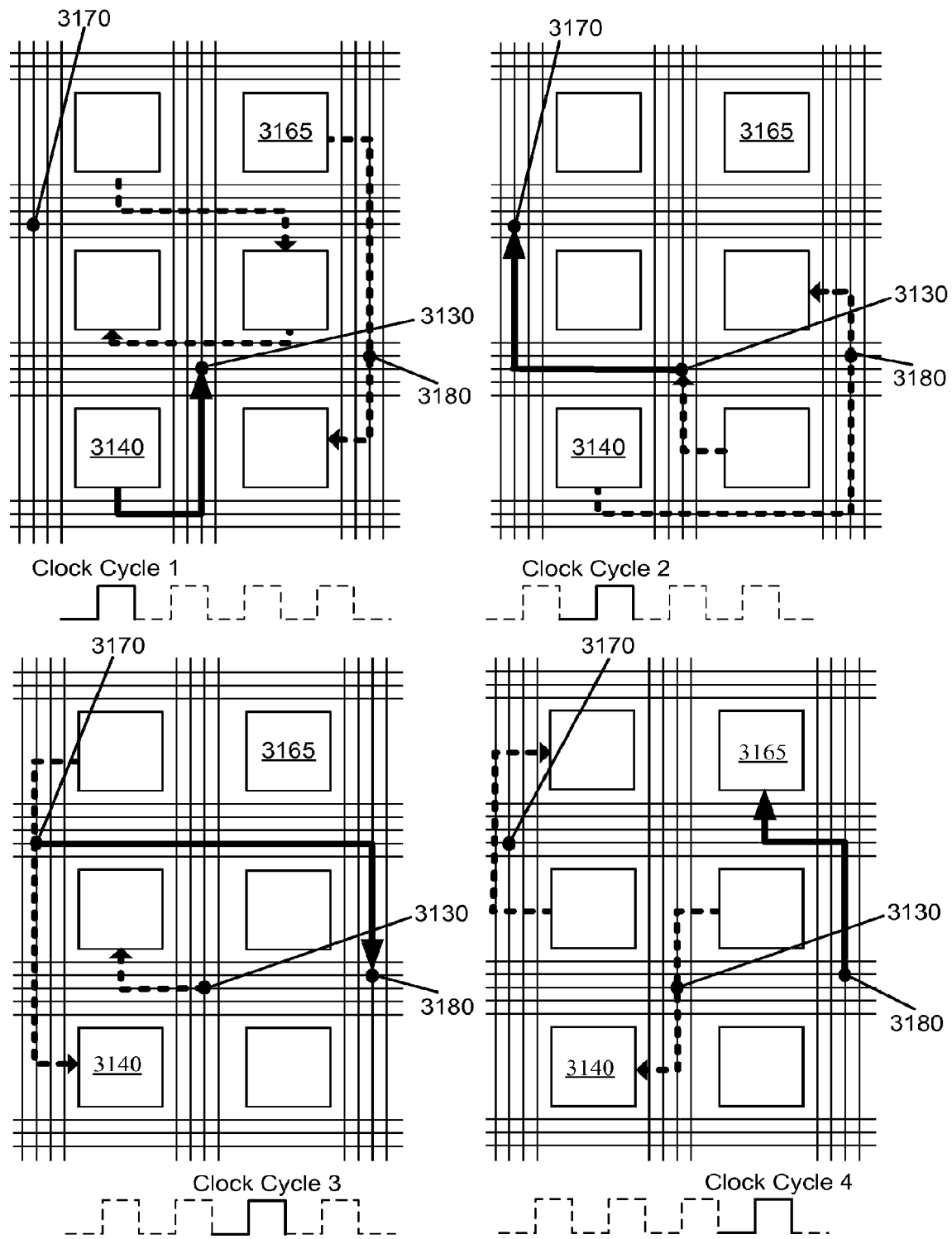
FIG. 32 provides an illustrative embodiment of the functionality provided by placing storage elements within the routing fabric of some embodiments.

As indicated above, the connections between storage elements 3130 and 3170 in FIG. 31 allow data to be stored while being routed to desired locations through uncongested areas of the routing fabric. FIG. 32 conceptually illustrates an example of such storage and passing of a stored signal from one storage element to another unused storage element in order to free the storage element or the routing path on which the storage element is located for use by other circuits of the IC. For instance, at a first clock cycle, a signal is passed from a source circuit element 3140 to a storage element 3130 for long term storage until a fourth clock cycle at which point the signal is to arrive at a destination circuit element 3165. However, because the storage element 3130 is required to store the value passed from an alternate circuit element during a second clock cycle, the storage element 3130 releases the previously stored value and routes the value to a second unused storage element 3170. The storage element 3130 is now available to provide storage at the second clock cycle for the alternate circuit element.

At the third clock cycle, the wiring path on which the second storage element 3170 is located is required to route signals from other circuits of the IC. Therefore, the second storage element 3170 releases the stored value to a third unused storage element 3180 to provide storage for the previously stored value during the third clock cycle. With the second storage element 3170 no longer providing storage, the path is clear for a signal to be routed from other circuits within the IC. At the fourth clock cycle, the stored value is routed from the third storage element 3180 to the destination circuit 3165.

Such operations maximize the usage of the existing storage elements within the routing fabric without requiring additional storage elements and also without congesting wiring paths which in some embodiments may be required for routing other signals from other circuits of the configurable IC. Moreover, the circuit elements of the IC can continue to perform routing operations irrespective of whether storage for previous values output from the circuit elements is being performed within the routing fabric. As noted above, in different embodiments, the routing fabric includes (1) a combination of wire segments, (2) a combination of wire segments and vias, (3) a combination of wire segments, vias, and buffers, but no intervening configurable interconnect circuits, or (4) a combination of wire segments, vias, and intervening non-configurable interconnect circuits.

Figure 33:
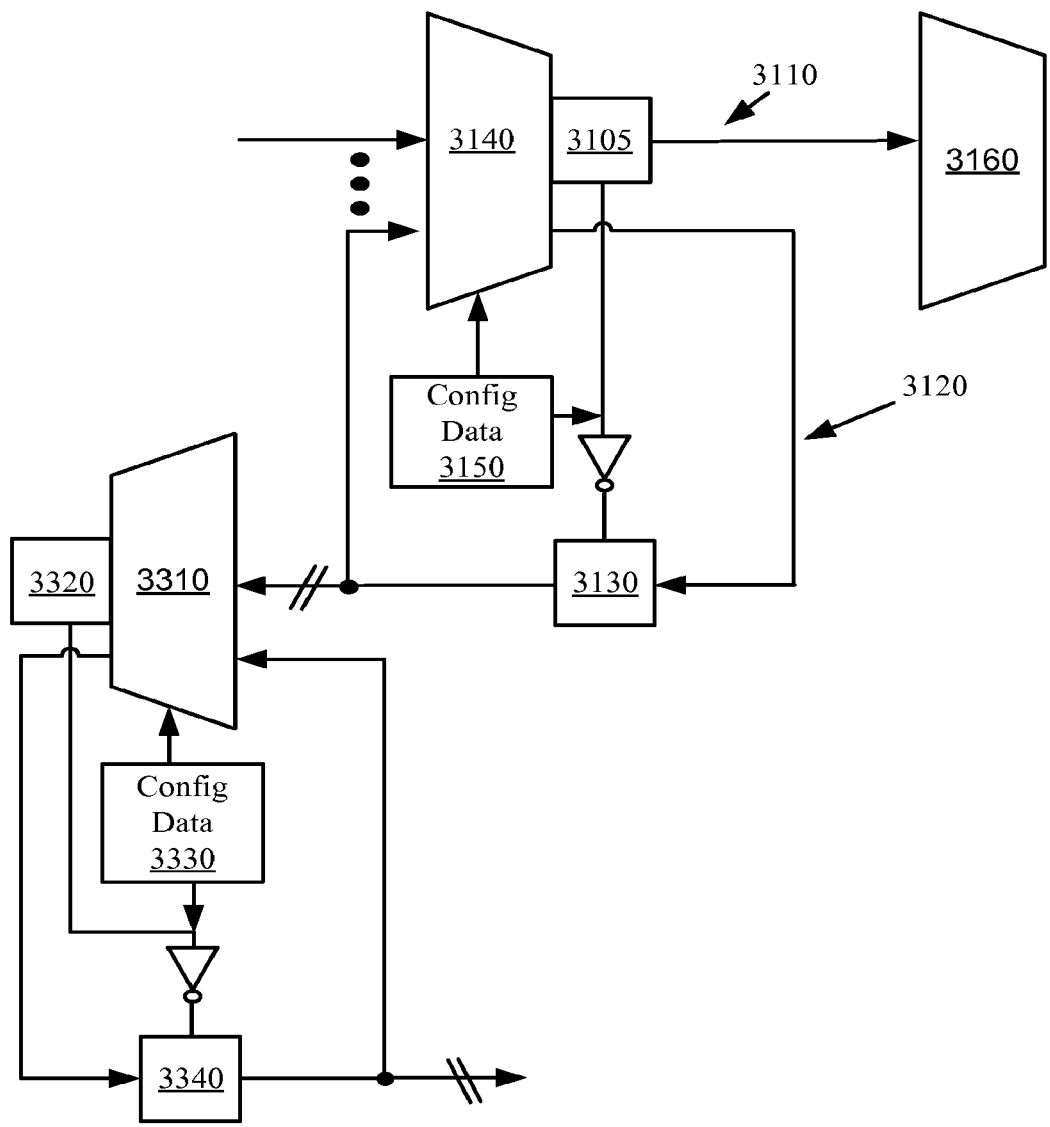
FIG. 33 illustrates an alternative placement and use of multiple storage elements within the routing fabric to provide long term storage of some embodiments.

Even though FIGS. 31 and 32 illustrate the concept of storing and routing data to desired locations through uncongested areas of the routing fabric by reference to the storage elements illustrated in FIG. 31, other embodiments might use this same approach with other storage elements discussed above (e.g., with the storage elements illustrated in FIGS. 17, 21, 24, 28A, 29, and 30). Moreover, even through FIG. 31 illustrates 3170 as a standalone storage element, this storage element might be at the output of another circuit, such as another configurable interconnect. FIG. 33 illustrates one such example.

Specifically, FIG. 33 illustrates an alternative embodiment of FIG. 31 in which the storage element 3170 of FIG. 31 is removed and instead replaced with a second short term 3320 and long term 3340 storage circuit. Though the components and wiring between FIG. 33 and FIG. 31 are similar, FIG. 33 illustrates a connection between such circuits within the routing fabric. By connecting two such circuits, the long term storage capabilities of one circuit are expanded so that the circuit can utilize unused storage elements of another circuit. One of ordinary skill in the art will recognize that even though FIG. 33 illustrates two communicatively connected circuits, some embodiments include several such circuits.

As described above, such functionality is necessary when a circuit must provide long term storage for multiple destinations at the same time. Therefore, if the storage element 3130 is already used but is needed to provide long term storage for a different signal and/or destination of circuit 3140, then storage element 3130 may release the previously stored value to the storage element 3340 provided that storage element 3340 is unused. In this manner, signals originated from circuit 3140 are stored in the storage element 3130 within its own feedback path and storage element 3340 within the feedback path of circuit 3310. Such interconnection between storage elements within different segments of the routing fabric makes available the storage resources of different segments of the routing fabric to circuits that otherwise would require additional storage elements within their own direct connection.

Though FIG. 33 has been illustrated with storage elements 3105, 3130, 3320, and 3340, one of ordinary skill in the art will recognize that several other variations are possible. For instance, these storage elements may be located in a manner similar to the storage elements 3005 and 3030 of FIG. 30. Moreover, in some embodiments the storage elements 3005 and 3030 may be included in addition to the existing storage elements of FIG. 31 or FIG. 33. In this manner the storage elements 3005 and 3030 can work in tandem with storage elements 3130 and 3170 of FIG. 31 or in tandem with the storage elements 3130 and 3320/3340 of FIG. 33. Similarly, instead of storage elements 3320 and 3340 after the routing circuit 3310, the storage elements that precede the routing circuit 3310 might be those of the PDP's illustrated in FIGS. 17-19.

In FIG. 33, all the connections are direct connections in some embodiments, while one or more of them are configurable connections in other embodiments. Moreover, some of the direction connections (e.g., the connection between circuits 3130 and 3310) in this figure can be implemented as direct long offset connections.

In some embodiments, direct long offset connections (also referred to as long-offset direct connections) are direct connections between two non-neighboring nodes that are not vertically or horizontally aligned. In some embodiments, the two nodes are two configurable circuits (e.g., circuits 3130 and 3310), which in some of these embodiments the two circuits are arranged in an array with other configurable circuits. In other embodiments, the two nodes are two configurable tiles that include the two directly connected circuits (e.g., the tile that includes circuit 3130 and the tile that includes the circuit 3310). In some embodiments, two nodes are not neighboring nodes when they are not adjacent to each other in the vertical, horizontal, or diagonal directions. Accordingly, the two nodes that are connected by a direct long offset connection are two nodes that are not vertically or horizontally aligned and that have at least one other node between them.

A direct long offset connection is a direct connection. As mentioned above, a direct connection is established through a combination of one or more wire segments and/or one or more vias. In some of these embodiments, a direct connection might include intervening non-configurable circuits, such as (1) intervening buffer circuits in some embodiments, (2) intervening non-buffer, non-configurable circuits in other embodiments, or (3) a combination of such buffer and non-buffer circuits in yet other embodiments.

Even though direct long offset connections were described above by reference to FIGS. 31 and 33, one of ordinary skill will realize that such connections can be used to implement the circuit structures illustrated in some of the other figures. For example, some or all the connections between the circuits mentioned above (e.g., between circuits 1710 and 1740, 1705 and 1740, 2805 and 2860, 2830 and 2865, 2905 and 2960, 2930 and 2965, 3005 and 3060, 3030 and 3065, and 3105 and 3160) may be implemented as long offset direct connections. Examples for implementing long offset direct connections are described U.S. Pat. No. 7,193,438. U.S. Pat. No. 7,193, 438 is incorporated herein by reference.

While the above discussion has illustrated some embodiments of storage elements applicable to a configurable IC, it should be apparent to one of ordinary skill in the art that some embodiments of the storage elements and routing circuits are similarly applicable to a reconfigurable IC. Therein, some embodiments of the invention implement the components within FIGS. 17A, 17B, 21, 28-31, and 33 with multiple sets of configuration data to operate on a sub-cycle reconfigurable basis. For example, the storage elements for the sets of configuration data in these figures (e.g., a set of memory cells, such as SRAM cells) can be modified to implement switching circuits in some embodiments. The switching circuits receive a larger set of configuration data that are stored internally within the storage elements of the switching circuits. The switching circuits are controlled by a set of reconfiguration signals. Whenever the reconfiguration signals change, the switching circuits supply a different set of configuration data to the routing circuits, such as the multiplexers and the selectively enabled storage elements within the routing fabric sections.

The sets of configuration data then determine the connection scheme that the routing circuits 1710, 2140, 2440, 2840, 2940, and 3140 of some embodiments use. Furthermore, the sets of configuration data determine the set of storage elements for storing the output value of the routing circuits. This modified set of switching circuits therefore adapts the routing fabric sections of FIGS. 17A, 17B, 21, 28-31, and 33 for performing simultaneous routing and storage operations within a sub-cycle reconfigurable IC.

While numerous storage element circuits have been described with reference to numerous specific details, one of ordinary skill in the art will recognize that such circuits can be embodied in other specific forms without departing from the spirit of the invention. For instance, several embodiments were described above by reference to particular number of circuits, storage elements, inputs, outputs, bits, and bit lines. One of ordinary skill will realize that these elements are different in different embodiments. For example, routing circuits and multiplexers have been described with n logical inputs and only one logical output, where n is greater than one. However, it should be apparent to one of ordinary skill in the art that the routing circuits, multiplexers, IMUXs, and other such circuits may include n logical inputs and m logical outputs where m is greater than one.

Moreover, though storage elements have been described with reference to routing circuits (RMUXs), it will be apparent to one of ordinary skill in the art that the storage elements might equally have been described with reference to input-select multiplexers such as the interconnect circuits (IMUXs) described above. Similarly, the routing circuits illustrated in the figures, such as the 8-to-1 multiplexer of FIG. 11, may alternatively be described with reference to IMUXs.

The storage elements of some embodiments are state elements that can maintain a state for one or more clock cycles (user-design clock cycles or sub-cycles). Therefore, when storing a value, the storage elements of some embodiments output the stored value irrespective of the value at its input. Moreover, some embodiments have referred to the storage elements as "short term" or "long term" storage elements (e.g., the storage elements 2110 and 2120 of FIG. 21), however, it should be apparent to one of ordinary skill in the art that such terminology describes one type of use for the storage elements. For instance, the storage element 2110 need not store for only one clock cycle (e.g., user-design clock or sub-cycle clock) or store for a short term. Similarly, the storage element 2120 need not be used only for long term storage.

Moreover, even though some embodiments described above showed storage functionality at the output stage of the RMUXs, one of ordinary skill in the art will recognize that such functionality can be placed within or at the input stage of the RMUXs or within or at the input stage of IMUXs. Similarly, the source and destination circuits described with reference to the various figures can be implemented using IMUXs. Thus, one of ordinary skill in the art would understand that the invention is not to be limited by the foregoing illustrative details.

V. Clocked Storage Elements within the Routing Fabric

As mentioned above, the configurable routing fabric of some embodiments is formed by configurable RMUXs along with the wire-segments that connect to the RMUXs, vias that connect to these wire segments and/or to the RMUXs, and buffers that buffer the signals passing along one or more of the wire segments. In addition to these components, the routing fabric of some embodiments further includes non-transparent (i.e. clocked) storage elements, also referred to as "conduits." Although the examples shown below are all driven by clock signals, one of ordinary skill in the art will also recognize that the clocked storage elements can also be driven otherwise (e.g. by configuration data, user data, etc.).

Having clocked storage elements is highly advantageous. For instance, such storage elements allow data to be stored every clock cycle (or sub-cycle, configuration cycle, reconfiguration cycle, etc.). In addition, new data may be stored at the input during the same clock cycle that stored data is presented at the output of the storage element. These clocked storage elements may be placed within the routing fabric or elsewhere on the IC.

In much of the discussion above, configurable storage elements were introduced and described. In this section, we introduce and describe clocked storage elements. A clocked storage element is one where a clock signal directly drives the storage operation, whereas a configurable storage element is one where the configuration signal directly drives the storage operation. In some cases a configurable storage element is synchronous with the clock because the configuration data is received synchronously with the clock. However, a clocked storage circuit necessarily changes at transitions in the clock, whereas, with a configurable storage circuit, the transitions are driven by the state of supplied configuration data. Thus, in many cases a configurable storage circuit can change its output when its configuration data is held constant (i.e., when a latch is configured to operate in pass-through mode and its input is changing). Configuration data may be maintained differently for different sequences of configuration cycles. Thus the configurable storage circuit can behave in a more arbitrary manner that a clocked storage circuit.

In addition, some embodiments discussed below use a hybrid of clock and configuration signals. These are called either a "hybrid conduit" or a "programmable conduit", because their storage operations are directly driven both by a clock signal and configuration signal.

Figure 34A:
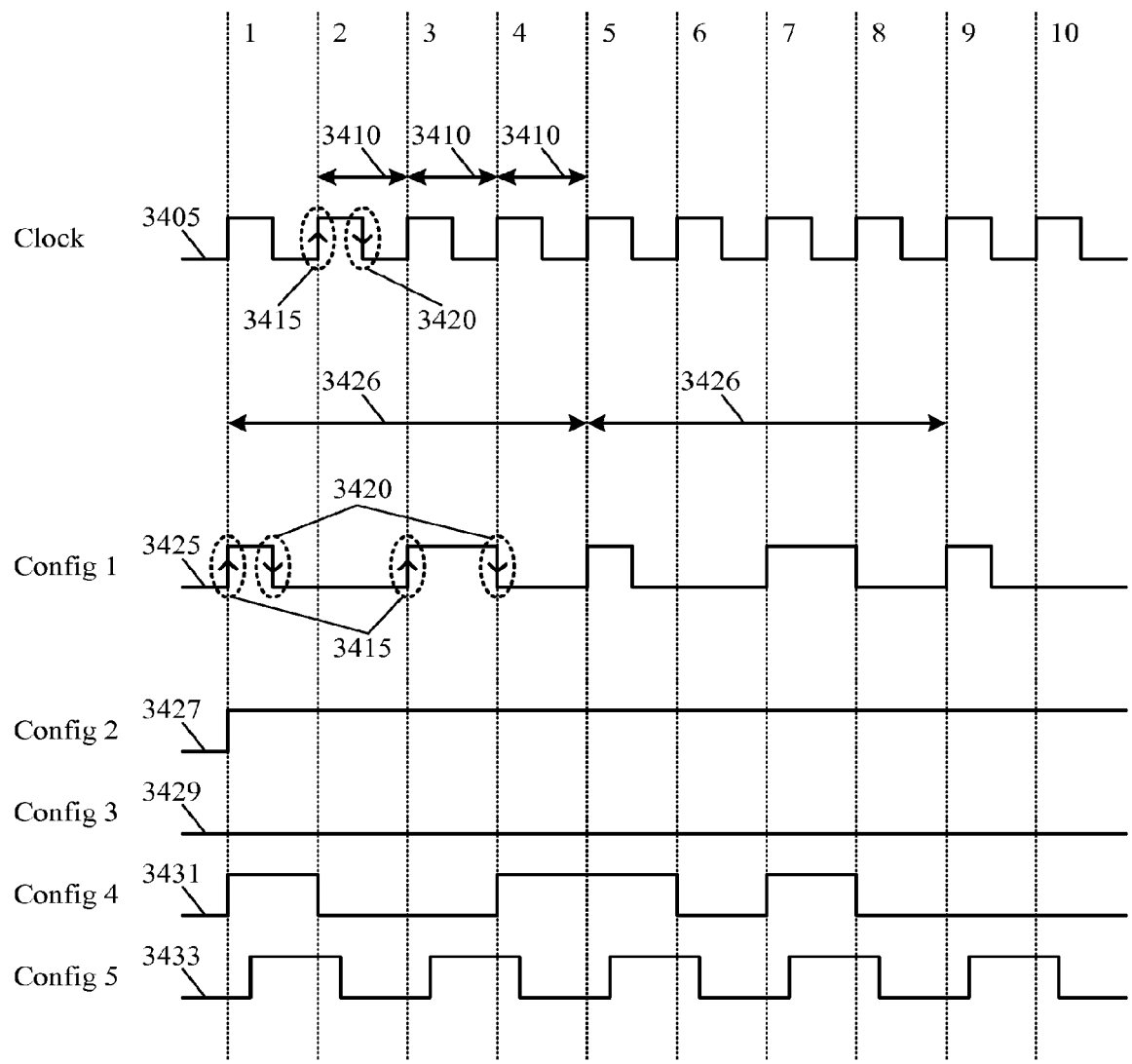
FIG. 34A illustrates different examples of clock and configuration data signals 3400 that may be used to drive circuits of the IC.

FIG. 34A illustrates different examples of clock and configuration data signals 3400 that may be used to drive circuits described herein. As shown, a typical clock signal 3405 is periodic. Thus, the clock signal continuously repeats the pattern of one period 3410, which, typically, has one rising edge 3415 and one falling edge 3420 of the clock signal. In addition, a clock signal typically has a duty cycle of 50% (i.e., the clock is at logic high for 50% of its period and logic low for 50% of the period). In contrast, the example configuration data signals 3425-3433 may or may not be periodic, may have multiple rising and falling edges during any identified period or cycle, and do not typically have any particular duty cycle.

For instance, the configuration signal 3425 is an example of a four-loopered configuration, inasmuch as the signal repeats every four clock cycles (i.e., the configuration signal 3425 is periodic, with a period of four clock cycles 3426). However, as shown, the signal has multiple rising 3415 and falling 3420 edges in one cycle (two of each in this example), and its duty cycle is not 50% in this example. The example configuration signal 3427 is simply at a logic high level for the entire period of operation illustrated by FIG. 34A. Thus, the configuration signal 3427 is not periodic, and does not transition from either high to low or low to high in this example. Likewise, the configuration signal 3429 is not periodic, and also does not transition during the period of operation shown in the example of FIG. 34A, however this signal is at a logic low instead of a logic high In other cases, configuration data may not be periodic (i.e. repeating) at all. For example, the signal 3431 does not repeat during the period of operation illustrated in FIG. 34A. In some instances the configuration data may repeat, as in the four-loopered example 3425 described above. However, in other cases, the configuration data provided to the storage element (or other circuit) may be based on computations, user data, or other factors, that cause the configuration data to be non-repeating. Finally, as illustrated by the signal 3433, configuration data does not necessarily have to correspond to changes in the clock signal. Although in many cases configuration data will be provided in relation to a clock signal, the configuration data is not required to be synchronous with the clock in order to operate the configurable circuits described herein.

One of ordinary skill in the art will recognize that FIG. 34A is provided for descriptive purposes only, and does not depict any particular clock or configuration signals. Nor does FIG. 34A show accurate setup and hold times, rise and fall time requirements, etc.

Figure 34B:
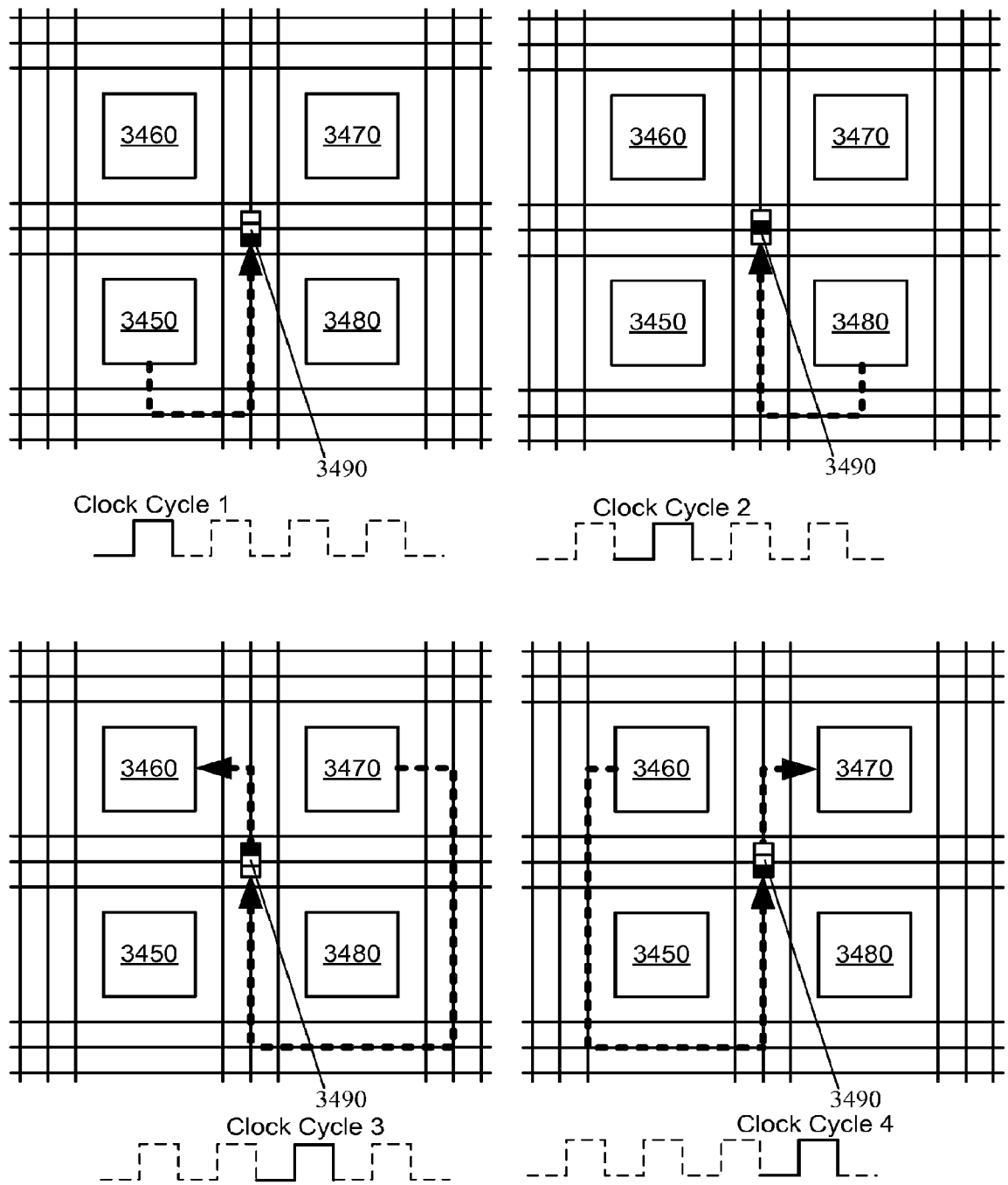
FIG. 34B provides an illustrative embodiment of the functionality provided by placing clocked storage elements within the routing fabric of a configurable IC of some embodiments.

FIG. 34B provides an illustrative example of the functionality provided by placing clocked storage elements within the routing fabric of a configurable IC. In FIG. 34B, a component 3450 is outputting a signal for processing by component 3460 at clock cycle 3. Therefore, the signal from 3490 must be stored until clock cycle 3. Hence, the signal is stored within the storage element 3490 located within the routing fabric. By storing the signal from 3450 within the routing fabric during clock cycles 1 and 2, components 3450 and 3460 remain free to perform other operations during this time period. At clock cycle 2, component 3480 is outputting a signal for processing by component 3470 at clock cycle 4. At clock cycle 2, storage element 3490 is storing the value received at clock cycle 1, and receiving a value from component 3480 for storage as well.

At clock cycle 3, 3460 is ready to receive the first stored signal (from cycle 1) and therefore the storage element 3490 passes the value. At clock cycle 3, storage element 3490 continues to store the value received in clock cycle 2. Further, at clock cycle 3, storage element 3490 receives a value from component 3470 for future processing. At clock cycle 4, component 3430 is ready to receive the second stored signal (from clock cycle 2) and therefore the storage element 3490 passes the value. Further, at clock cycle 4, storage element 3490 continues to store the value received during clock cycle 3, while also receiving a new value from component 3460. It should be apparent to one of ordinary skill in the art that the clock cycles of some embodiments described above could be either (1) sub-cycles within or between different user design clock cycles of a reconfigurable IC, (2) user-design clock cycles, or (3) any other clock cycle.

Figure 35:
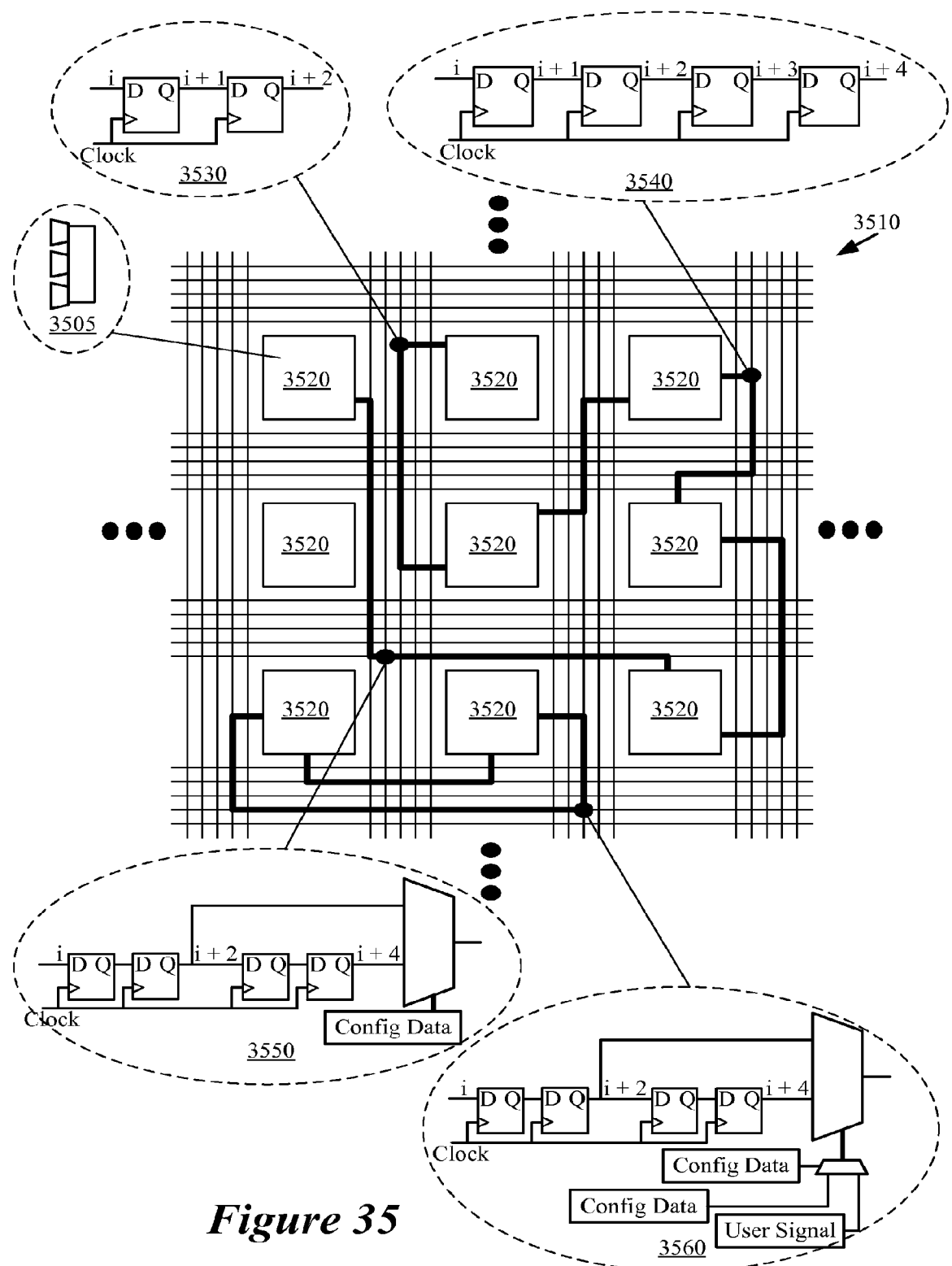
FIG. 35 illustrates placement of a clocked storage element within the routing fabric of a configurable IC of some embodiments.

FIG. 35 illustrates several examples of different types of controllable storage elements 3530-3560 that can be located throughout the routing fabric 3510 of a configurable IC. Each storage element 3530-3560 stores a series of output signals from a source component or components that are to be routed through the routing fabric to some destination component or components.

As illustrated in FIG. 35, outputs are generated from the circuit elements 3520. The circuit elements 3520 are configurable logic circuits (e.g., 3-input LUTs and their associated IMUXs as shown in expansion 3505), while they are other types of circuits in other embodiments. In some embodiments, the outputs from the circuit elements 3520 are routed through the routing fabric 3510 where the outputs can be stored within the storage elements 3530-3560 of the routing fabric. In other embodiments, the storage elements 3530-3560 are placed within the configurable logic circuits 3505. Storage element 3530 is a storage element including two clocked flip flops (also referred to as a "clocked delay element"). This storage element will be further described below by reference to FIG. 36, element 3640. Storage element 3540 is a storage element including four clocked flip flops. This storage element will be further described below by reference to FIG. 36, element 3650. Storage elements 3550 and 3560 include four clocked flip flops and an input select multiplexer that is controllable. Storage element 3550 will be further described below by reference to FIG. 36, element 3660 and storage element 3560 by reference to FIG. 36, element 3670.

One of ordinary skill in the art will realize that the depicted storage elements within the routing fabric sections of FIG. 35 only present some embodiments of the invention and do not include all possible variations. Some embodiments use all these types of storage elements, while other embodiments do not use all these types of storage elements (e.g., use one or two of these types). In addition, the storage elements may be placed at other locations within the IC.

A. Non-Configurable Clocked Storage Elements within the Routing Fabric

Figure 36:
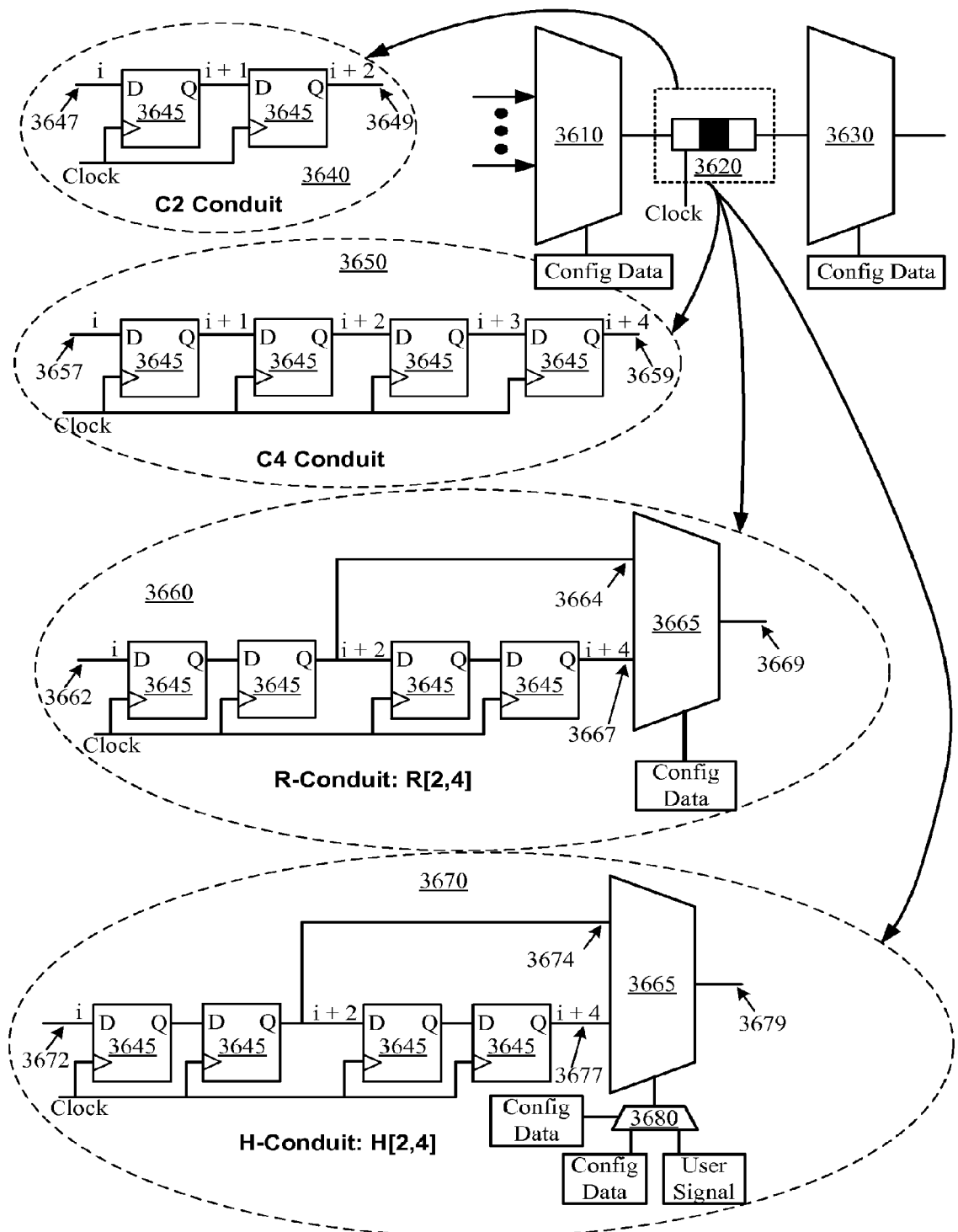
FIG. 36 illustrates alternative embodiments of clocked storage elements placed within the routing fabric of a configurable IC of some embodiments.

FIG. 36 illustrates several circuit representations of different embodiments of the storage element 3620. In some embodiments, the storage element 3620 is a shift register 3640 including two clocked delay elements (e.g., flip-flops) 3645, that is built in or placed at the routing fabric between a routing circuit 3610 and a first input of a destination 3630. The flip-flops, or clocked delay elements, are connected sequentially, such that the output of one clocked delay element drives the input of the next sequentially connected clocked delay element. In some embodiments, the flip-flops are clocked by the sub-cycle clock, such that the value at the input 3647 of the storage element 3640 is available at its output 3649 two sub-cycles later. Accordingly, when other circuits in later reconfiguration cycles (specifically, two sub-cycles later) need to receive the value of a circuit 3610 in earlier reconfiguration cycles (i.e., two sub-cycles earlier), the circuit 3640 can be used.

In some embodiments, the storage element 3620 is a shift register 3650 including four flip-flops 3645 that is built in or placed at the routing fabric between the routing circuit 3610 and a first input of a destination 3630. The flip-flops are clocked by the sub-cycle clock, such that the value at the input 3657 of the storage element 3650 is available at its output 3659 four sub-cycles later. Accordingly, when other circuits in later reconfiguration cycles (specifically, four sub-cycles later) need to receive the value of a circuit 3610 in earlier reconfiguration cycles (in this example, four sub-cycles earlier), the circuit 3650 can be used.

One of ordinary skill in the art will recognize that the embodiments shown in FIG. 36 are not exhaustive. For instance, storage elements 3640 and 3650 could be implemented with different number of flip-flops (e.g. 3, 5, or 8 flip-flops) in addition to the two embodiments shown, which utilize 2 and 4 flip-flops, respectively. Alternatively, the storage elements 3640 could be placed at the input or output of a LUT or between any other circuits of the IC.

B. Configurable Clocked Storage Elements within the Routing Fabric

In some embodiments, the configurable (or controllable) storage element 3620 is a shift register 3660 including four flip-flops 3645 and a 2:1 multiplexer 3665 that is built in or placed at the routing fabric between the routing circuit 3610 and a first input of a destination 3630. The flip-flops are clocked by the sub-cycle clock (or another clock signal), such that the value at the input 3662 of the storage element 3660 is available at a first multiplexer input 3664 two sub-cycles later, and is available at a second multiplexer input 3667 four sub-cycles later. The multiplexer 3665 is controlled by configuration data such that the value at its output 3669 may be selected from either the value at its first input 3664 or its second input 3667. In other embodiments, the multiplexer 3665 may have more than two inputs. Accordingly, when other circuits in later configuration cycles (in this example, two or four sub-cycles later) need to receive the value of a circuit 3610 in earlier configuration cycles (specifically, two or four sub-cycles earlier), the circuit 3660 can be used.

One of ordinary skill in the art will recognize that the circuit 3660 may be implemented with more sets of flip-flops than the two shown. In other words, the circuit may be implemented, for instance, with a three-input multiplexer and three sets of flip-flops, where each set of flip-flops has its output connected to each input of the multiplexer. In this example, the circuit would be capable of producing three different delays from input to output.

In some embodiments, the storage element 3620 is a shift register 3670 including four flip-flops 3645 and two 2:1 multiplexers 3665 and 3680 that are built in or placed at the routing fabric between the routing circuit 3610 and a first input of a destination 3630. The flip-flops are clocked by the sub-cycle clock, such that the value at the input 3672 of the storage element 3670 is available at a first multiplexer input 3674 two sub-cycles later, and is available at a second multiplexer input 3677 four sub-cycles later. The multiplexer 3665 is controlled by a user signal or configuration data such that the value at its output 3679 may be selected from either the value at its first input 3674 or its second input 3677. In other embodiments, the multiplexer 3665 may have more than two inputs. The 2:1 multiplexer 3680 selects between the user signal or configuration data based on another configuration data. In some embodiments, the configuration data for selection and control may be provided by the same configuration data. Accordingly, when other circuits in later configuration cycles (specifically, two or four sub-cycles later) need to receive the value of a circuit 3610 in earlier configuration cycles (specifically, two or four sub-cycles earlier), the circuit 3670 can be used.

Figure 37:
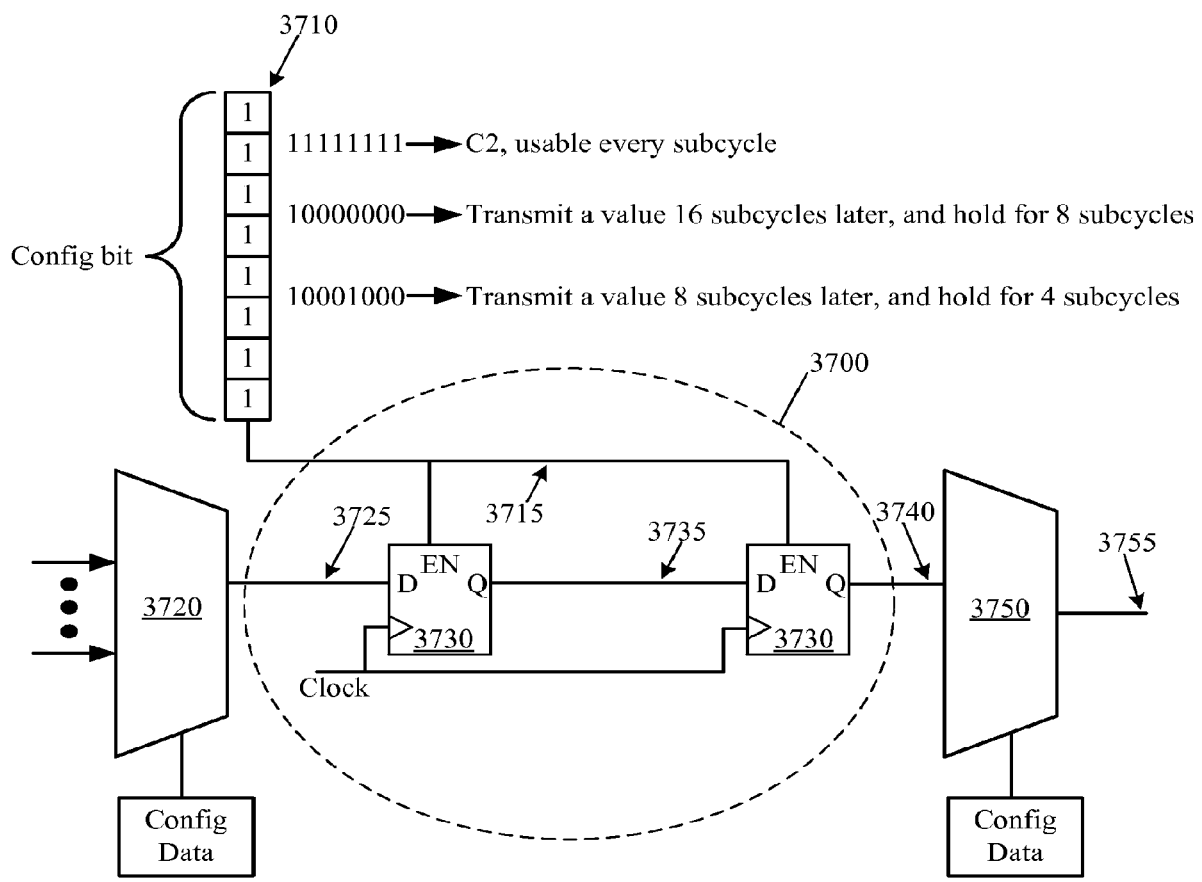
FIG. 37 illustrates a circuit representation of a configurable clocked storage element of some embodiments.

FIG. 37 illustrates one embodiment of a configurable, non-transparent (i.e. clocked) storage element (also referred to as a "programmable conduit"). In some embodiments, the storage element 3700 is a configurable shift register including two flip-flops 3730 and 3740 that is built in or placed at the routing fabric between a routing circuit 3720 and a first input of a destination 3750. The flip-flops are clocked by the sub-cycle clock, such that the value at the input 3725 of the storage element 3700 is available at its output 3745 in a later sub-cycle. Accordingly, when other circuits in later configuration cycles need to receive the value of a circuit 3720 in earlier configuration cycles, the circuit 3700 can be used.

The configurable storage element 3700 functions in the same manner as storage element 3640 from FIG. 36 while the configuration bit 3710 is held in a logic high state. When the configuration bit 3710 is held in a logic high state, each flip flop (3730 and 3740) of the configurable storage element 3700 is enabled during each clock cycle, so that its input 3725 is available at its output 3740 two clock cycles later, and the value is held at the output for one clock cycle.

When different configuration data is presented to the configurable storage element 3700, multiple variations of delay from input to output and of the hold time at the output may be achieved. For instance, if the configuration data 3710 provided is logic high for 1 clock cycle, and logic low for 7 clock cycles, in an 8-loopered scheme, the input flip flop 3730 is enabled during the first clock cycle, and stores the data at its input 3725. Although the second flip flop 3740 is also enabled, the data at its input 3735 is not valid, so neither is the data at its output 3745 valid. During the second through eighth clock cycles, neither flip flop (3730 and 3740) is enabled, so no new data is stored by either flip flop. During the ninth clock cycle, both flip flops are enabled, so the first flip flop 3730 stores the data at its input 3725, while presenting its stored data at its output 3735. The second flip flop 3740 is enabled and stores the data from the output of the first flip-flop 3735, while the data at its output 3745 is still invalid. During the tenth to sixteenth clock cycles, neither flip flop (3730 and 3740) is enabled, so no new data is stored or passed by either flip flop. During clock cycle 17, both flip flops (3730 and 3740) are enabled, and the first flip flop 3730 again stores the data at its input 3725, and presents its stored data at its output 3735. The second flip flop 3740 again stores the data at its input 3735 and also presents its stored data at its output 3745, where the data is now valid, and will be held until the next enable signal and clock edge.

One of ordinary skill in the art will recognize that other embodiments of the configurable clocked storage element 3700 may include more flip flops, or configuration data greater than one byte. Furthermore, the storage element may be placed at different locations within the IC. In addition, the various examples of configuration data are for illustrative purposes only, and any combination of bits may be used.

VI. Using the Different Storage Elements

As mentioned above, the configurable routing fabric of some embodiments is formed by configurable RMUXs along with the wire-segments that connect to the RMUXs, vias that connect to these wire segments and/or to the RMUXs, and buffers that buffer the signals passing along one or more of the wire segments. The routing fabric of some embodiments further includes configurable transparent (i.e. unclocked) storage elements. In addition to these components, the routing fabric of some embodiments further includes configurable and non-configurable non-transparent (i.e. clocked) storage elements.

Having a mixture of configurable unclocked, clocked, controllable clocked, and configurable clocked storage elements is highly advantageous. For instance, clocked storage elements allow data to be stored every reconfiguration cycle (or sub-cycle), while transparent storage elements can store data for multiple reconfiguration cycles. In addition, clocked storage elements allow new data to be stored at the input during the same clock cycle (or sub-cycle) that stored data is presented at the output of the clocked storage element.

A. Configurable Unclocked Storage Elements

Figure 38A:
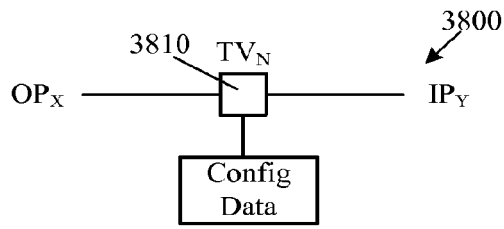
FIG. 38A illustrates a transparent storage element placed between a first circuit's output and a second circuit's input of some embodiments.

FIG. 38A illustrates one embodiment of a configurable, transparent (i.e. unclocked) storage element. In some embodiments, the storage element is a latch 3810 which may be placed between two other circuit elements. In some embodiments, the latch 3810 is implemented as shown in FIG. 12, element 1210. This latch is said to be transparent because it does not receive a clock signal. In FIG. 38A, $OP_X$ represents the output of some upstream circuitry, for instance, the output of an R-MUX. The input of the latch 3810 is driven by $OP_X$. Similarly, $IP_Y$ represents the input of some downstream circuitry that will be driven by the output of the latch 3810. The downstream circuitry could be an R-MUX, an I-MUX, or any other element of the configurable IC.

Figure 38B:
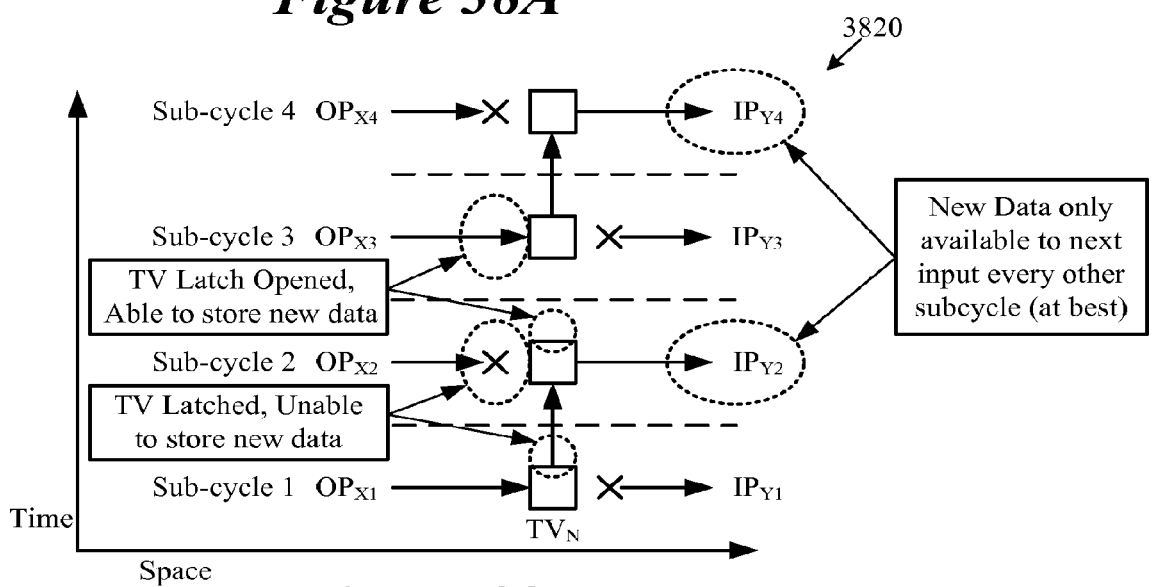
FIG. 38B illustrates the operation of the circuit from FIG. 38A where the output is latched and unlatched in alternating reconfiguration cycles of some embodiments.

FIG. 38B illustrates the use of the storage element 3810 to pass values from an earlier sub-cycle (or clock cycle) to a later sub-cycle. As shown, if a value from $OP_X$ is latched during sub-cycle 1, that value is then held in sub-cycle 2, where it is available to be read at $IP_Y$. During sub-cycle 2, the storage element 3810 is unable to store a new value from $OP_X$ because the latch is unable to read new data while data is being stored. As further illustrated, the storage element 3810 is ready to store new data from $OP_X$ during sub-cycle 3. The data stored during sub-cycle 3 is then available to be read at $IP_Y$ during sub-cycle 4. This same process can be repeated in subsequent sub-cycles.

Figure 39:
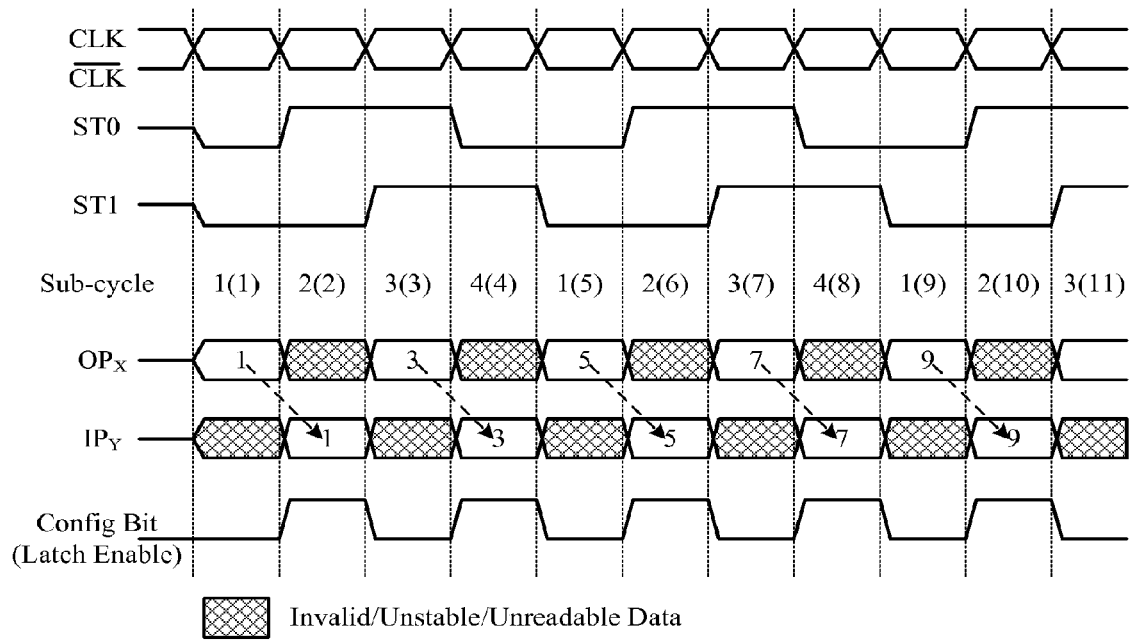
FIG. 39 illustrates the timing of the circuit from FIG. 38A under the operating conditions described by FIG. 38B of some embodiments.

FIG. 39 illustrates the operation of the storage element 3910 through the use of a timing diagram. Note that FIG. 39 is meant for illustrative purposes only, and is not meant to accurately reflect setup and hold times, rise times, etc. FIG. 39 corresponds to the example shown in FIG. 38B. In this example, there are four sub-cycles during each user cycle, and the four sub-cycles continuously repeat (4-loopered). During sub-cycle 1, the latch enable signal is inactive (low), and the storage element 3810 is available to store data from $OP_X$. During this time, storage element 3810 acts as a routing circuit, and the output of storage element 3810 is unstable at $IP_Y$. During sub-cycle 2, the latch enable signal is active (high), and the value stored during sub-cycle 1 is presented by the storage element 3810 to $IP_Y$, and the storage element is not able to read new data from $OP_X$. During sub-cycle 3, the storage element 3810 again reads data from $OP_X$, while the output of storage element 3810 is not stable at $IP_Y$. During sub-cycle 4, the value stored during sub-cycle 3 is presented by the storage element 3810 to $IP_Y$. This process is repeated in this example, with the values read from $OP_X$ at sub-cycles 1, 3, 5, etc. available for the element at $IP_Y$ during sub-cycles 2, 4, 6, etc.

Figure 38C:
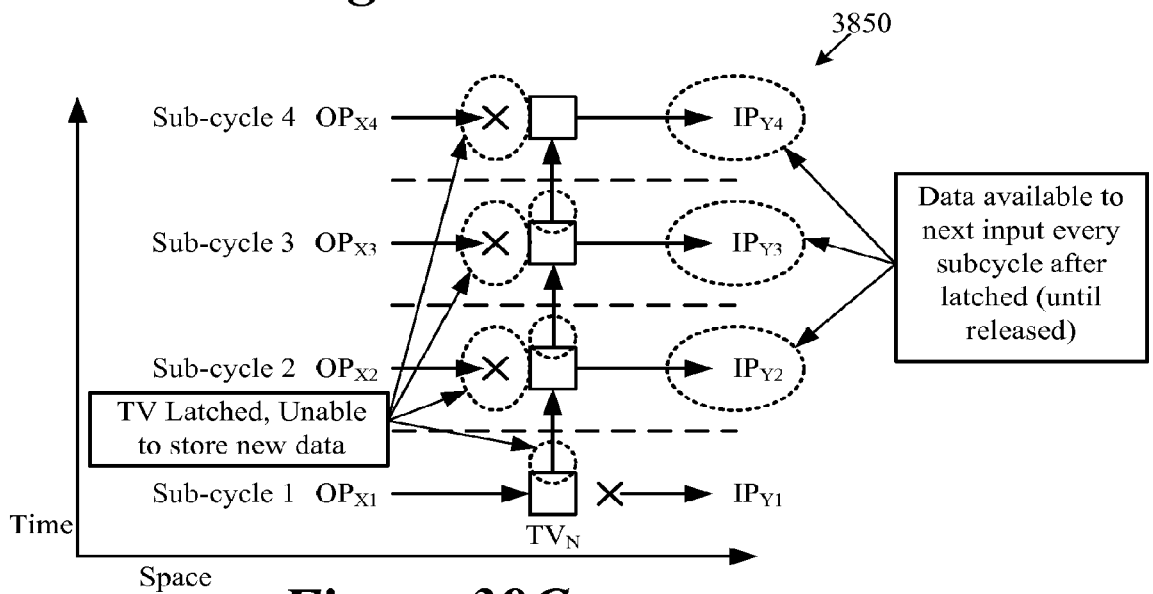
FIG. 38C illustrates the operation of the circuit from FIG. 38A where the output is latched for multiple reconfiguration cycles of some embodiments.

FIG. 38C illustrates the use of the storage element 3810 to hold and pass values for multiple-cycles. As shown in this example, a value is read and latched from $OP_X$ at sub-cycle 1. After the data is latched at sub-cycle 1, the storage element 3810 is unable to store new data during sub-cycles 2, 3, and 4. During sub-cycles 2, 3, and 4, the data stored by storage element 3810 is continuously available at $IP_Y$.

Figure 40:
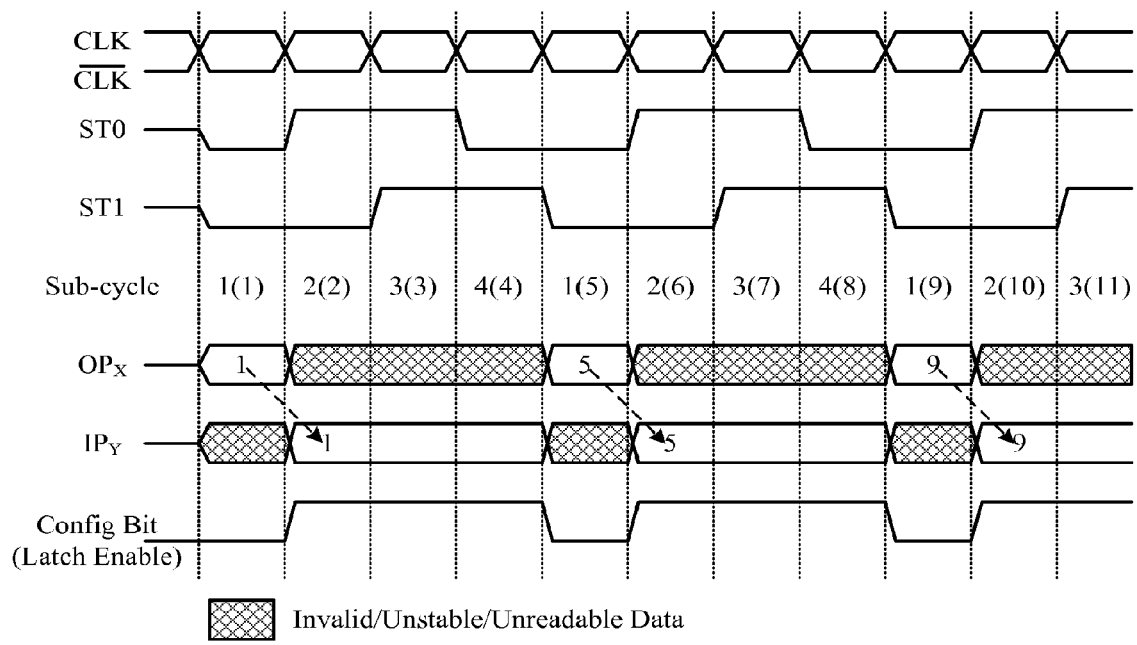
FIG. 40 illustrates the timing of the circuit from FIG. 38A under the operating conditions described by FIG. 38C of some embodiments.

FIG. 40 illustrates the operation of storage element 3810 through the use of a timing diagram. FIG. 40 corresponds to the example shown in FIG. 38C. During sub-cycle 1, the storage element 3810 is able to store data from $OP_X$. During this time, the output of storage element 3810 is unstable and not available to be read at $IP_Y$. During sub-cycles 2-4, the value stored during sub-cycle 1 is presented by the storage element 3810 to $IP_Y$, and the storage element is not able to read new data from $OP_X$. This timing is repeated every four sub-cycles, as shown. Thus, the value stored from $OP_X$ during sub-cycle 5 is available at $IP_Y$ during sub-cycles 6-8, etc.

Use of configurable transparent storage elements also allows operational time extension. In some embodiments, a circuit will not finish performing its operations within one sub-cycle. In these instances, a configurable transparent storage elements may be used to hold the value at the input of the circuit for a subsequent sub-cycle so that the circuit can complete its operations. Operational time extension is further described in U.S. patent application Ser. No. 11/081,823 entitled "Concurrent Optimization of Physical Design and Operational Cycle Assignment."

One of ordinary skill in the art will recognize that the two examples shown above are not exhaustive and are meant for illustrative purposes only. For instance, other implementations may have 8-loopered instead of 4-loopered schemes. Other embodiments will hold the data in the storage element 3810 for longer than 3 sub-cycles, etc.

B. Non-Configurable Clocked Elements

Figure 41A:
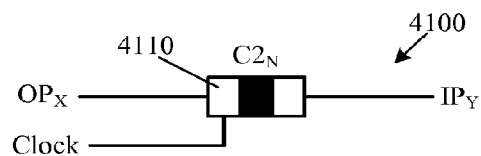
FIG. 41A illustrates a clocked storage element placed between a first circuit's output and a second circuit's input of some embodiments.

FIG. 41A illustrates one embodiment of a non-configurable, non-transparent (i.e. clocked) storage element 4110. In some embodiments, the storage element 4110 is the same element described by FIG. 36, element 3640. This storage element is said to be non-transparent because it requires a clock signal. This storage element 4110 is non-configurable because there is no configuration data passed to the storage element. In FIG. 41A, $OP_X$ represents the output of some upstream circuitry, for instance, the output of an R-MUX. The input of the storage element 4110 is driven by $OP_X$. Similarly, $IP_Y$ represents the input of some downstream circuitry that will be driven by the output of the storage element 4110. The downstream circuitry could be an R-MUX, an I-MUX, or any other element of the configurable IC.

Figure 41B:
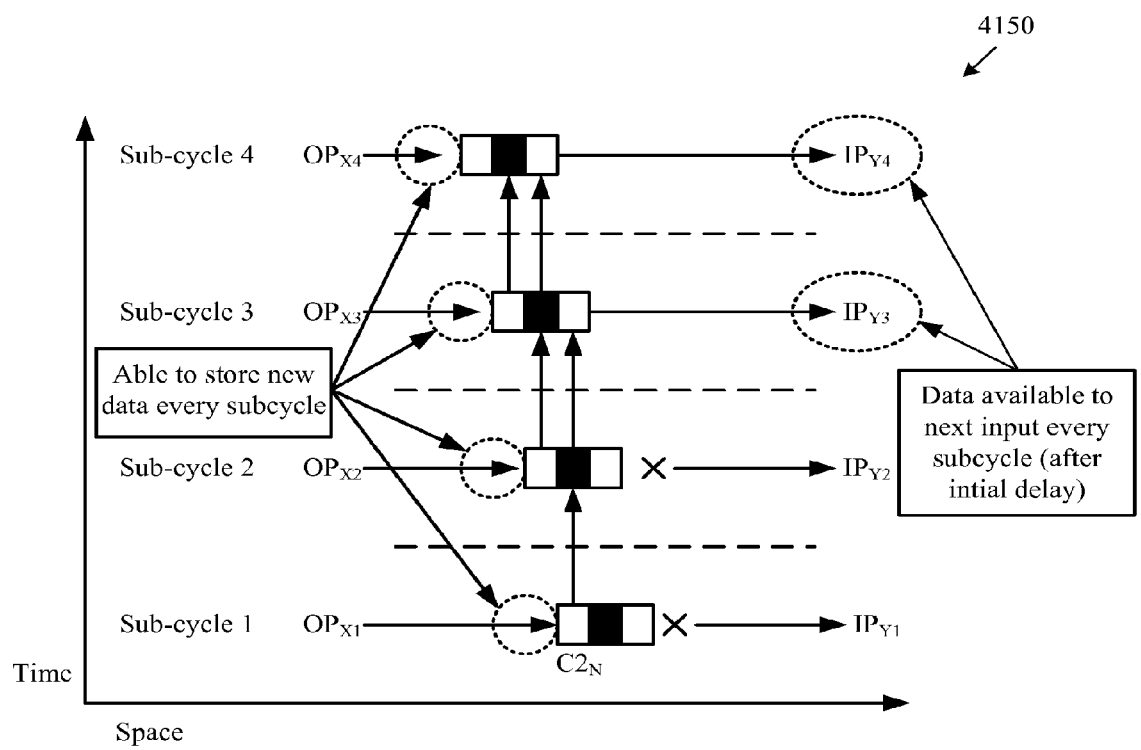
FIG. 41B illustrates the operation of the circuit from FIG. 41A of some embodiments.

As shown in FIG. 41B, the storage element 4110 is able to store data from $OP_X$ at every sub-cycle. After an initial delay (dependent on the number of flip flops in storage element 4110), the storage element 4110 is able to present its stored data to $IP_Y$ every sub-cycle. Unlike the storage element 3810 described above, storage element 4110 cannot hold a value at its output (i.e. at IPY) for more than one sub-cycle.

Figure 42:
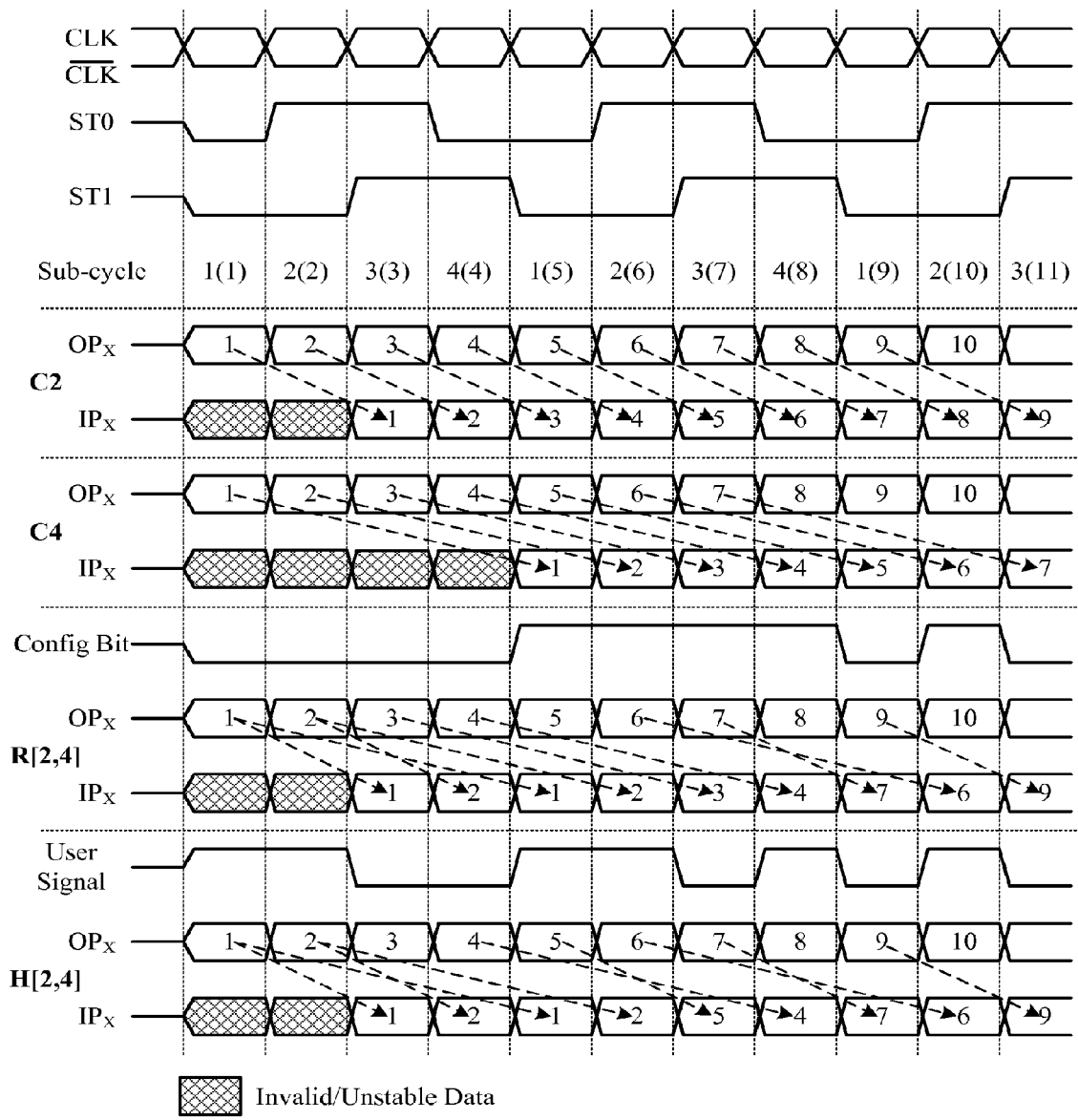
FIG. 42 illustrates the timing using different embodiments of the circuit from FIG. 41A of some embodiments.

FIG. 42 illustrates the operation of storage element 4110 through the use of a timing diagram. FIG. 42 corresponds to storage element 3640 (i.e. element C2) using the example shown in FIG. 41B. During sub-cycle 1, storage element 4110 stores the data presented to it at $OP_X$. During sub-cycle 2, storage element 4110 again stores the data presented to it at $OP_X$, while also internally shifting the data stored during sub-cycle 1. During sub-cycle 3, storage element 4110 again stores the data presented to it at $OP_X$, while also internally shifting the data stored during sub-cycle 2, and presenting the data stored during sub-cycle 1 at its output to $IP_Y$. The steps of sub-cycle 3 are then repeated in each subsequent sub-cycle. Thus, new data is stored, the data stored during the previous sub-cycle is shifted internally within storage element 4110, and the data stored two sub-cycles earlier is presented at the output of the storage element to $IP_Y$.

FIG. 42 also shows the operation of storage element 4110 when implemented as shown in FIG. 36, element 3650 (i.e. element C4). During sub-cycle 1, storage element 4110 stores the data presented to it at $OP_X$. During sub-cycle 2, storage element 4110 again stores the data presented to it at $OP_X$, while also internally shifting the data stored during sub-cycle 1. During sub-cycle 3, storage element 4110 again stores the data presented to it at $OP_X$, while also internally shifting the data stored during sub-cycles 1 and 2. During sub-cycle 4, storage element 4110 again stores the data presented to it at $OP_X$, while also internally shifting the data stored during sub-cycles 1, 2, and 3. During sub-cycle 5, storage element 4110 again stores the data presented to it at $OP_X$, internally shifts the data stored during sub-cycles 2, 3, and 4, and presents the data stored during sub-cycle 1 at its output to IPY. The steps of sub-cycle 5 are then repeated in each subsequent sub-cycle. Thus, new data is stored, the data stored during the previous 3 sub-cycles is internally shifted within storage element 4110, and the data stored four sub-cycles earlier is presented at the output of the storage element to $IP_Y$.

One of ordinary skill in the art will recognize that the examples given above are for illustrative purposes only. Other embodiments may include more or fewer flip flops than the two and four flip-flop circuits described in relation to FIGS. 36 and 42.

C. Configurable Clocked Elements

Figure 43:
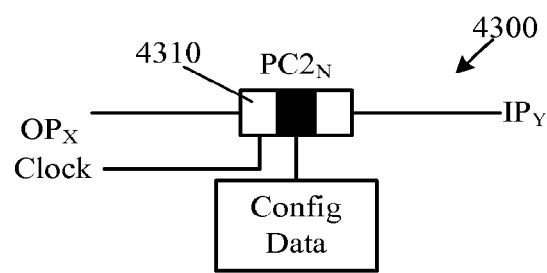
FIG. 43 illustrates a configurable clocked storage element placed between a first circuit's output and a second circuit's input of some embodiments.

FIG. 43 illustrates one embodiment of a configurable, non-transparent (i.e. clocked) storage element 4310. In some embodiments, the storage element 4310 is the same element described by FIG. 37, element 3700. This storage element is said to be non-transparent because it requires a clock signal. This storage element 4310 is also configurable because there is configuration data passed to the storage element. In FIG. 43, $OP_X$ represents the output of some upstream circuitry, for instance, the output of an R-MUX. The input of the storage element 4310 is driven by $OP_X$. Similarly, $IP_Y$ represents the input of some downstream circuitry that will be driven by the output of the storage element 4310. The downstream circuitry could be an R-MUX, an I-MUX, or any other element of the configurable IC.

Figure 44:
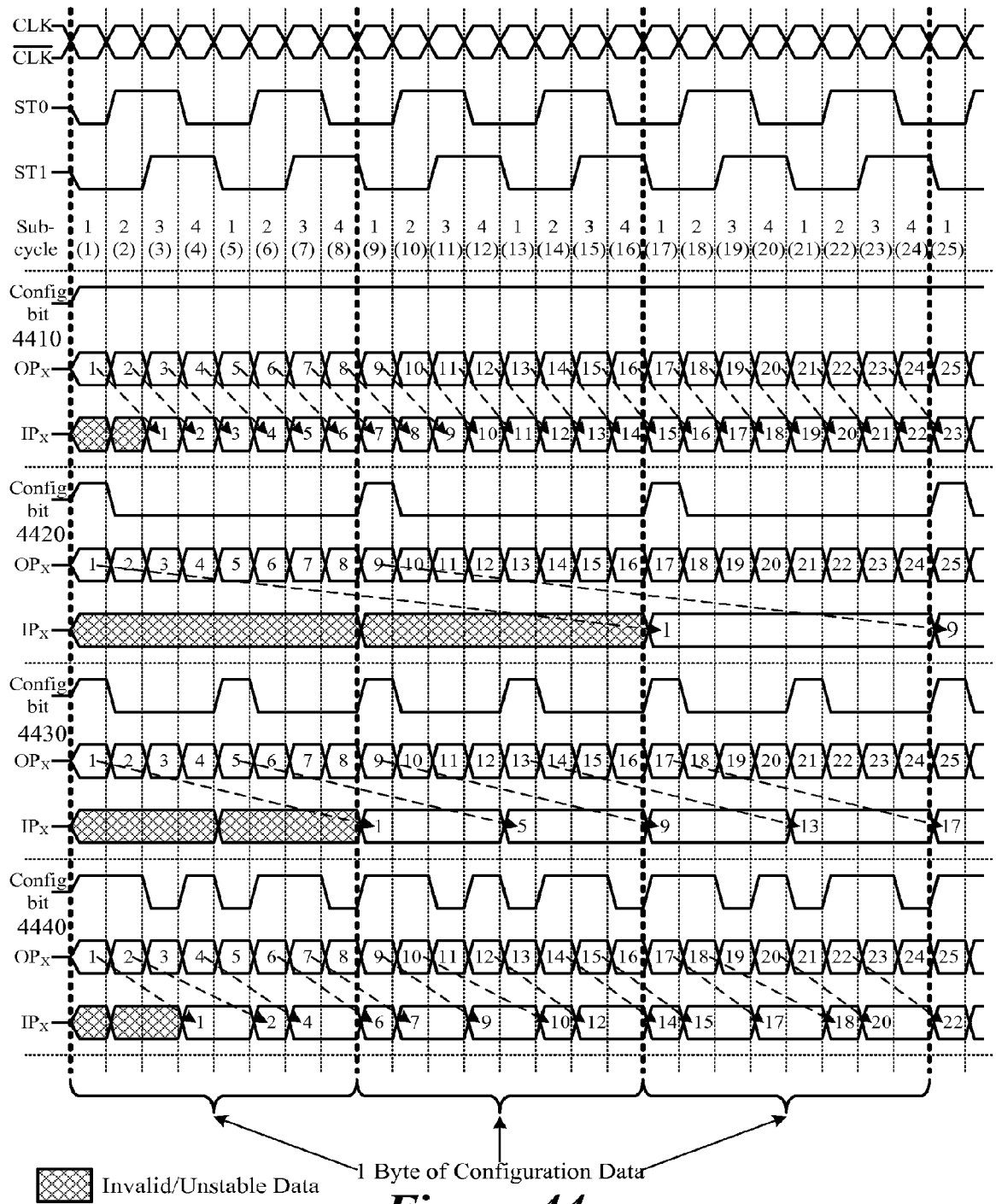
FIG. 44 illustrates the timing of the circuit from FIG. 43 using different configuration data of some embodiments.

FIG. 44 illustrates the operation of storage element 4310 through the use of a timing diagram. FIG. 44 shows timing signals 4410 that illustrate the operation of storage element 3700 (i.e. element P2) using the first example configuration data shown in FIG. 37 (i.e. configuration data is all 1s). Since the flip flop enable bit is always enabled, the storage element 3700 provides the same functionality as storage element 3640. During sub-cycle 1, storage element 4310 stores the data presented to it at $OP_X$. During sub-cycle 2, storage element 4310 again stores the data presented to it at $OP_X$, while also internally shifting the data stored during sub-cycle 1. During sub-cycle 3, storage element 4310 again stores the data presented to it at $OP_X$, while also internally shifting the data stored during sub-cycle 2, and presenting the data stored during sub-cycle 1 at its output to $IP_Y$. The steps of sub-cycle 3 are then repeated in each subsequent sub-cycle. Thus, new data is stored, the data stored during the previous sub-cycle is shifted internally within storage element 4310, and the data stored two sub-cycles earlier is presented at the output of the storage element to $IP_Y$.

FIG. 44 further shows timing signals 4420 that illustrate the operation of storage element 3700 (i.e. element P2) using the second example configuration on data shown in FIG. 37 (i.e. configuration data is a 1 followed by all 0s). During sub-cycle 1, the enable signal is high (i.e. the flip flops 3730 are both enabled), and storage element 4310 stores the data presented to it at $OP_X$. During sub-cycles 2-8, the enable signal is low (i.e. the flip flops 3730 are not enabled) and the storage element 4310 does not store new data or internally pass data.

During sub-cycle 9, the enable bit is high, and storage element 4310 again stores the data presented to it at $OP_X$, while also internally shifting the data stored during sub-cycle 1. During sub-cycles 10-16, the enable signal is low (i.e. the flip flops 3730 are not enabled) and the storage element 4310 does not store new data or internally pass data.

During sub-cycle 17, the enable bit is high, and storage element 4310 again stores the data presented to it at $OP_X$, while also internally shifting the data stored during sub-cycle 9, and presenting the data stored during sub-cycle 1 at its output to $IP_Y$. The stored data from sub-cycle 1 is held at the output until sub-cycle 24. The steps of sub-cycle 17 are then repeated every eighth subsequent sub-cycle, while no data is stored or internally transferred during the intervening seven sub-cycles. Thus, new data is stored, the data stored during the previous enabled sub-cycle (i.e. eight sub-cycles earlier) is shifted internally within storage element 4310, and the data stored sixteen sub-cycles earlier is presented for eight sub-cycles at the output of the storage element to $IP_Y$.

FIG. 44 further shows timing signals 4430 that illustrate the operation of storage element 3700 (i.e. element P2) using the third example configuration data shown in FIG. 37 (i.e. configuration data is a 1 followed by three 0s followed by a 1 followed by three 0s). During sub-cycle 1, the enable signal is high (i.e. the flip flops 3730 are both enabled), and storage element 4310 stores the data presented to it at $OP_X$. During sub-cycles 2-4, the enable signal is low (i.e. the flip flops 3730 are not enabled) and the storage element 4310 does not store new data or internally pass data.

During sub-cycle 5, the enable bit is high, and storage element 4310 again stores the data presented to it at $OP_X$, while also internally shifting the data stored during sub-cycle 1. During sub-cycles 6-8, the enable signal is low (i.e. the flip flops 3730 are not enabled) and the storage element 4310 does not store new data or internally pass data.

During sub-cycle 9, the enable bit is high, and storage element 4310 again stores the data presented to it at $OP_X$, while also internally shifting the data stored during sub-cycle 5, and presenting the data stored during sub-cycle 1 at its output to $IP_Y$. The stored data from sub-cycle 1 is held at the output until sub-cycle 12. The steps of sub-cycle 9 are then repeated every fourth subsequent sub-cycle, while no data is stored or internally transferred during the intervening 3 sub-cycles. Thus, new data is stored, the data stored during the previous enabled sub-cycle (i.e. four sub-cycles earlier) is shifted internally within storage element 4310, and the data stored eight sub-cycles earlier is presented for four sub-cycles at the output of the storage element to $IP_Y$.

FIG. 44 further shows timing signals 4440 that illustrate the operation of storage element 3700 (i.e. element P2) using another example set of configuration data. As shown, when the enable signal is active (i.e. high), storage element 3700 stores the data at its input, internally passes data (if available) and presents the data at its output. When the enable signal is inactive (i.e. low), storage element 3700 does not store the data at its input, does not internally pass data, and hold the value that was presented at its output during the previous sub-cycle.

One of ordinary skill in the art will recognize that the examples given above are for illustrative purposes only. Other embodiments may include more or fewer flip flops than the two flip-flop circuit described in relation to FIGS. 37 and 44. Other embodiments may also use more or fewer configuration bits, or be implemented in a 4-loopered scheme, etc.

D. Alternate Placement of Storage Elements

Figure 45:
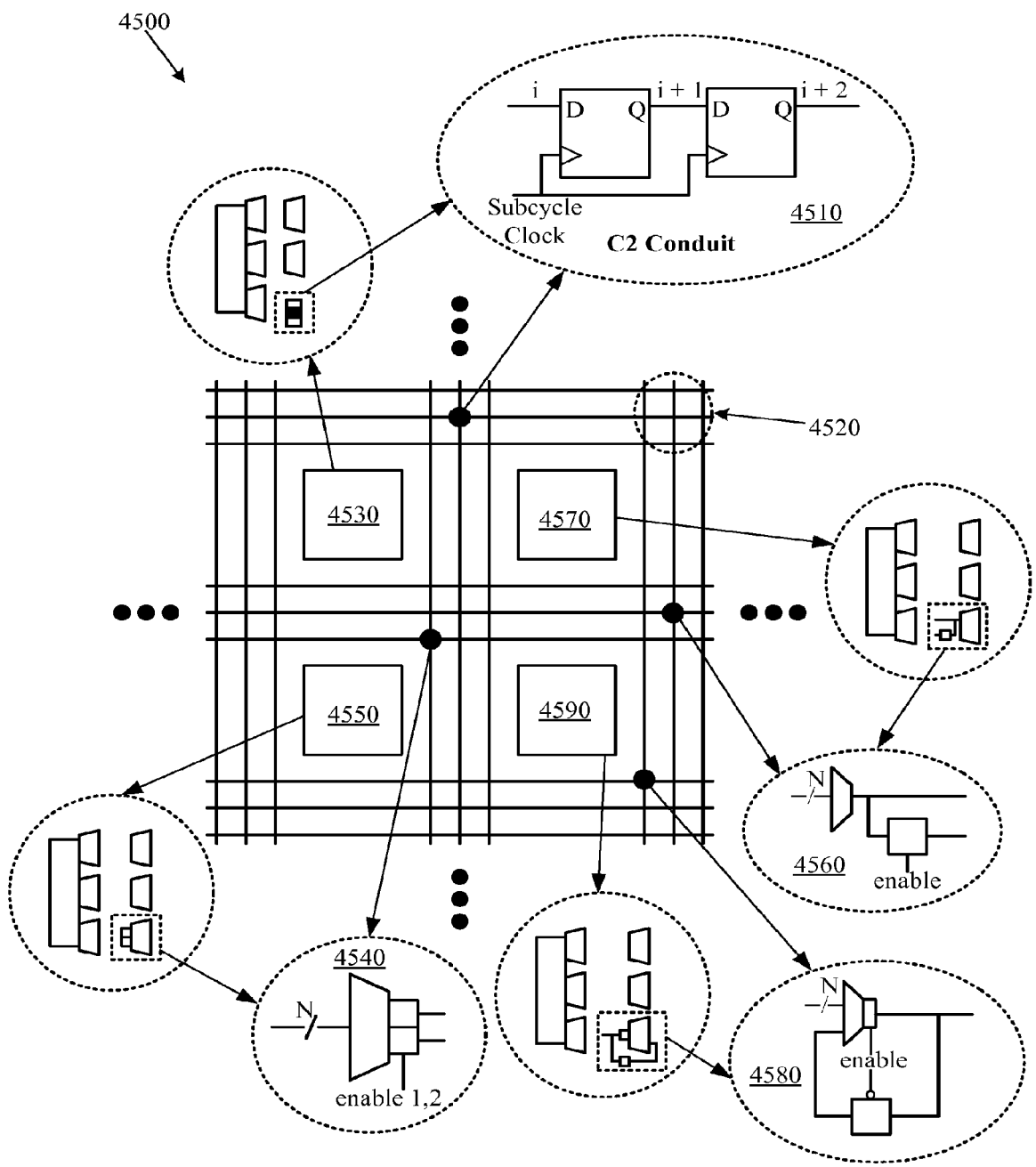
FIG. 45 illustrates alternative placements of storage elements within the routing fabric or within the reconfigurable tile structure of some embodiments.

FIG. 45 illustrates alternative placement of some embodiments of the storage elements described above. For instance, in some embodiments, clocked storage element 4510 may be placed within the routing fabric 4520 of the IC, or alternatively, within a configurable circuit or tile 4530 of the IC. Likewise, in some embodiments, unclocked storage element 4540 may be placed within the routing fabric 4520 of the IC, or alternatively, within a configurable circuit or tile 4550 of the IC. In some embodiments, unclocked storage element 4560 may be placed within the routing fabric 4520 of the IC, or alternatively, within a configurable circuit or tile 4570 of the IC.

Similarly, in some embodiments, unclocked storage element 4580 may be placed within the routing fabric 4520 of the IC, or alternatively, within a configurable circuit 4590 of the IC. In some embodiments, multiple storage elements may be placed within the routing fabric 4520 of the IC. In some embodiments, multiple types of storage elements may be placed within the routing fabric 4520 of the IC. In some embodiments, multiple storage elements may be placed within the configurable circuits of the IC. In some embodiments, multiple types of storage elements may be placed within the configurable circuits of the IC.

In addition to alternative placement of storage elements, while many examples given above were shown with certain sub-elements (e.g., the flip-flops 3645 of storage element 3640, or the cross-coupled inverters 1240 of storage element 1210, etc.), one of ordinary skill in the art will recognize that other sub-elements may be used. For example, in other embodiments of storage element 3640, the flip-flops 3645 could be replaced with storage elements that are controlled by configuration data, or in other embodiments of the storage element 1210 the cross-coupled inverters 1240 could be replaced by cross-coupled pull-down transistors.

One of ordinary skill in the art will recognize that the examples given above are for illustrative purposes only. For example, other embodiments may place the storage elements in other locations within the IC (e.g. memory, at the input and/or output stages, etc.).

E. Mixed Use of Storage Elements

Figure 46:
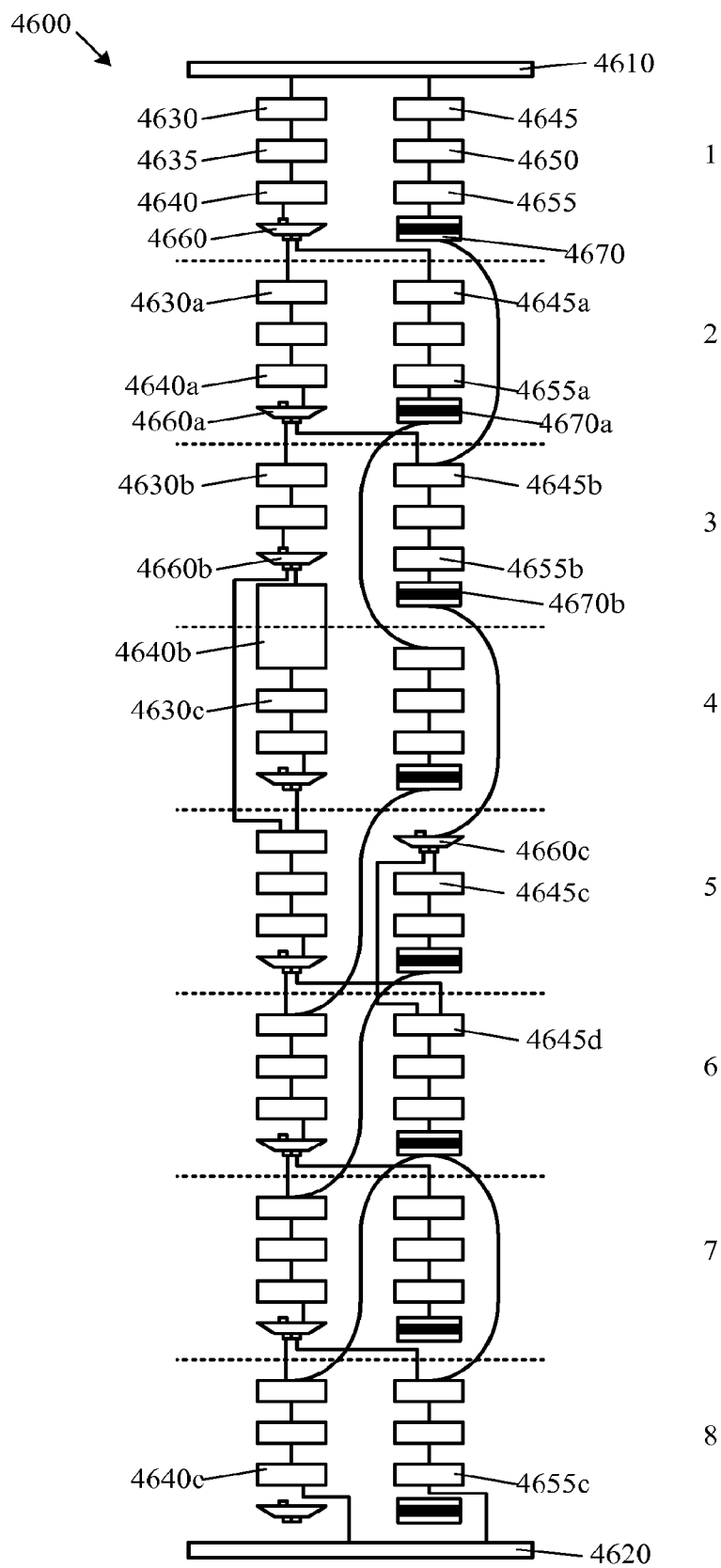
FIG. 46 illustrates the use of several storage elements over multiple reconfiguration cycles of some embodiments.

FIG. 46 illustrates the combined use of configurable, unclocked storage elements and non-configurable, clocked storage elements within the same signal path. FIG. 46 illustrates a signal path 4600 between two user registers 4610 and 4620. In this example, the signal path includes numerous reconfigurable circuits 4630, 4635, 4640, 4645, 4650, and 4655. In different embodiments, these reconfigurable circuits may be logic circuits, routing circuits, etc. The signal path also includes an unclocked, configurable storage element 4660 and a clocked non-configurable storage element 4670.

As shown, the operation of these circuits is divided into 8 reconfiguration cycles. In reconfiguration cycle 1, data is passed from the user register 4610 to reconfigurable circuits 4630 and 4645. After the data is processed by reconfigurable circuits 4630 and 4645, it is routed to other reconfigurable circuits 4635 and 4650, which in turn process the data and pass to another set of reconfigurable circuits 4640 and 4655. After processing by the elements 4640 and 465, the resulting data is passed to the configurable, unclocked storage element 4660 and the non-configurable, clocked storage element 4670. In some embodiments, the storage element 4660 is storage element 1300 described above in reference to FIG. 13, while the storage element 4670 is storage element 3640 described above in reference to FIG. 36. Storage element 4660 stores the value passed from reconfigurable circuit 4640 in both of its output latches. Thus, the output of reconfigurable circuit 4640 is stored for further processing in subsequent reconfiguration cycles. Likewise, storage element 4670 receives the output of reconfigurable circuit 4655 for processing in subsequent reconfiguration cycles. In addition, after storing the value from reconfigurable circuit 4640, the storage element 4660 can select its input where a latch has been placed, and latch that input to prevent bit flicker during subsequent operations.

As shown, in reconfiguration cycle 2, the data value stored by the storage element 4660 is received by reconfiguration circuits 4630a and 4645a. The processing proceeds in a similar manner as reconfiguration cycle. Storage element 4670a is the same storage element used in reconfiguration cycle 1. The storage element 4670 is capable of storing new data every reconfiguration cycle. Thus, by routing the output of reconfiguration circuit 4655a to the storage element 4670 already used in reconfiguration cycle 1, the storage element 4670 is able to store new data during reconfiguration cycle 2 while still holding the value obtained in reconfiguration cycle 1. Also during reconfiguration cycle 2, the storage element 4660a receives the value from reconfigurable circuit 4640a and stores that value at both output latches for further processing in reconfiguration cycle 3 by reconfiguration circuits 4630b and 4645b. In this example, the data is passed to storage element 4660a on an input that does not include a latch. In some embodiments, after storing the value passed by reconfigurable circuit 4640a the storage element 4660a would select the input where a latch has been placed, and latch that input to prevent bit flicker.

As further shown, during reconfiguration cycle 3, the data stored by the storage element 4660a is received by reconfigurable circuits 4630b and 4645b. Reconfigurable circuit 4645b also receives from storage element 4670 the output data from reconfigurable circuit 4655 that was stored during reconfiguration cycle 1. In the example shown, during reconfiguration cycle 3, reconfigurable circuit 4640b does not have sufficient time to perform its operations before cycle 3 expires. To compensate for this timing issue, storage element 4660b holds the value stored during reconfiguration cycle 3 until reconfigurable circuit 4640b is able to finish its operations and provide a valid output to reconfiguration circuit 4630c. This process, called operational time extension was briefly described in Section VI. A., above.

Further in the example of FIG. 46, during reconfiguration cycle 5, the value from storage element 4670b, which corresponds to the output of reconfigurable circuit 4655b during reconfiguration cycle 3, is passed to storage element 4660c and stored at both its latched outputs. In this manner, the value may be passed to reconfigurable circuit 4645c and also held for an extra reconfiguration cycle to be processed by reconfigurable circuit 4645d during reconfiguration cycle 6.

In the example, the processing continues in a similar manner until reconfiguration cycle 8. After reconfiguration cycle 8, the processing is complete, and the reconfigurable circuits 4640c and 4655c pass their output values to the user register 4620 where they may be stored for output or further operations in subsequent reconfiguration cycles, etc.

Figure 47A:
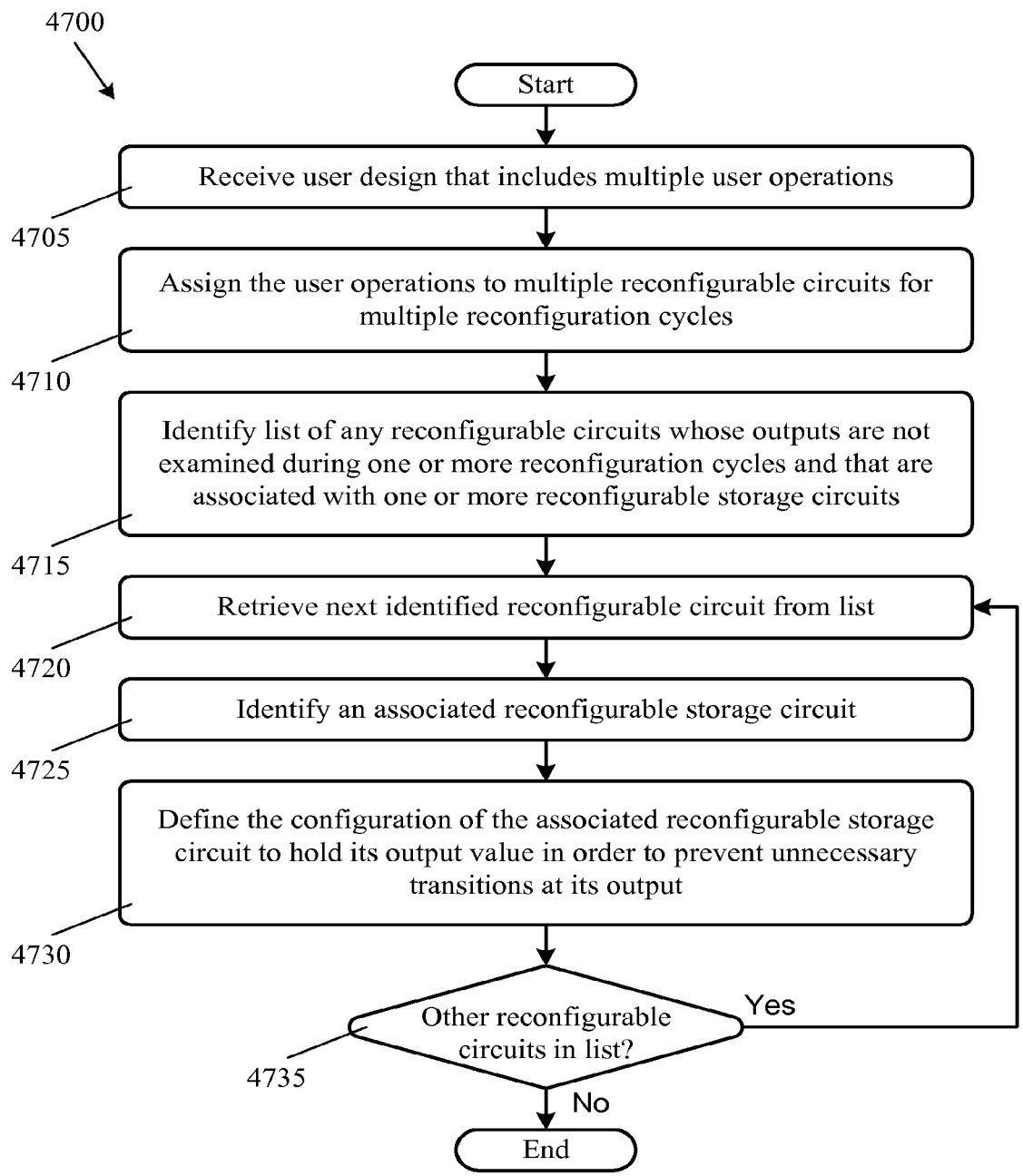
FIG. 47A illustrates a process for using the storage element of FIG. 15 to prevent bit flicker at the output of the storage element.

In addition to the mixed use of different types of storage elements, some embodiments use a combination of storage and interconnect circuits to perform storage operations or other functions. For instance, FIG. 47A illustrates a process 4700 for using the storage element of FIG. 15 to prevent bit flicker at the output of the storage element, thus reducing power consumption. As shown, a user design is received (at 4705) that includes multiple user operations. The user operations are assigned (at 4710) to the reconfigurable circuits of the IC (for example, the reconfigurable circuits 1510 and 1520 of FIG. 15). Next, the process 4700 identifies (at 4715) and compiles a list of any reconfigurable circuits that have unexamined outputs during particular reconfiguration cycles (e.g., the circuit 1510 from the example of FIG. 15) and that are associated with one or more reconfigurable storage circuits (e.g., the circuit 1505 from the example of FIG. 15). A storage element is defined to have an association with a reconfigurable circuit when an output of the reconfigurable circuit is directly connected to an input of the reconfigurable storage circuit, or when an output of the reconfigurable storage circuit is directly connected to an input of the reconfigurable circuit.

The process then retrieves (at 4720) the first reconfigurable circuit in the list and identifies (at 4725) an associated storage circuit. The process 4700 next defines (at 4730) a configuration for the storage circuit such that it holds the value that it was outputting in a reconfiguration cycle prior to the particular reconfiguration cycle. The storage circuit may be configured to either pass-through a value from its input to its output during a particular reconfiguration cycle, or hold a value that it was outputting during a previous reconfiguration cycle. This prevents unnecessary transitions at the output of the identified storage element, for instance at the output of storage circuit 1505 from the example of FIG. 15. In some cases, the load presented by the section of wire leading from the output of the latch 1505 to the input 1530 of the next circuit 1520 is significant, and thus eliminating unnecessary transitions can produce substantial power savings.

Finally, the process 4700 determines (at 4735) whether there are any other reconfigurable circuits in the list. If so, the process repeats the operations 4720-4735 until all the reconfigurable circuits in the list have been addressed, at which point the process ends.

Figure 47B:
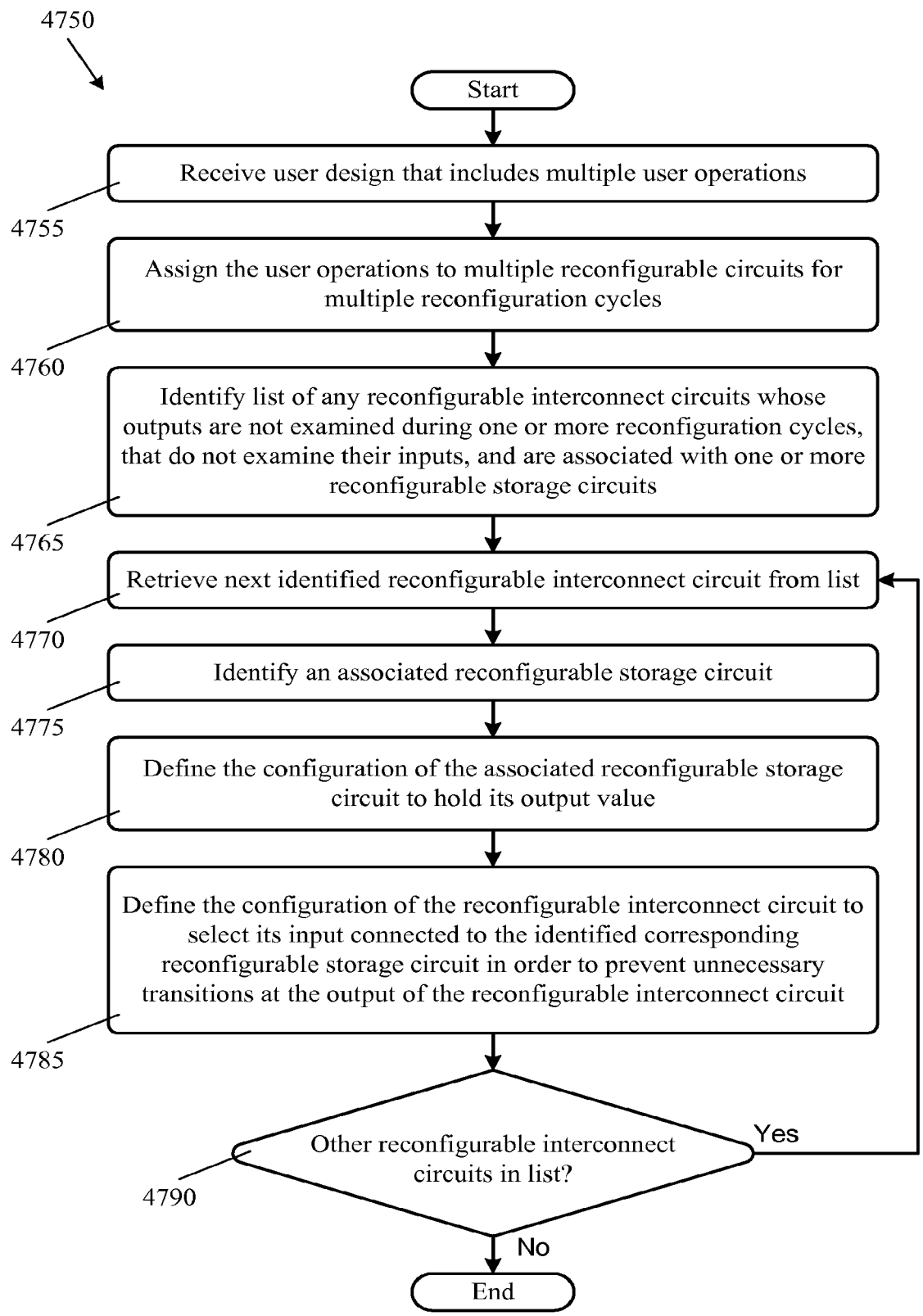
FIG. 47B illustrates a process for using the storage element of FIG. 15 to prevent bit flicker at the output of a reconfigurable interconnect circuit associated with the storage element.

FIG. 47B illustrates a process 4750 for using the storage element of FIG. 15 to prevent bit flicker at the output of a reconfigurable interconnect circuit associated with the storage element. Each reconfigurable interconnect circuit includes a set of inputs, at least one output, and a set of select lines to select a particular input from the set of inputs for connecting to the output. As shown, the process 4750 receives (at 4755) a user design that includes multiple user operations. The user operations are assigned (at 4760) to the reconfigurable circuits of the IC (for example, the reconfigurable circuits 1510 and 1520 of FIG. 15). Next, the process 4750 identifies (at 4765) and lists any reconfigurable interconnect circuits that have unexamined inputs and outputs during particular reconfiguration cycles (for instance, the circuit 1520 from the example of FIG. 15), and that are associated with one or more reconfigurable storage circuits (e.g., the circuit 1505 from the example of FIG. 15).

The process 4750 then retrieves (at 4770) the first reconfigurable interconnect circuit in the list and identifies (at 4775) an associated storage circuit. The process next defines (at 4780) a configuration for the storage circuit such that it holds the value that it was outputting in a reconfiguration cycle prior to the particular reconfiguration cycle. The process then defines (at 4785) a configuration for the reconfigurable interconnect circuit such that it selects the input that is connected to the associated storage circuit's output. As such, bit flicker at the output of the reconfigurable interconnect circuit is prevented by the latched value at the selected input of the reconfigurable interconnect circuit.

Finally, the process 4750 determines (at 4790) whether there are any other reconfigurable circuits in the list. If so, the process repeats the operations 4770-4785 until all the reconfigurable interconnect circuits in the list have been addressed, at which point the process ends.

One of ordinary skill in the art will recognize that the examples given above are for illustrative purposes only. For example, other embodiments may have more or fewer operations per reconfiguration cycle. Other embodiments may have more or fewer storage elements, or comprise solely unclocked storage elements, for instance. In addition, other embodiments may use the elements in a different order or configuration than the example shown.

VII. Configurable IC and System

Some embodiments described above are implemented in configurable ICs that can compute configurable combinational digital logic functions on signals that are presented on the inputs of the configurable ICs. In some embodiments, such computations are state-less computations (i.e., do not depend on a previous state of a value). Some embodiments described above are implemented in configurable ICs that can perform a continuous function. In these embodiments, the configurable IC can receive a continuous function at its input, and in response, provide a continuous output at one of its outputs.

Figure 48:
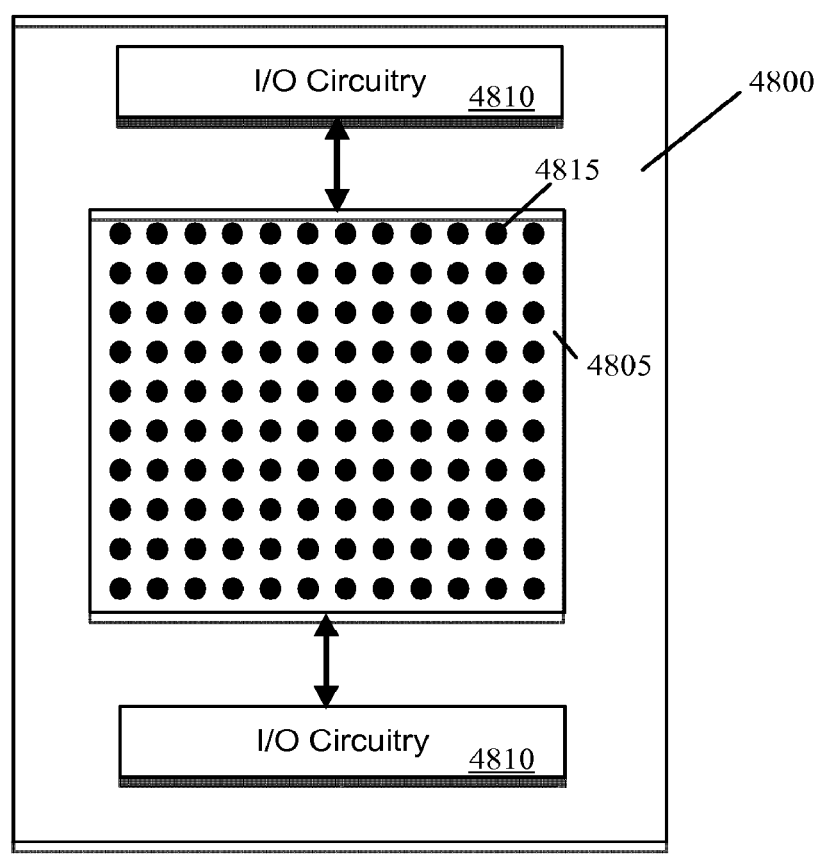
FIG. 48 illustrates a portion of a configurable IC of some embodiments of the invention of some embodiments.

FIG. 48 illustrates a portion of a configurable IC 4800 of some embodiments of the invention. As shown in this figure, this IC has a configurable circuit arrangement 4805 and I/O circuitry 4810. The configurable circuit arrangement 4805 can include any of the above described circuits, storage elements, and routing fabric of some embodiments of the invention. The I/O circuitry 4810 is responsible for routing data between the configurable nodes 4815 of the configurable circuit arrangement 4805 and circuits outside of this arrangement (i.e., circuits outside of the IC, or within the IC but outside of the configurable circuit arrangement 4805). As further described below, such data includes data that needs to be processed or passed along by the configurable nodes.

Figure 49:
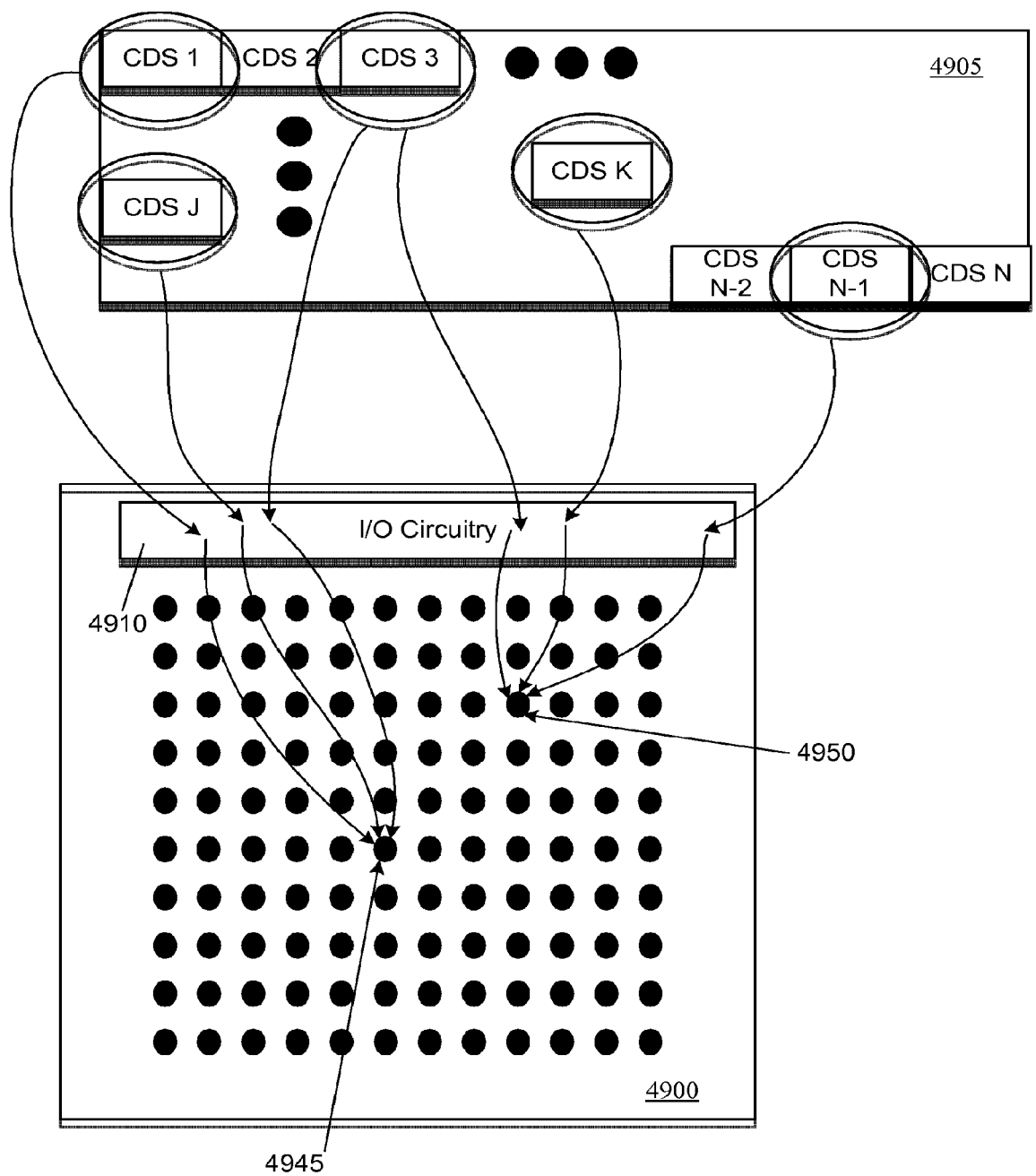
FIG. 49 illustrates a more detailed example of data between a configurable node and a configurable circuit arrangement that includes configuration data that configure the nodes to perform particular operations of some embodiments.

The data also includes in some embodiments a set of configuration data that configures the nodes to perform particular operations. FIG. 49 illustrates a more detailed example of this. Specifically, this figure illustrates a configuration data pool 4905 for the configurable IC 4900. This pool includes N configuration data sets ("CDS"). As shown in FIG. 49, the input/output circuitry 4910 of the configurable IC 4900 routes different configuration data sets to different configurable nodes of the IC 4900. For instance, FIG. 49 illustrates configurable node 4945 receiving configuration data sets 1, 3, and J through the I/O circuitry, while configurable node 4950 receives configuration data sets 3, K, and N−1 through the I/O circuitry. In some embodiments, the configuration data sets are stored within each configurable node. Also, in some embodiments, a configurable node can store multiple configuration data sets for a configurable circuit within it so that this circuit can reconfigure quickly by changing to another configuration data set for a configurable circuit. In some embodiments, some configurable nodes store only one configuration data set, while other configurable nodes store multiple such data sets for a configurable circuit.

Figure 50:
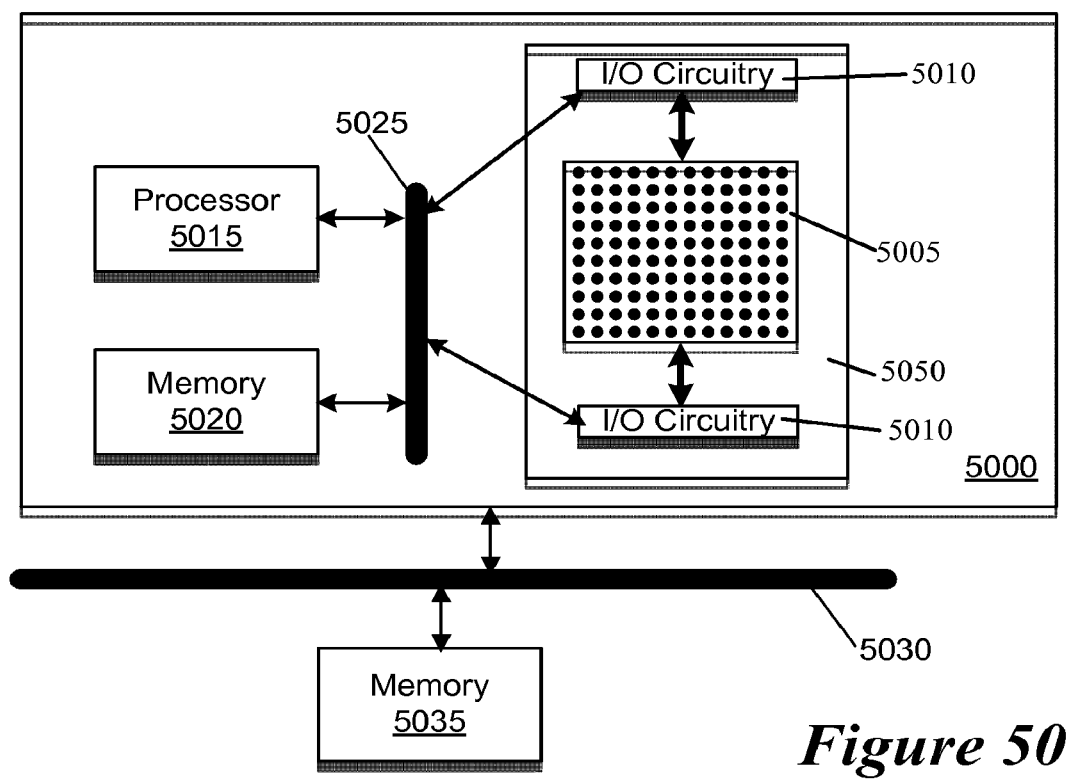
FIG. 50 illustrates a system on chip ("SoC") implementation of a configurable IC of some embodiments.

A configurable IC of the invention can also include circuits other than a configurable circuit arrangement and I/O circuitry. For instance, FIG. 50 illustrates a system on chip ("SoC") implementation of a configurable IC 5000. This IC has a configurable block 5050, which includes a configurable circuit arrangement 5005 and I/O circuitry 5010 for this arrangement. It also includes a processor 5015 outside of the configurable circuit arrangement, a memory 5020, and a bus 5025, which conceptually represents all conductive paths between the processor 5015, memory 5020, and the configurable block 5050. As shown in FIG. 50, the IC 5000 couples to a bus 5030, which communicatively couples the IC to other circuits, such as an off-chip memory 5035. Bus 5030 conceptually represents all conductive paths between the system components.

This processor 5015 can read and write instructions and/or data from an on-chip memory 5020 or an off-chip memory 5035. The processor 5015 can also communicate with the configurable block 5050 through memory 5020 and/or 5035 through buses 5025 and/or 5030. Similarly, the configurable block can retrieve data from and supply data to memories 5020 and 5035 through buses 5025 and 5030.

Figure 51:
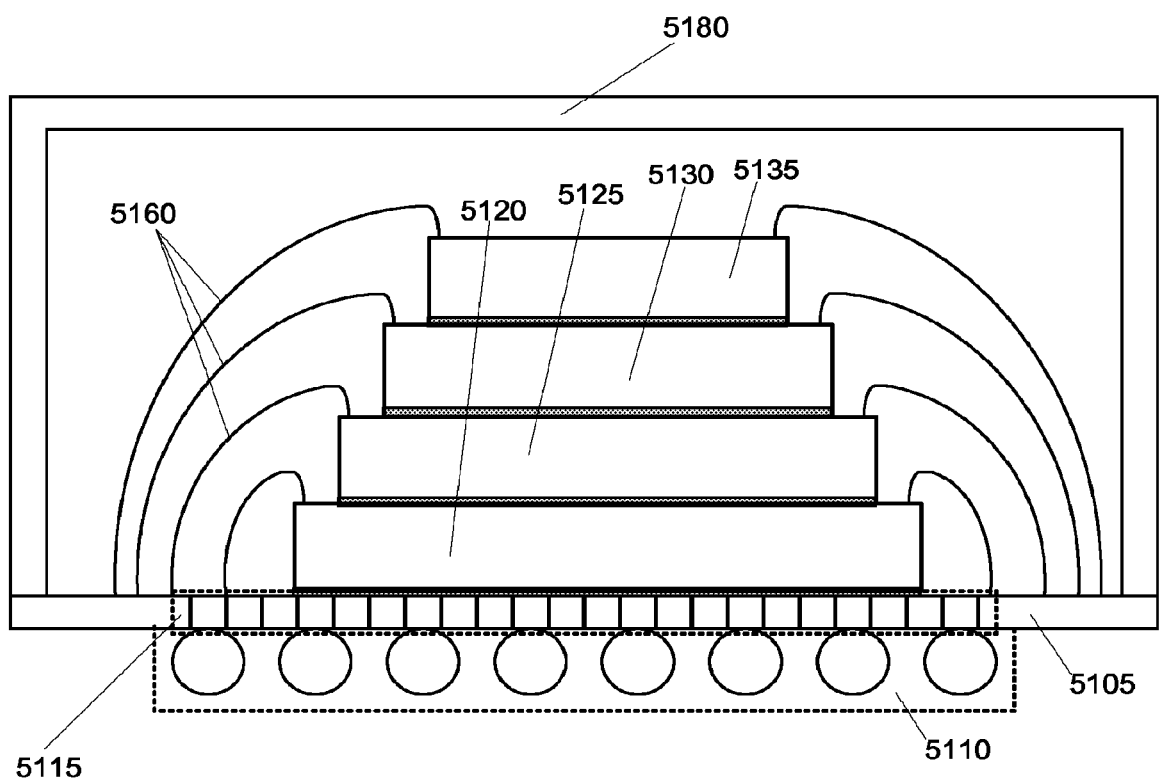
FIG. 51 illustrates an embodiment that employs a system in package ("SiP") implementation for a configurable IC of some embodiments.

Instead of, or in conjunction with, the system on chip ("SoC") implementation for a configurable IC, some embodiments might employ a system in package ("SiP") implementation for a configurable IC. FIG. 51 illustrates one such SiP 5100. As shown in this figure, SiP 5100 includes four ICs 5120, 5125, 5130, and 5135 that are stacked on top of each other on a substrate 5105. At least one of these ICs is a configurable IC that includes a configurable block, such as the configurable block 5050 of FIG. 50. Other ICs might be other circuits, such as processors, memory, etc.

As shown in FIG. 51, the IC communicatively connects to the substrate 5105 (e.g., through wire bondings 5160). These wire bondings allow the ICs 5120-5135 to communicate with each other without having to go outside of the SiP 5100. In some embodiments, the ICs 5120-5135 might be directly wire-bonded to each other in order to facilitate communication between these ICs. Instead of, or in conjunction with the wire bondings, some embodiments might use other mechanisms to communicatively couple the ICs 5120-5135 to each other.

As further shown in FIG. 51, the SiP includes a ball grid array ("BGA") 5110 and a set of vias 5115. The BGA 5110 is a set of solder balls that allows the SiP 5100 to be attached to a printed circuit board ("PCB"). Each via connects a solder ball in the BGA 5110 on the bottom of the substrate 5105, to a conductor on the top of the substrate 5105.

The conductors on the top of the substrate 5105 are electrically coupled to the ICs 5120-5135 through the wire bondings. Accordingly, the ICs 5120-5135 can send and receive signals to and from circuits outside of the SiP 5100 through the wire bondings, the conductors on the top of the substrate 5105, the set of vias 5115, and the BGA 5110. Instead of a BGA, other embodiments might employ other structures (e.g., a pin grid array) to connect a SiP to circuits outside of the SiP. As shown in FIG. 51, a housing 5180 encapsulates the substrate 5105, the BGA 5110, the set of vias 5115, the ICs 5120-5135, the wire bondings to form the SiP 5100. This and other SiP structures are further described in U.S. patent application Ser. No. 11/081,820 entitled "Programmable System In Package", which is incorporated herein by reference.

Figure 52:
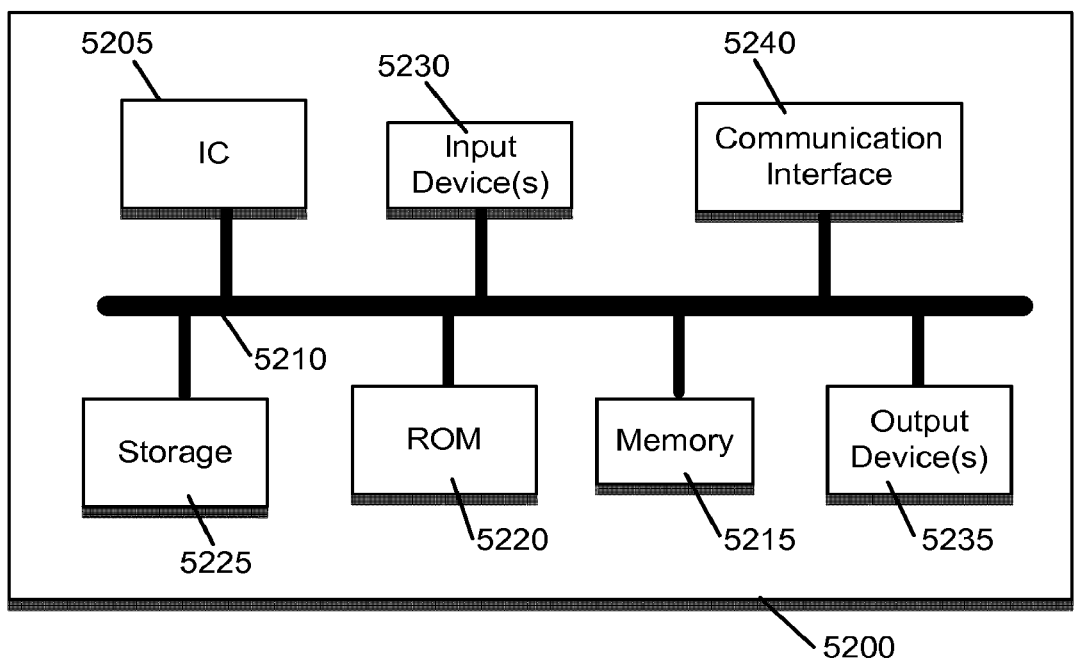
FIG. 52 conceptually illustrates a more detailed example of a computing system that has an IC, which includes one of the invention's configurable circuit arrangements of some embodiments.

FIG. 52 conceptually illustrates a more detailed example of a computing system 5200 that has an IC 5205, which includes a configurable circuit arrangement with configurable circuits, storage elements, and routing fabric of some embodiments of the invention that were described above. The system 5200 can be a stand-alone computing or communication device, or it can be part of another electronic device. As shown in FIG. 52, the system 5200 not only includes the IC 5205, but also includes a bus 5210, a system memory 5215, a read-only memory 5220, a storage device 5225, input device(s) 5230, output device(s) 5235, and communication interface 5240.

The bus 5210 collectively represents all system, peripheral, and chipset interconnects (including bus and non-bus interconnect structures) that communicatively connect the numerous internal devices of the system 5200. For instance, the bus 5210 communicatively connects the IC 5210 with the read-only memory 5220, the system memory 5215, and the permanent storage device 5225. The bus 5210 may be any of several types of bus structure including a memory bus or memory controller, a peripheral bus, and a local bus using any of a variety of conventional bus architectures. For instance, the bus 5210 architecture may include any of the following standard architectures: PCI, PCI-Express, VESA, AGP, Microchannel, ISA and EISA, to name a few.

From these various memory units, the IC 5205 receives data for processing and configuration data for configuring the ICs configurable logic and/or interconnect circuits. When the IC 5205 has a processor, the IC also retrieves from the various memory units instructions to execute. The read-only-memory (ROM) 5220 stores static data and instructions that are needed by the IC 5205 and other modules of the system 5200.

Some embodiments of the invention use a mass-storage device (such as a magnetic disk to read from or write to a removable disk or an optical disk for reading a CD-ROM disk or to read from or write to other optical media) as the permanent storage device 5225. Other embodiments use a removable storage device (such as a flash memory card or memory stick) as the permanent storage device. The drives and their associated computer-readable media provide non-volatile storage of data, data structures, computer-executable instructions, etc. for the system 5200. Although the description of computer-readable media above refers to a hard disk, a removable magnetic disk, and a CD, it should be appreciated by those skilled in the art that other types of media which are readable by a computer, such as magnetic cassettes, digital video disks, and the like, may also be used in the exemplary operating environment.

Like the storage device 5225, the system memory 5215 is a read-and-write memory device. However, unlike storage device 5225, the system memory is a volatile read-and-write memory, such as a random access memory. Typically, system memory 5215 may be found in the form of random access memory (RAM) modules such as SDRAM, DDR, RDRAM, and DDR-2. The system memory stores some of the set of instructions and data that the processor needs at runtime.

The bus 5210 also connects to the input and output devices 5230 and 5235. The input devices enable the user to enter information into the system 5200. The input devices 5230 can include touch-sensitive screens, keys, buttons, keyboards, cursor-controllers, touch screen, joystick, scanner, microphone, etc. The output devices 5235 display the output of the system 5200. The output devices include printers and display devices, such as cathode ray tubes (CRT), liquid crystal displays (LCD), organic light emitting diodes (OLED), plasma, projection, etc.

Finally, as shown in FIG. 52, bus 5210 also couples system 5200 to other devices through a communication interface 5240. Examples of the communication interface include network adapters that connect to a network of computers, or wired or wireless transceivers for communicating with other devices. Through the communication interface 5240, the system 5200 can be a part of a network of computers (such as a local area network ("LAN"), a wide area network ("WAN"), or an Intranet) or a network of networks (such as the Internet). The communication interface 5240 may provide such connection using wireless techniques, including digital cellular telephone connection, Cellular Digital Packet Data (CDPD) connection, digital satellite data connection or the like.

While the invention has been described with reference to numerous specific details, one of ordinary skill in the art will recognize that the invention can be embodied in other specific forms without departing from the spirit of the invention. For example, many of the storage circuits can be used in ICs other than the ones described above, including ICs that do not include configurable circuits (e.g., pure ASICs, processors, etc.). Thus, one of ordinary skill in the art would understand that the invention is not to be limited by the foregoing illustrative details, but rather is to be defined by the appended claims.

What is claimed is:

1. An electronic device comprising:
a memory for storing sets of configuration data; and
an integrated circuit ("IC") comprising:
   a) a plurality of configurable logic circuits for configurably performing logic operations;
   b) a plurality of configurable interconnect circuits for configurably passing signals to and from said logic circuits;
   c) a plurality of configurable storage circuits, each of the plurality of configurable storage circuits comprising:
      i) a configurable interconnect circuit for configurably passing signals to and from circuits of the IC; and
      ii) a plurality of clocked delay elements connected serially with an output of each delay element, except the last delay element, connected to an input of a subsequent delay element in the plurality of clocked delay elements,
      wherein the outputs of at least two delay elements further connect to at least two inputs of the configurable interconnect circuit.

2. The electronic device of claim 1, wherein each of the plurality of configurable storage circuits comprises at least one input and at least one output.

3. The electronic device of claim 2, wherein during each particular clock cycle, each configurable storage circuit (i) stores a first signal provided at said input of the configurable storage circuit and (ii) supplies, at said output of the configurable storage circuit, a second signal stored during a previous clock cycle that occurs a plurality of clock cycles prior to the particular clock cycle.

4. The electronic device of claim 3, wherein the previous clock cycle occurs two clock cycles prior to the particular clock cycle.

5. The electronic device of claim 3, wherein the previous clock cycle occurs four clock cycles prior to the particular clock cycle.

6. The electronic device of claim 1, where the configurable interconnect circuit comprises a set of inputs, a set of select lines, and at least one output, wherein the configurable interconnect circuit selects an input from the set of inputs based on data supplied to the set of select lines.

7. The electronic device of claim 6, wherein the configurable interconnect circuit selects an input from the set of inputs based on a configuration data supplied to the set of select lines.

8. The electronic device of claim 6, wherein the configurable interconnect circuit selects an input from the set of inputs based on a user design data supplied to the set of select lines.

9. The electronic device of claim 6, wherein the configurable interconnect circuit is a hybrid interconnect circuit that selects an input from the set of inputs based on at least one of a configuration data and a user design data supplied to the set of select lines.

10. An integrated circuit ("IC") comprising:
a) a plurality of configurable logic circuits for configurably performing logic operations;
b) a plurality of configurable interconnect circuits for configurably passing signals to and from said logic circuits;
c) a plurality of controllable storage circuits, each controllable storage circuit comprising:
i) a controllable interconnect circuit for controllably passing signals to and from circuits of the IC; and
ii) a plurality of clocked delay elements connected serially with an output of each but the last delay element connected to an input of a subsequent delay element in the plurality of clocked delay elements,
wherein an output of each of at least two delay elements further connects to each of at least two inputs of the controllable interconnect circuit.

11. The IC of claim 10, wherein the controllable interconnect circuit comprises a set of inputs, a set of select lines, and at least one output, wherein the controllable interconnect circuit selects an input from the set of inputs based on data supplied to the set of select lines.

12. The IC of claim 11, wherein the controllable interconnect circuit is a configurable interconnect circuit that selects an input from the set of inputs based on a configuration data supplied to the set of select lines.

13. The IC of claim 11, wherein the controllable interconnect circuit selects an input from the set of inputs based on a user design data supplied to the set of select lines.

14. The IC of claim 11, wherein the controllable interconnect circuit is a hybrid interconnect circuit that selects an input from the set of inputs based on at least one of a configuration data and a user design data supplied to the set of select lines.

15. The IC of claim 10 further comprising a configurable routing fabric that is formed at least partially by a set of the plurality of configurable interconnect circuits and a set of the plurality of controllable storage circuits.

16. The IC of claim 10, wherein an input of the controllable storage circuit is connected to an input of the first delay element in the plurality of clocked delay elements and an output of the controllable storage circuit is connected to an output of the controllable interconnect circuit.

17. The IC of claim 10, wherein:
the plurality of clocked delay elements comprises four clocked delay elements,
an output of the second clocked delay element in the four clocked delay elements is connected to a first input of the controllable interconnect circuit, and
an output of the fourth clocked delay element in the four clocked delay elements is connected to a second input of the controllable interconnect circuit.

18. An integrated circuit ("IC") comprising a plurality of configurable clocked storage elements, each configurable clocked storage element comprising a set of clocked delay elements connected sequentially, each clocked delay element storing a signal and comprising at least one input and at least one output,
wherein, during each particular clock cycle, the configurable clocked storage element receives a configuration data signal, wherein, when the configuration data signal has a first value during the particular clock cycle, each clocked delay element in the set of sequentially connected clocked delay elements keeps its stored signal, wherein, when the configuration data signal has a second value during the particular clock cycle, each clocked delay element in the set of sequentially connected clocked delay elements replaces its stored signal with another signal received at its input.

19. The IC of claim 18 further comprising:
a) a plurality of configurable logic circuits for configurably performing logic operations; and
b) a plurality of configurable interconnect circuits for configurably passing signals to and from said configurable logic circuits, wherein a set of the plurality of configurable interconnect circuits receive signals stored in the plurality of configurable clocked storage elements.

20. The IC of claim 19, wherein:
the configurable logic circuits are reconfigurable logic circuits,
the configurable interconnect circuits are reconfigurable interconnect circuits,
the configurable clocked storage elements are reconfigurable clocked storage elements, and
each particular clock cycle is a reconfiguration cycle.

* * * * *